(12) United States Patent
Klein

(10) Patent No.: US 10,709,038 B2
(45) Date of Patent: Jul. 7, 2020

(54) COMPUTER SERVER HEAT REGULATION UTILIZING INTEGRATED PRECISION AIR FLOW

(71) Applicant: DHK Storage, LLC, Herndon, VA (US)

(72) Inventor: David Klein, Sterling, VA (US)

(73) Assignee: DHK Storage, LLC, Sterling, VA (US)

( * ) Notice: Subject to any disclaimer, the term of this patent is extended or adjusted under 35 U.S.C. 154(b) by 284 days.

(21) Appl. No.: 15/439,631

(22) Filed: Feb. 22, 2017

(65) Prior Publication Data

US 2017/0318703 A1    Nov. 2, 2017

Related U.S. Application Data

(63) Continuation of application No. 15/338,376, filed on Oct. 29, 2016, now Pat. No. 9,795,063, and a continuation of application No. 15/144,788, filed on May 2, 2016, now Pat. No. 9,832,912.

(51) Int. Cl.
| | |
|---|---|
| H05K 7/20 | (2006.01) |
| H01L 35/28 | (2006.01) |
| F16K 27/00 | (2006.01) |
| F16K 3/02 | (2006.01) |
| F16K 3/03 | (2006.01) |

(52) U.S. Cl.
CPC ....... *H05K 7/20745* (2013.01); *F16K 3/0209* (2013.01); *F16K 3/03* (2013.01); *F16K 27/00* (2013.01); *H01L 35/28* (2013.01); *H05K 7/20181* (2013.01); *H05K 7/20727* (2013.01); *H05K 7/20736* (2013.01); *F16K 27/003* (2013.01)

(58) Field of Classification Search
CPC .......... H05K 7/20745; H05K 7/20736; H05K 7/20181; H05K 7/20727; F16K 27/003; F16K 3/03; F16K 27/00; F16K 3/0209; H01L 35/28
USPC .................................................... 361/679.46
See application file for complete search history.

(56) References Cited

U.S. PATENT DOCUMENTS

| | | | | |
|---|---|---|---|---|
| 2007/0035928 | A1* | 2/2007 | Hamman | G06F 1/20 361/701 |
| 2010/0043858 | A1* | 2/2010 | Matsui | H01L 35/28 136/205 |
| 2012/0006505 | A1* | 1/2012 | Trojer | H05K 7/206 165/48.1 |
| 2012/0024501 | A1* | 2/2012 | Campbell | H05K 7/2079 165/104.33 |
| 2012/0152298 | A1* | 6/2012 | Casali | H05K 7/20709 136/212 |
| 2012/0204577 | A1* | 8/2012 | Ludwig | F25B 21/04 62/3.3 |

(Continued)

OTHER PUBLICATIONS

U.S. Pat. No. 2014/0071615, dated Mar. 13, 2014, Tong-Viet, Cooling Host Module.

(Continued)

*Primary Examiner* — Anatoly Vortman
(74) *Attorney, Agent, or Firm* — Da Vinci's Notebook, LLC

(57) ABSTRACT

The present invention includes a rack stand for computer servers that ingests cooled air and accepts heated exhaust. Oriented cooled spaces adjacent to heated spaces allows thermoelectric power generation.

17 Claims, 63 Drawing Sheets

(56) References Cited

U.S. PATENT DOCUMENTS

| | | | |
|---|---|---|---|
| 2013/0091868 A1* | 4/2013 | Campbell | F25B 21/02 62/3.2 |
| 2014/0068943 A1* | 3/2014 | Campbell | B21D 53/02 29/890.035 |
| 2015/0359132 A1* | 12/2015 | Campbell | H05K 7/20236 361/700 |
| 2017/0013739 A1* | 1/2017 | Campbell | H05K 7/20781 |

OTHER PUBLICATIONS

U.S. Pat. No. 2007/0205297, dated Sep. 6, 2007, Finkham, J., Methods and apparatuses for controlling air to a building.
U.S. Pat. No. 2003/0235025, dated Dec. 25, 2003, Amaike, Takeshi, Server unit comprising stacked multiple server unit cabinets accommodating multiple cartridge type server units.

* cited by examiner

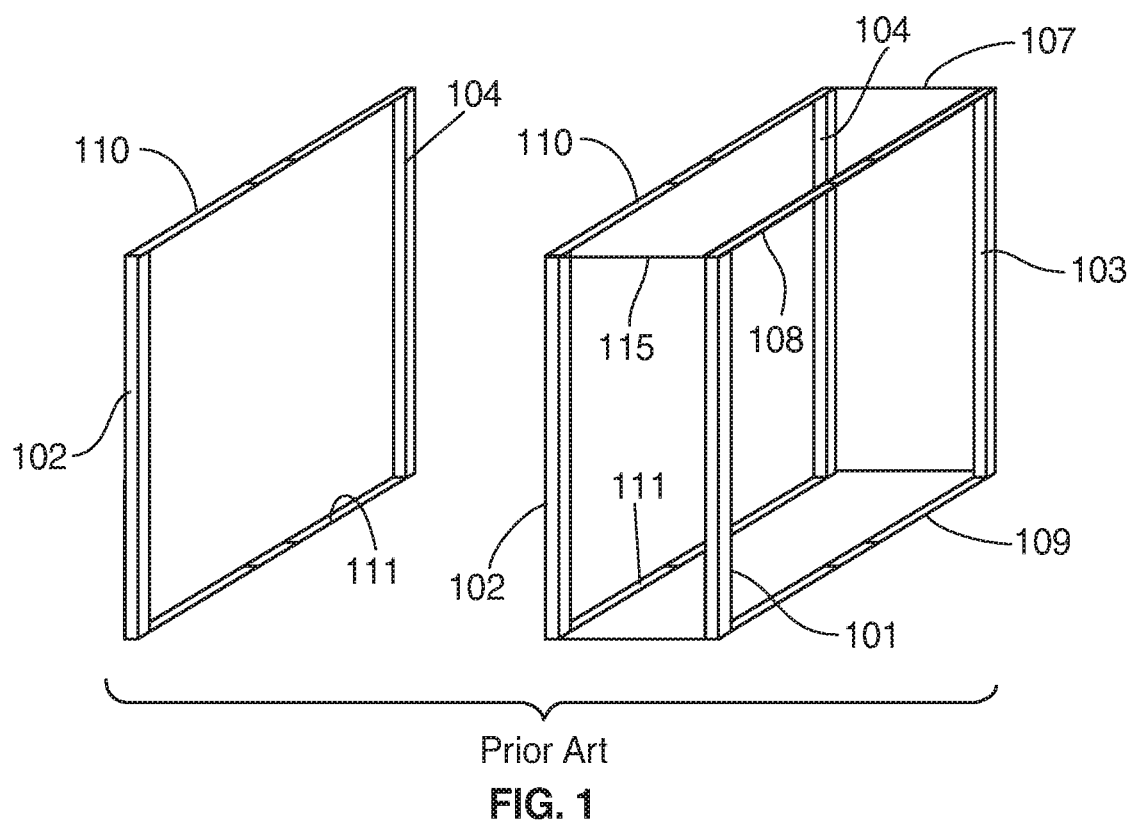
Prior Art
FIG. 1
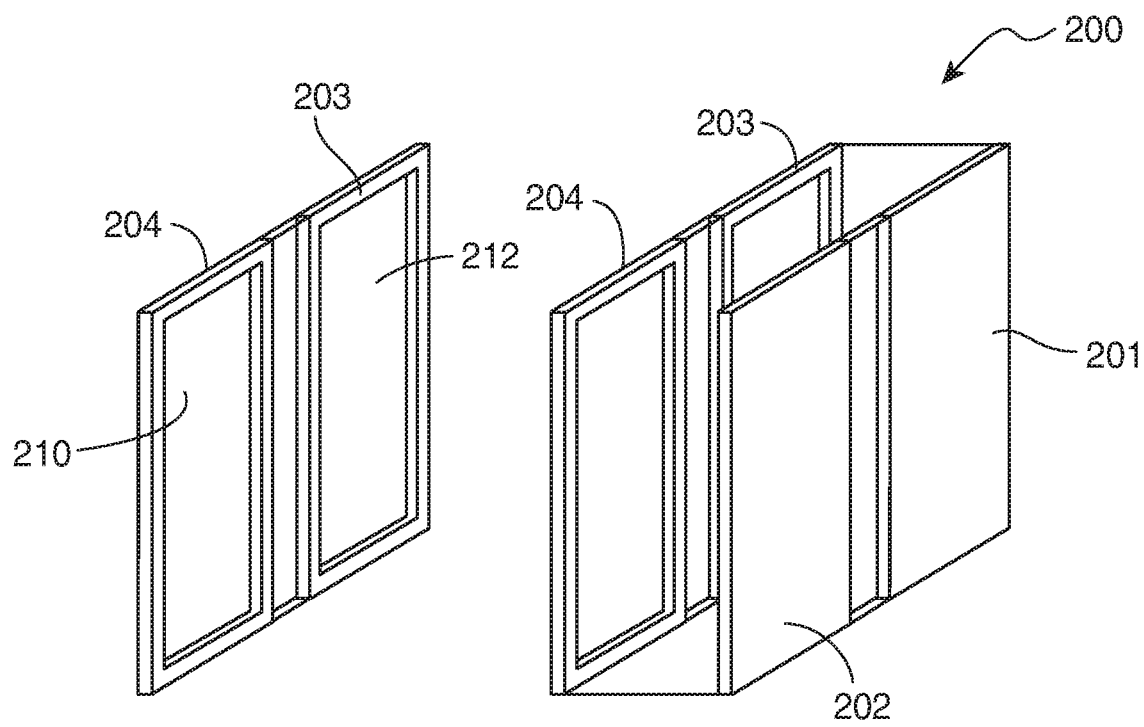
FIG. 2B
FIG. 2A

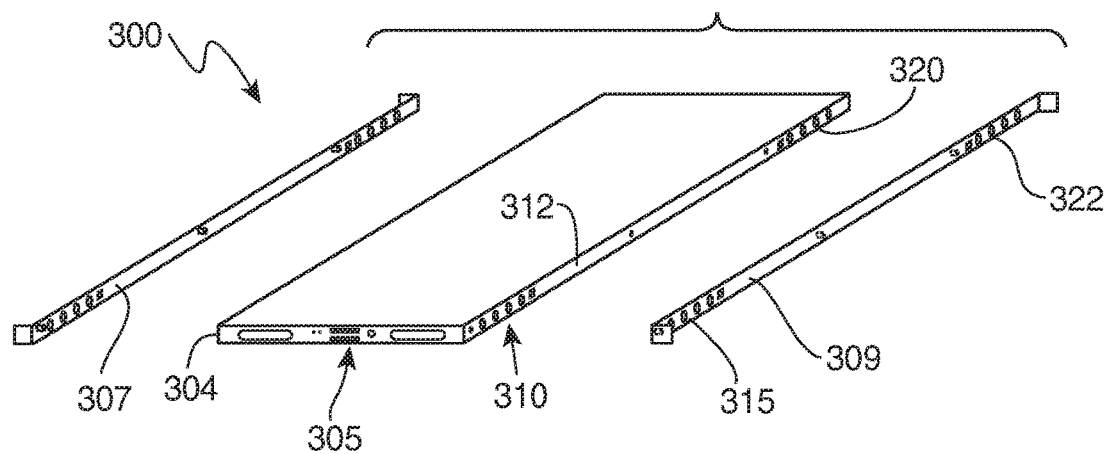
FIG. 3
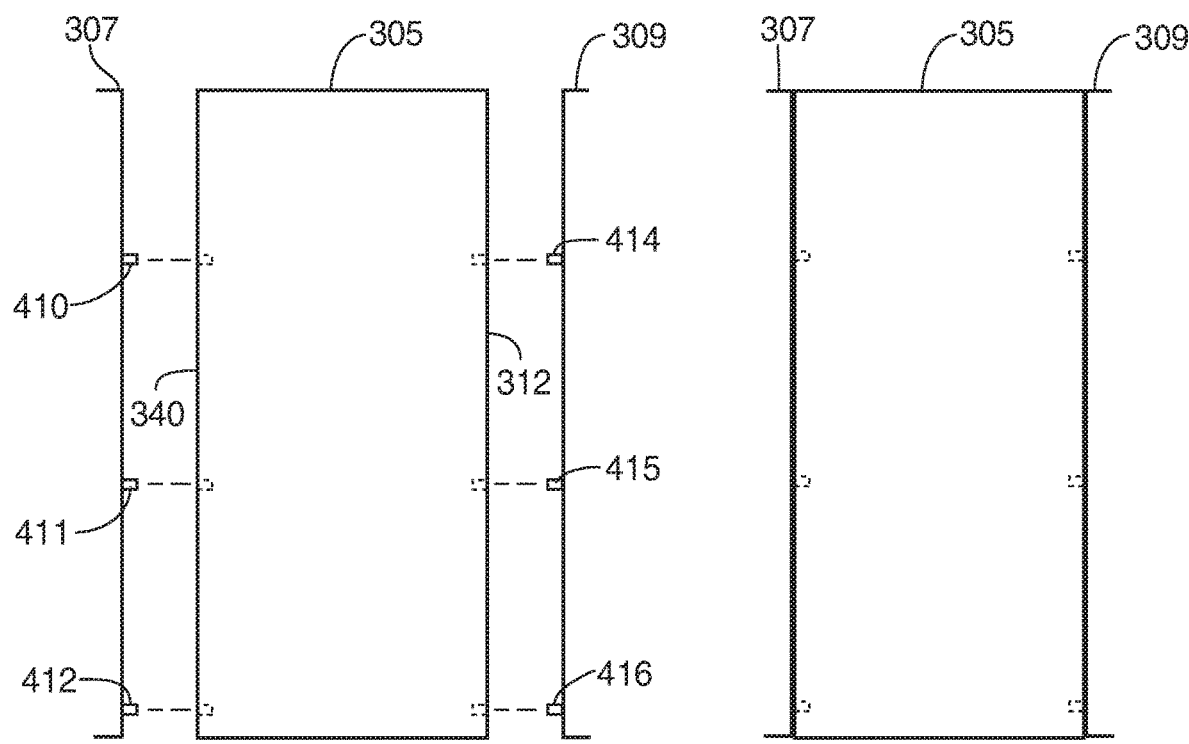
FIG. 4A
FIG. 4B

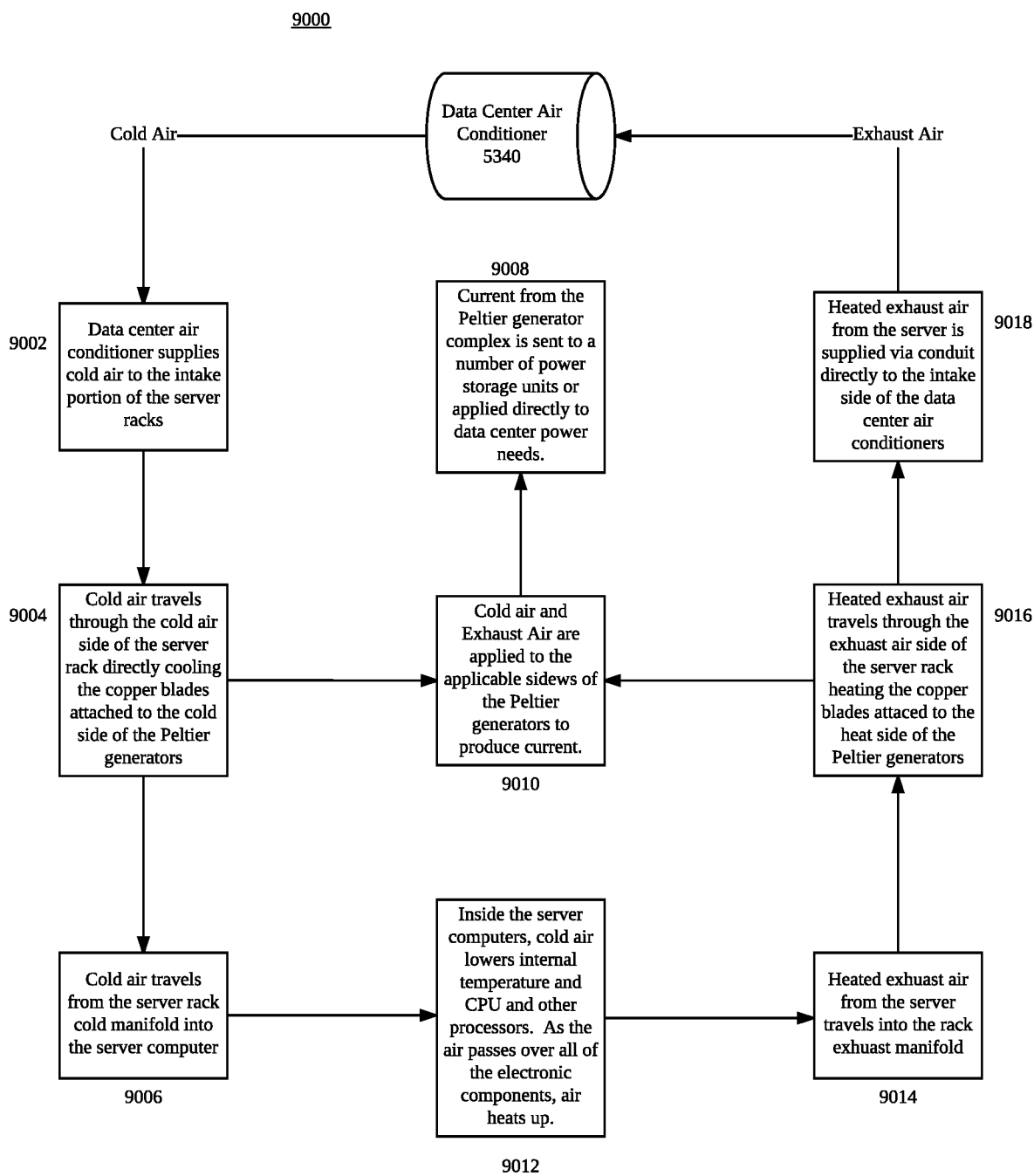

COMPUTER SERVER HEAT REGULATION UTILIZING INTEGRATED PRECISION AIR FLOW

RELATED APPLICATIONS

This application is a continuation, and claims priority under 35 U.S.C. § 120 from, U.S. patent application Ser. No. 15/144,788 titled Computer Server Heat Regulation Utilizing Integrated Precision Airflow filed on May 2, 2016.

FIELD OF THE INVENTION

The present disclosure relates to a server rack and more particularly, a server rack system that can be used to efficiently direct air flow to electric equipment such as servers and other network devices for dissipation of heat.

BACKGROUND

Existing rack-mount server systems include a server rack and a plurality of server units received in the server rack. Typically each of the server units is mounted to the server rack with a pair of mounting brackets respectively fixed to the inside surface of opposite sidewalls of a server rack. There have been numerous efforts to direct air and other fluids to electronic equipment to aid in heat dissipation.

SUMMARY

The server rack according to the invention includes a frame that includes hollow tubular support posts on the front sides and rear sides of the device. Between the front and rear posts are forward side panels and rearward side panels. The panels receive a complement of cartridges that have valve members to control the flow of air from a rear cavity though passages in the cartridges, through the rail and into servers. A plurality of side rails for receiving servers that are attached to the front and rear posts. The rails have passages through the sidewalls that correspond with passages provided on the sidewalls of the servers.

In a preferred embodiment, air conditioned air is introduced to forward side panels through passages provided on the upper and lower surfaces. Next, air travels from the forward panel, though one or more passages that is provided through a cartridge member, and then, into a front section of a server through a passage that is provided on the lateral sidewall of the server. Air travels through the server from the front section of the server to a rear section and then exits through a passage in the lateral sidewall to a cartridge that is provided in a rear panel. Next the air is returned to the air conditioner unit for recirculation.

In an embodiment the sever rack is approximately 6 feet tall and designed to accommodate 42 server units in 1.75" increments. Rail members are provided at each unit segment on the side panels and support a server. In embodiments further discussed below, passages through the cartridges have at least one valve member that can be individually electromechanically or manually controlled. When no server is provided in a specific rack unit, or when the temperature is otherwise adequately controlled in a particular server unit, the aperture may be closed. In embodiments, a controller automatically opens or closes valve members provide in cartridges in response to a signal from a thermometer.

As such, it should be appreciated that the valves or passages can be opened and closed variably for each server depending on the cooling needs for the server. Further, as discussed herein, the degree of air flow through the aperture can be controlled using a damper or weir arrangement. Therefore, in embodiments, a local controller is provided and can receive input information from thermometers reading the temperatures of the servers and can adjust the opening and closing valves aperture accordingly. Alternatively the dampers may be manually adjusted. In yet further embodiments a central controller receives signals from a plurality of server racks.

Each of the openings on the post is provided with a releasable seal to block flow depending on the particular configuration of servers. In embodiments, flexible manifolds extend from the posts to direct the fluid to and from access areas provided on the servers. While the preferred embodiment contemplates the use of air flow, in embodiments the frame is configured to receive a liquid and the posts and manifold direct fluid to heat exchange elements that engaged the respective servers.

The present invention further includes a server rack system comprising a server rack stand, having a computer support surface, defining a cool reservoir void, an exhaust reservoir void, and a demarcation wall running therebetween. The cool reservoir void has a cool inlet and a cool outlet. The exhaust reservoir void is positioned within the rack adjacent to said cool reservoir void, and has an exhaust inlet and exhaust outlet. The demarcation wall separates the cool reservoir void from the exhaust reservoir void, and supports a Peltier generator complex contacting both the cool reservoir void and the exhaust reservoir void. A rack circuit accepts electricity from the Peltier generator complex, which can be transmitted to a load.

In yet further embodiments the rack is configured to allow both liquid flow and air flow.

These aspects of the invention are not meant to be exclusive. Furthermore, some features may apply to certain versions of the invention, but not others. Other features, aspects, and advantages of the present invention will be readily apparent to those of ordinary skill in the art when read in conjunction with the following description, and accompanying drawings.

BRIEF DESCRIPTION OF THE DRAWINGS

FIG. 1 is a perspective view of a prior art server rack and side panel.

FIG. 2a is a perspective view of a partial rack assembly according to an embodiment of the invention.

FIG. 2b is a perspective view of two side panels of a partial rack assembly according to an embodiment of the invention.

FIG. 3 is a perspective exploded view of a first rail assembly, a server and a second rail assembly according to an embodiment of the invention.

FIG. 4A is a top exploded view of a first rail assembly, a server and a second rail assembly according to an embodiment of the invention.

FIG. 4B is a top view of a first rail assembly, a server and a second rail assembly attached together according to an embodiment of the invention.

FIG. 86 is a view of a method of the present invention.

DETAILED DESCRIPTION

Figure 5:
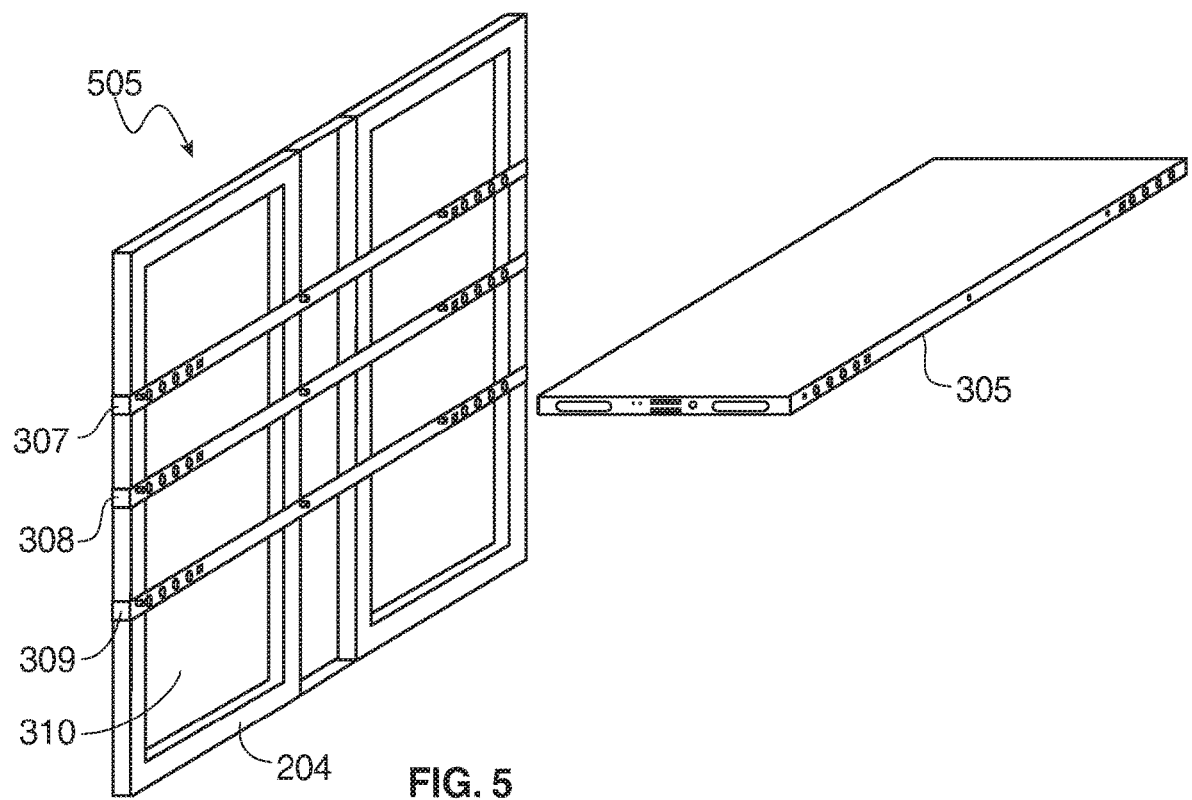
FIG. 5 is a perspective exploded view of a side panel and server in alignment before assembly according to an embodiment of the invention.

The forgoing description, including the accompanying drawings, is illustrated by way of example and is not to be construed as limitations with respect to the invention. Now referring to FIG. 1, a prior art rack system is depicted that includes upright members and side members and is configured to receive a plurality of servers.

FIG. 2A and FIG. 2B depicts aspects of an embodiment of the invention 200 including forward side panel 204 and 202 and rearward side panels 201 and 203. As best seen in FIG. 2B the side panels have respective cavities 210 and 212 on their inner sides. The opposite side panels may be attached together by a rear member or rear panel or other transverse members that spans the opposite sidewalls of the device.

Now referring to FIG. 3, a further feature of embodiments of the invention includes use of a rail member 307 which is configured to be attached to server 305. On the opposite side of the server is rail 309 which includes passages 315 and 322 which correspond with adjacent passages such as passages 310 and 320 that are located on the lateral sidewall 312 of the server 305. FIG. 4a is a top view of the invention illustrates how rails 307 and 309 engage server 305 using fasteners 410, 411 and 412 on one side and 414, 415 and 416 on the opposite side. FIG. 4b depicts the rails attached to the server 305.

Figure 6:
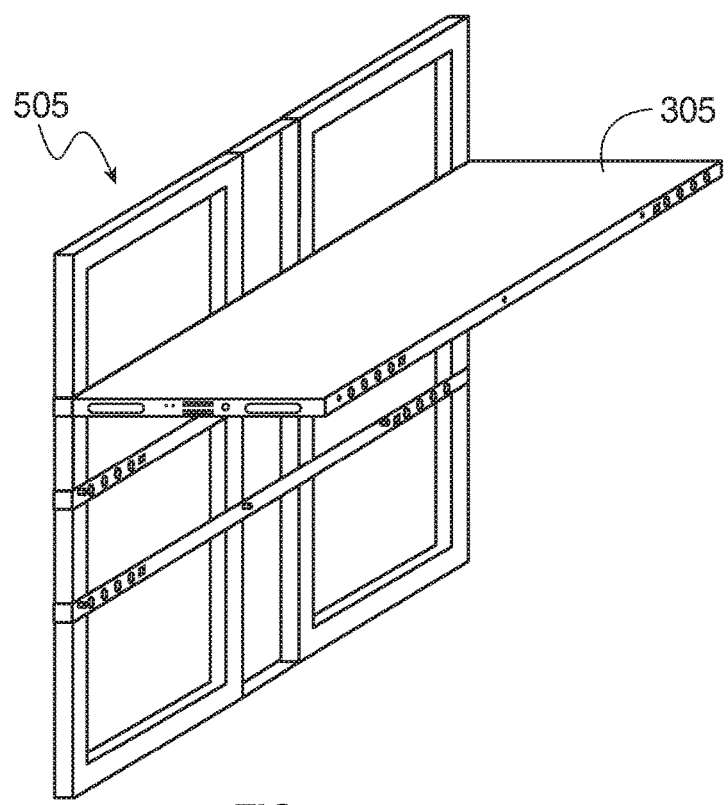
FIG. 6 is a perspective view of a side panel and server attached to one another.

FIG. 5 shows a plurality of rails 307, 308 and 309 that are secured to lateral panels 505. These rails are configured to engage server 305. FIG. 6 depicts the side panel 505 wherein server 305 is engaged with the panel at the top rail.

Figure 7:
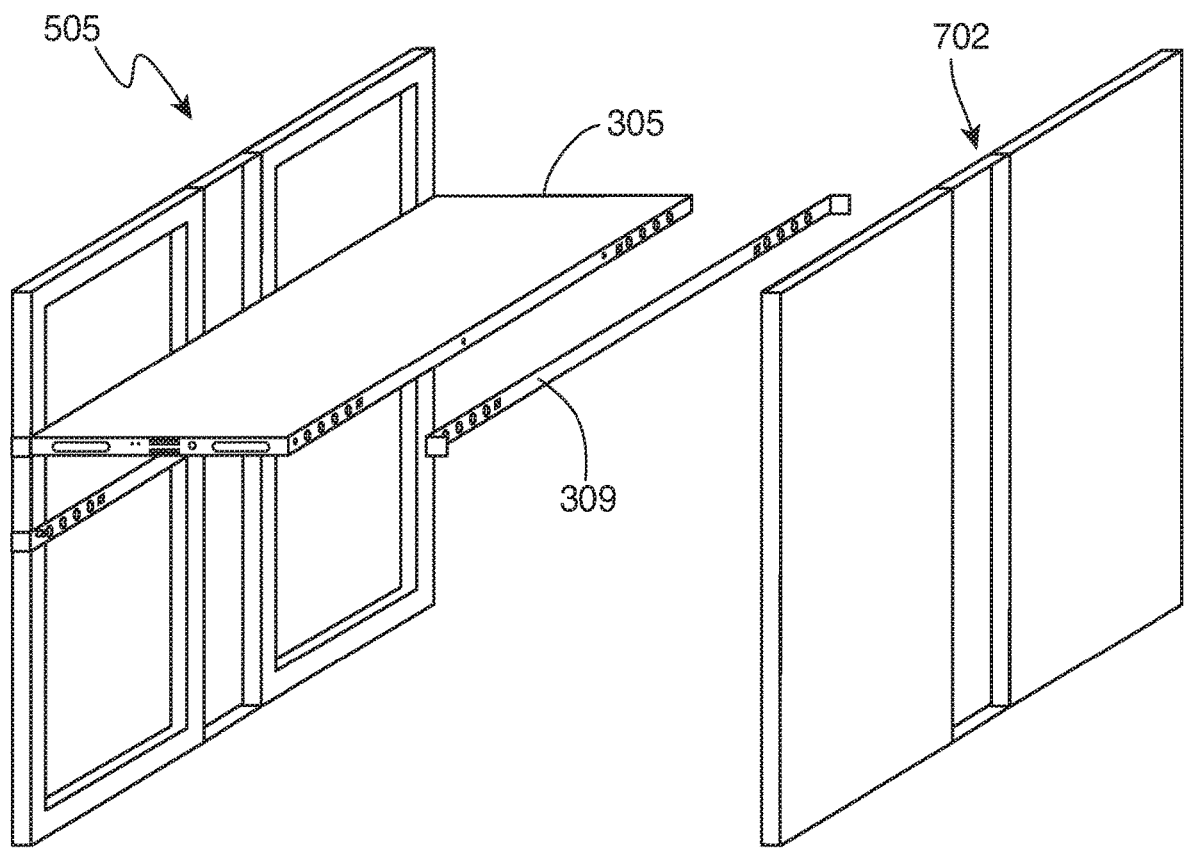
FIG. 7 is a perspective exploded view of side panel rails, a server and a second panel according to an embodiment of the invention.

FIG. 7 depicts an exploded view of the assembly of rack assembly components including side panel 505, rails 307 and 309 and opposite side panel 702.

Figure 8:
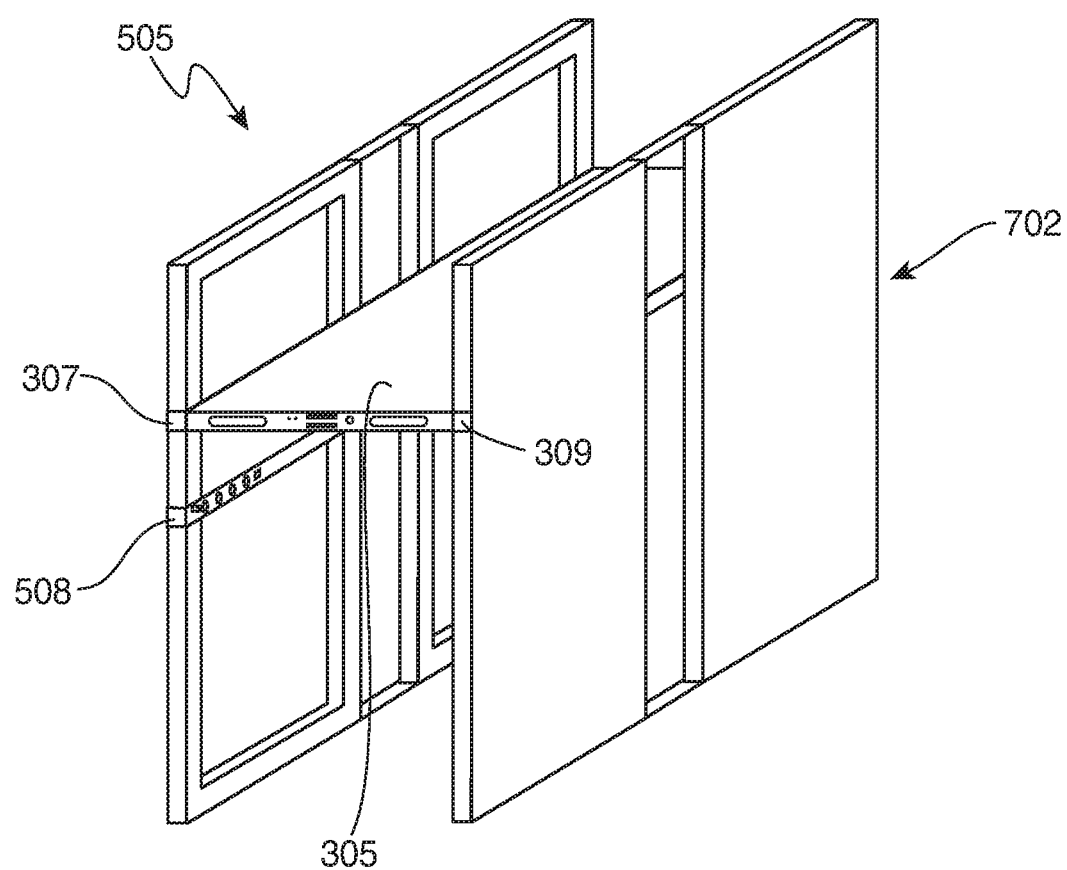
FIG. 8 is a perspective view of side panel rails, a server and a second panel according to embodiment of FIG. 7 that has been assembled.

FIG. 8 is an embodiment of the invention holding server 305 between panels 505 and 702. Server 305 slides along rails 307 and 309 which are affixed to the side panel sections 505 and 702.

Figure 9:
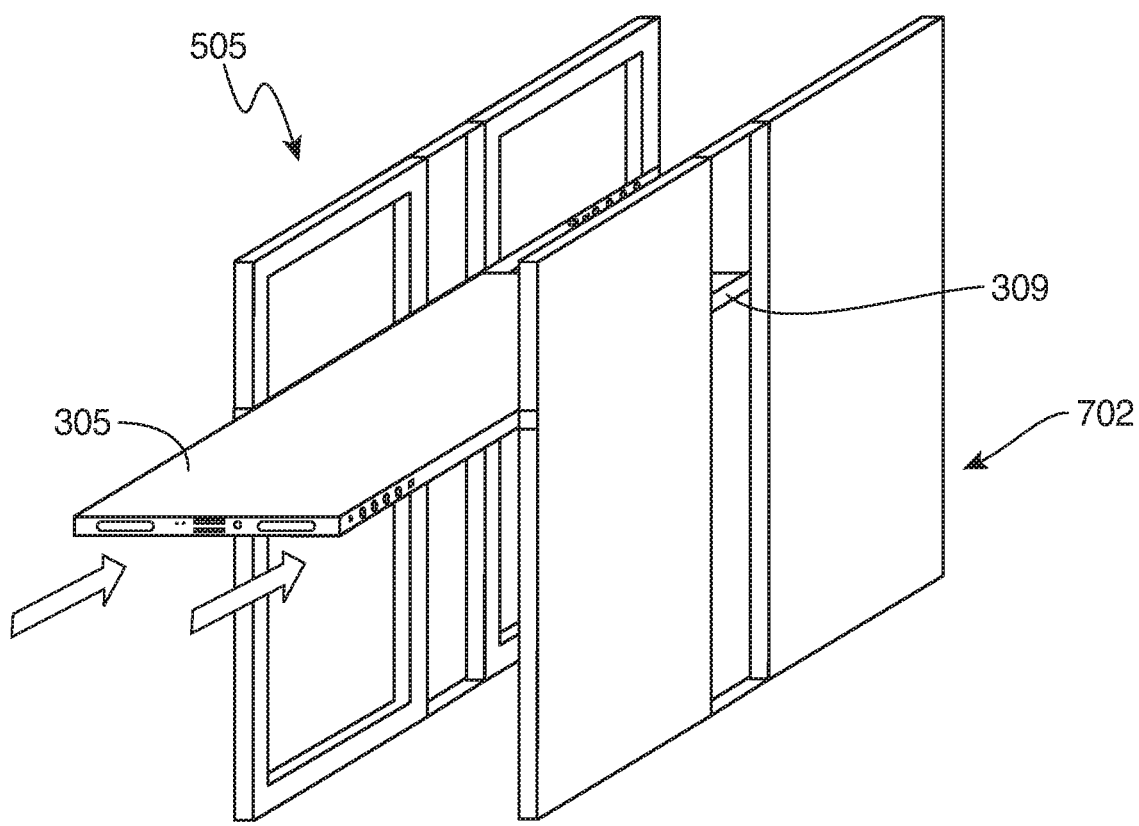
FIG. 9 is a perspective view of a rack assembly including side panels, rails, and a server that schematically illustrates a server sliding into the assembly.

FIG. 9 depicts how the server 305 slides in to the rack system from the front along the opposite rails 307 and 309 attached to panels 505 and 702 in an embodiment of the invention.

Figure 10:
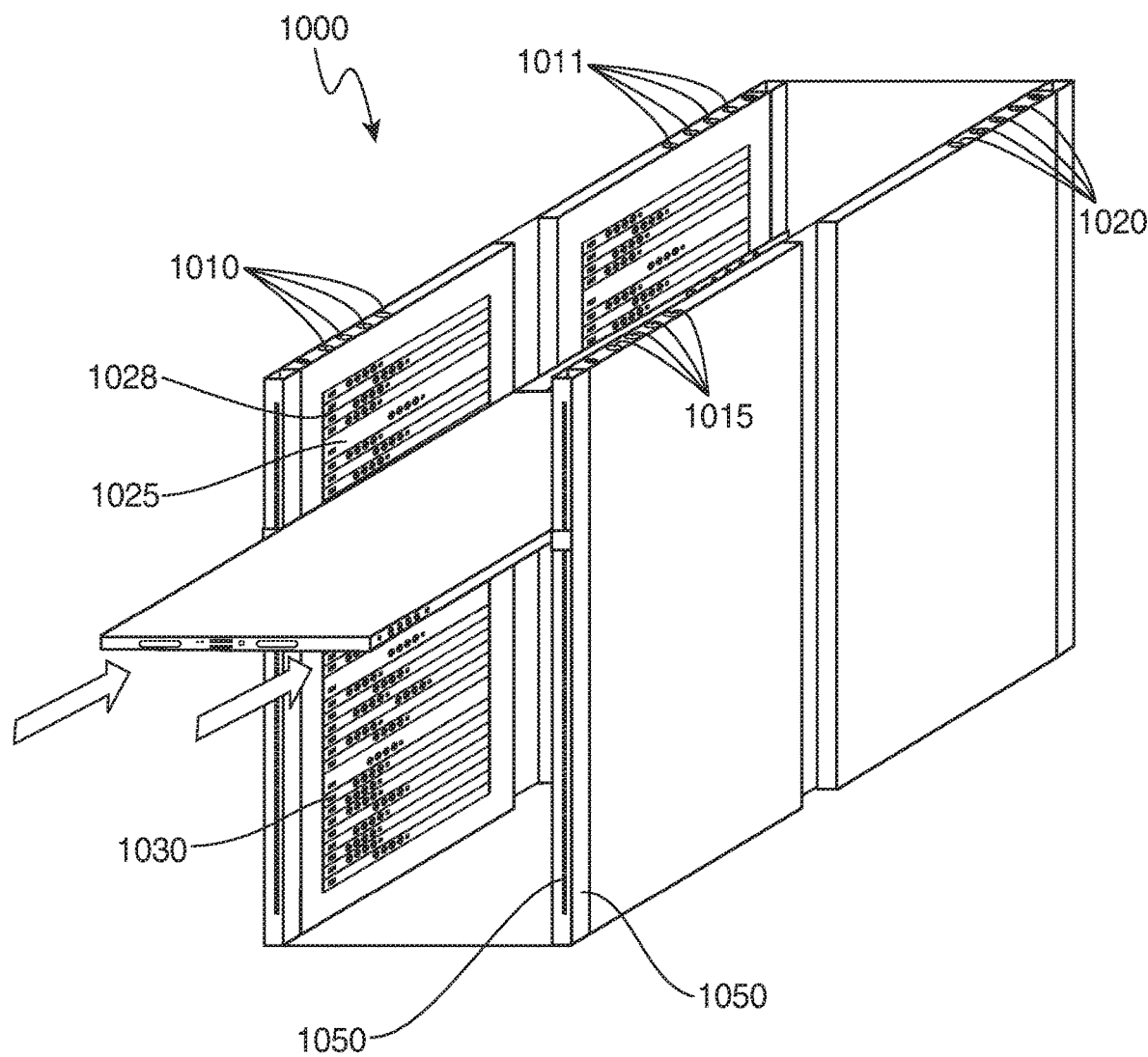
FIG. 10 is a perspective view of a side panel, rails, a server and a second panel that further includes cartridges received in the forward and rearward side panels that illustrate a server sliding into the assembly.

FIG. 10 depicts assembly 1000 that includes a depiction of the air passages 1010, 1011, 1015, and 1020 in the lateral side panels. In this embodiment there are plurality of cartridges provided in the side panels such as cartridges 1028 and 1025 and 1030. A server is received in the rack member by sliding it in the direction illustrated along the opposite rails.

Figure 11:
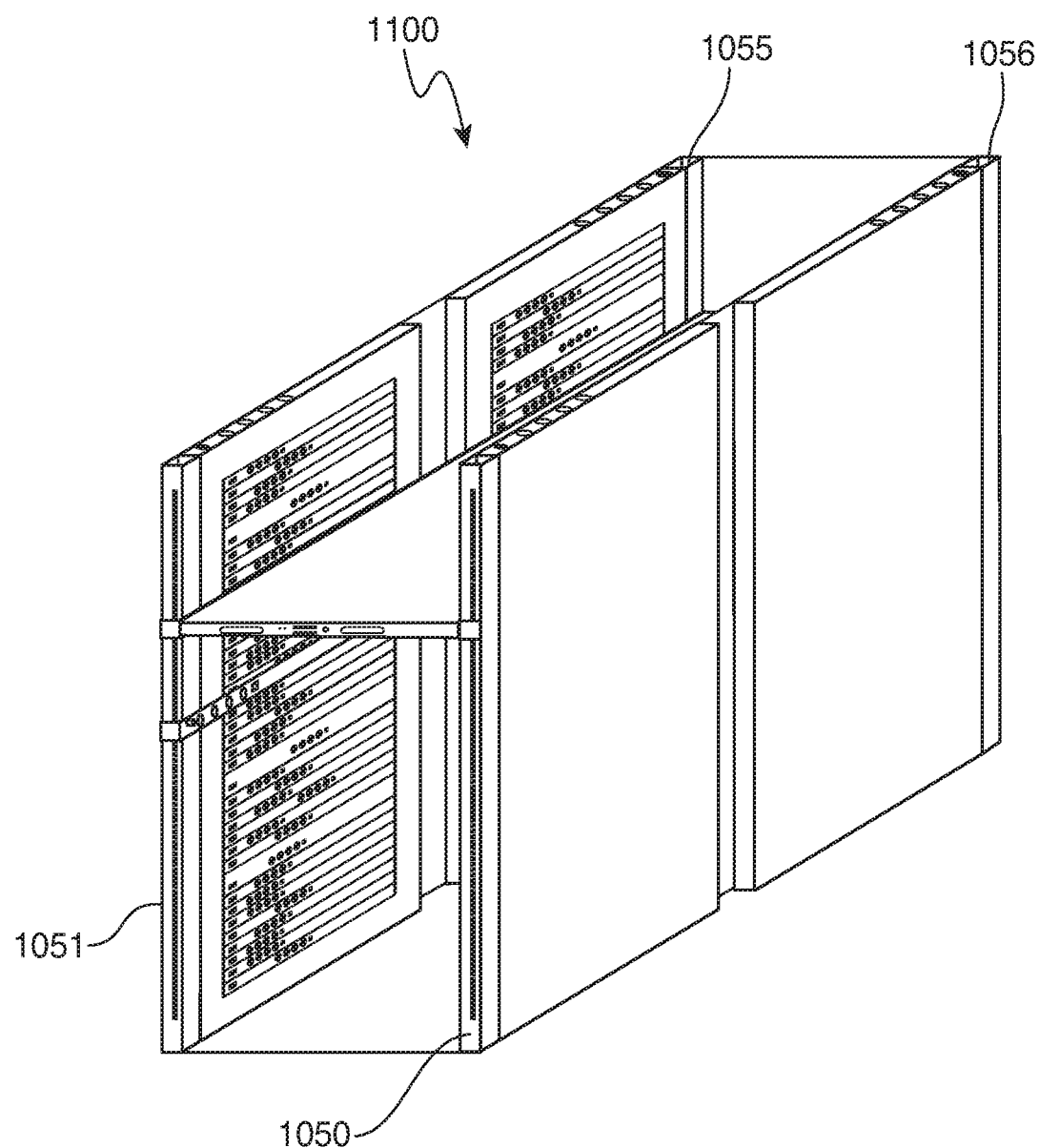
FIG. 11 is a perspective view of the embodiment depicted in FIG. 10 with a server secured within the device.

FIG. 11 depicts the rack invention including server 305 in engagement with the rails in position. The panel depicts a series of cartridges attached and connected to the panel wherein the cartridges are designed to control the flow of air from the panel to the servers.

Figure 12:
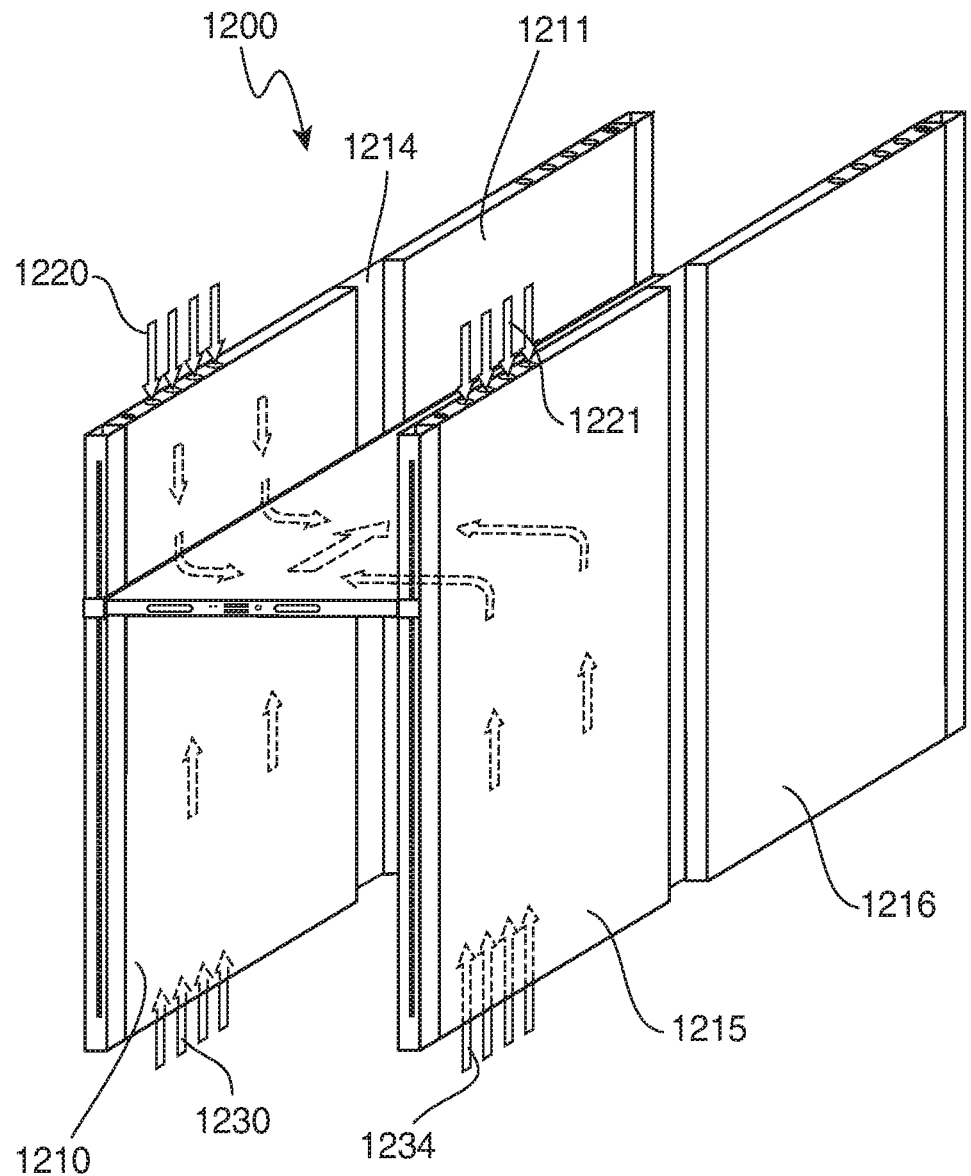
FIG. 12 is a perspective illustration of an embodiment of the invention that includes a schematic representation of the direction of air flow from the forward panels to a server.
Figure 13:
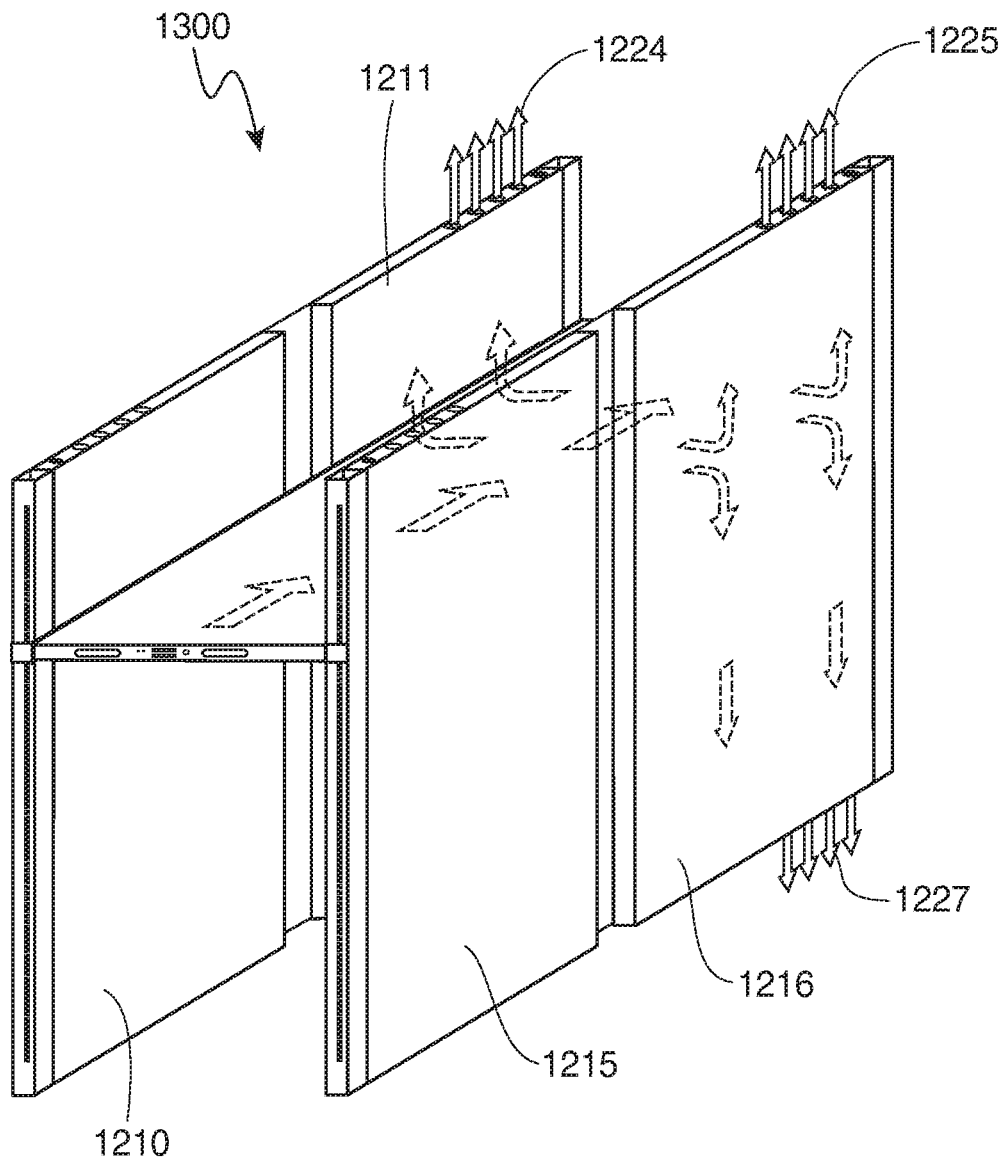
FIG. 13 is a perspective illustration of an embodiment of the invention that includes a schematic representation of the direction of air flow from a server through rearward side panels.

FIG. 12 illustrates the airflow though the rack of the invention. Airflow enters the left and right side panels through passages that are provided on the top and bottom surface and passes from the front of the panel, through cartridges, through side and into a server. As best seen in FIG. 13, air from the servers passes rearward and out passages in the sidewall back to a rear panel section. Air passes from the through passages provided on the top and bottom of the panels.

Figure 14:
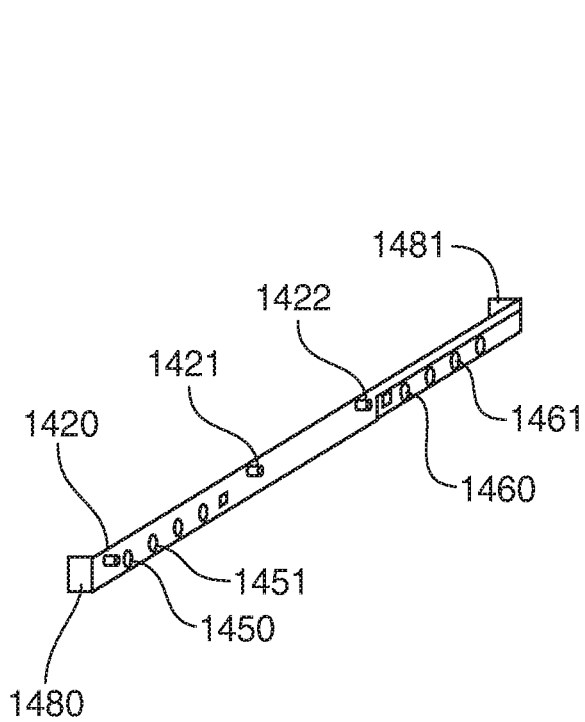
FIG. 14 is a perspective view of a rail assembly that is used connection with an embodiment of the invention.
Figure 15:
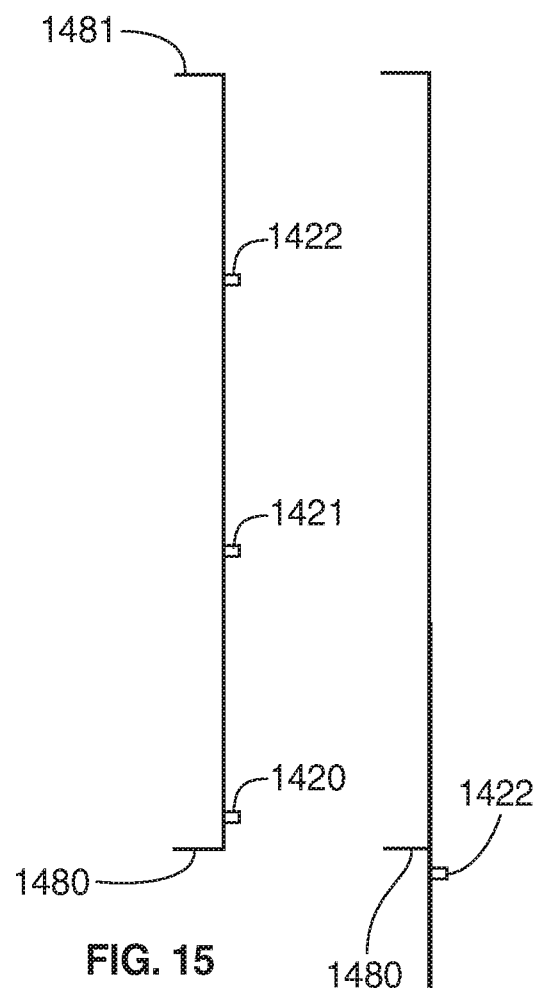
FIG. 15 is a top view of the rail assembly that is shown in FIG. 14.
Figure 16:
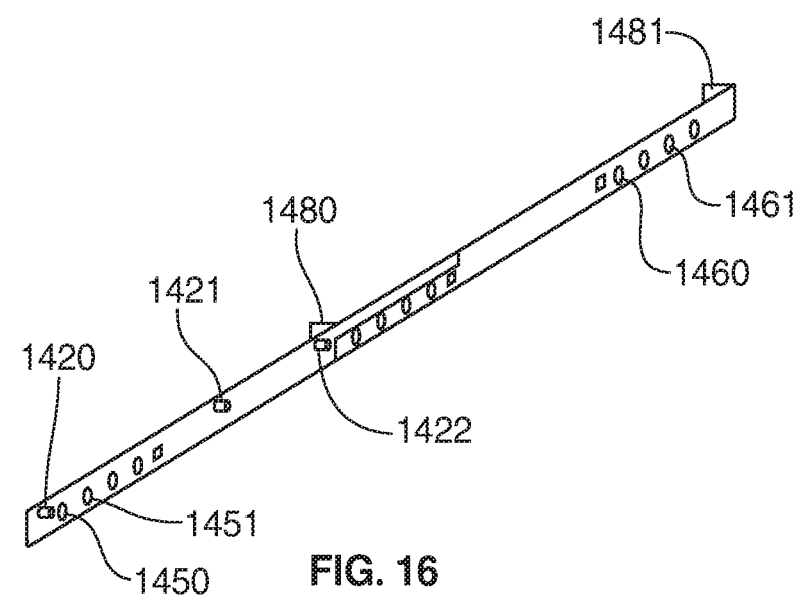
FIG. 16 is a perspective view in elevation of the rail assembly with the front section extended from the rear section that is shown in FIG. 14.
Figure 17:
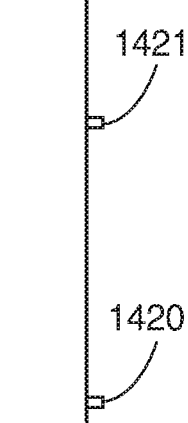
FIG. 17 is a top view of the rail assembly with the front section extended from the rear section.

Now referring to FIG. 14, a two part rail member is depicted that includes passages 1450 and 1451 to allow for air flow and are located at the front of rail member 1400 and passages 1460 and 1461 near the opposite end. The two parts of the rail slide along one another to allow the rail to extend, such as that used in a conventional drawer . . . . In embodiments the rails may include bearing and roller elements. Each end of rail 1400 has attachment sections 1480 and 1481 that are oriented perpendicular to the length of the rail element and includes fastening means to engage the upright members. The rail includes fastener elements 1420, 1421, and 1422 that engage the server. FIG. 15, a top view of the rail 1400, depicts the fastening members 1420, 1421 and 1422. As seen in FIG. 16, the passages 1450, 1451, 1460, & 1461 allow air flow though the rail. FIG. 17 depicts a rail with the forward member fully extended.

Figure 18:
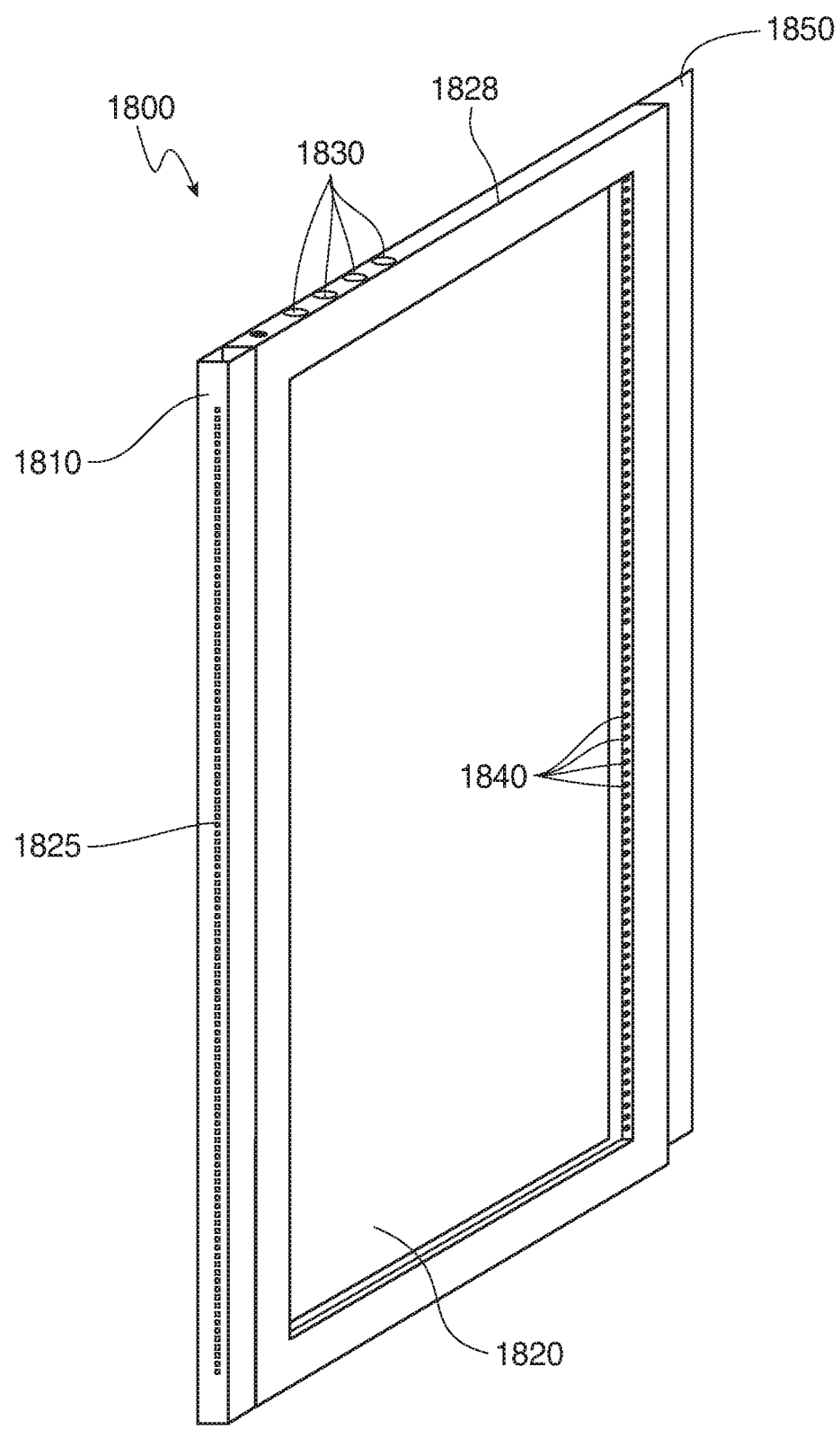
FIG. 18 is a perspective view of a forward side panel and forward post according to an embodiment of the invention depicting the top surface of the panel.
Figure 19:
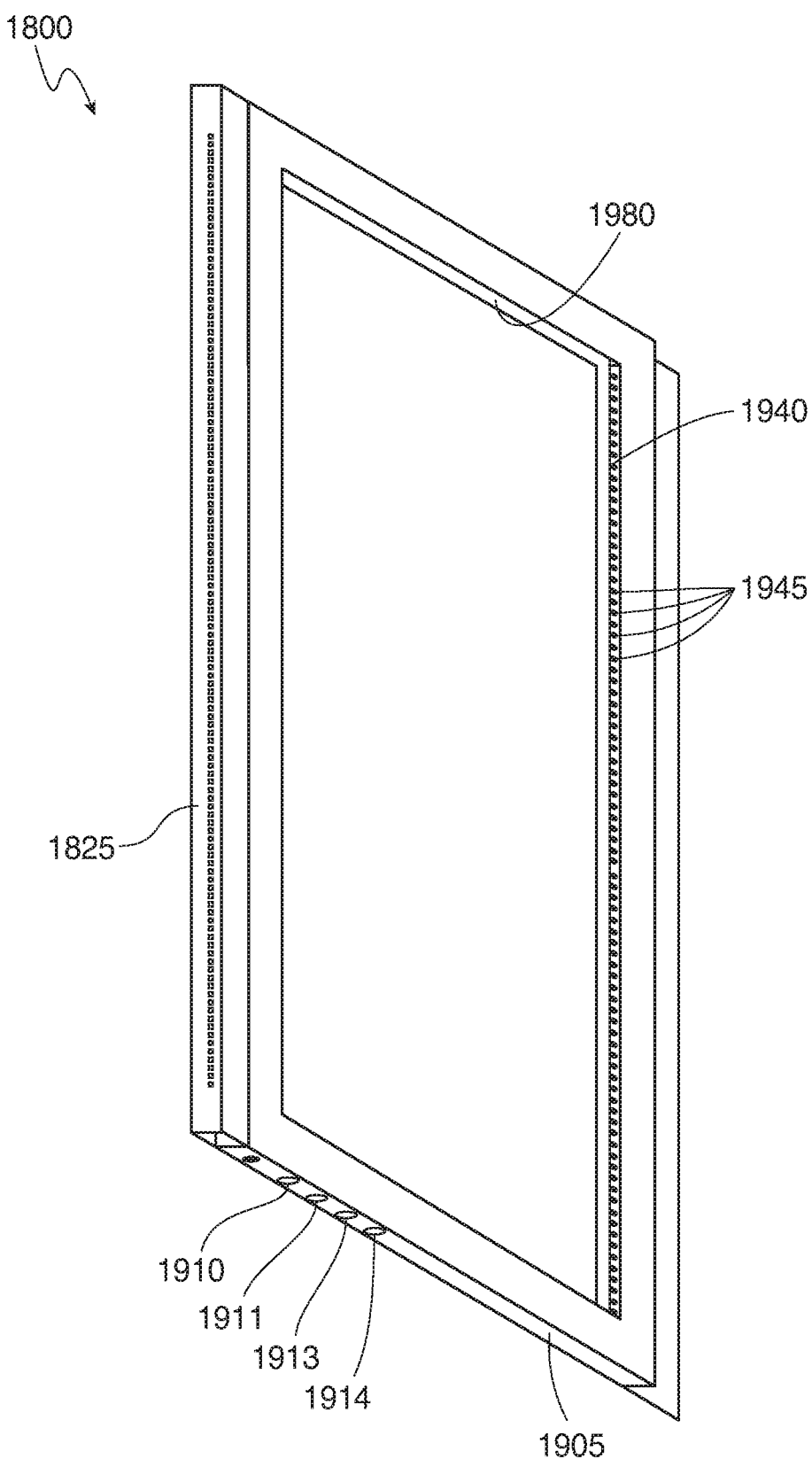
FIG. 19 is a perspective view of a forward side panel and forward post shown in FIG. 18 depicting the bottom surface of the panel.

FIG. 18 depicts panel 1800 that includes a front hollow upright member 1825 and rear upright member 1850 that frame panel 1828. Panel 1800 includes passages 1830 that allows airflow into the panel member. Along the inside surface of panel are a series of electrical contact pins 1840 that are designed to receive the cartridge members. FIG. 19 depicts panel 1800 illustrating the bottom surface 1905 that includes a services of passages such as passages 1910, 1911, 1913, and 1914 that allow air flow into the panel. In embodiments, interior horizontal surface 1980 of the panel is provided with an elastomeric material on the surface which can engage opposite surfaces of the cartridge and establish an air tight seal. Vertical surface 1940 has a series of contact pins 1945 that can establish an electrical connection with the cartridge members. Like surface 1980, in embodiments, the surface 1940 panel is provided with an elastomeric material on the surface which can engage opposite surfaces of the cartridge and establish an air tight seal.

Figure 20:
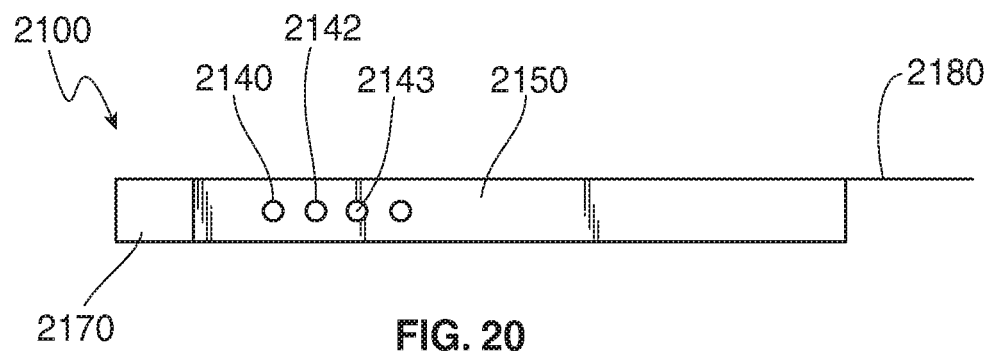
FIG. 20 is a top view of the forward side panel and forward post shown in FIG. 18.

FIG. 20 is a top view of panel member 2100 showing openings 2140, 2142, and 2143 through top surface 2150. The openings provide an entrance for air flow to a section of the panel member.

Figure 21:
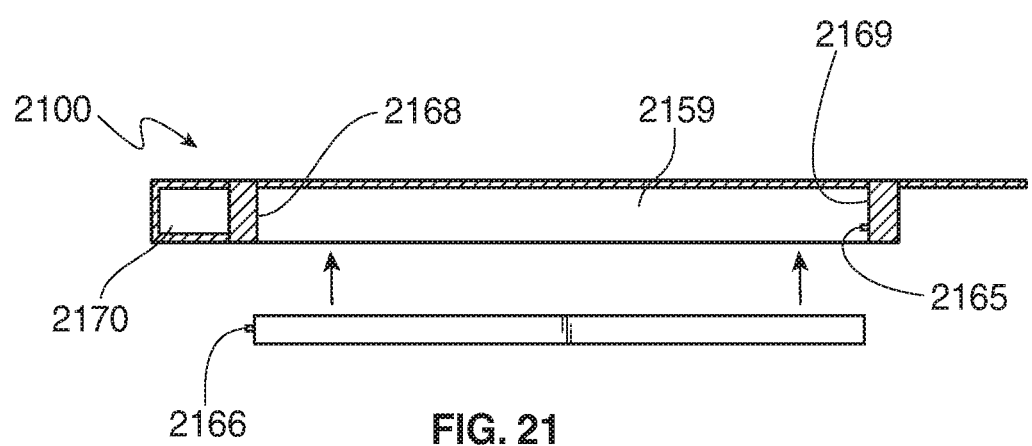
FIG. 21 is a top sectional view of the forward side panel and forward post shown in FIG. 18 also depicting a cartridge and the manner in which it is received in the panel.
Figure 22:
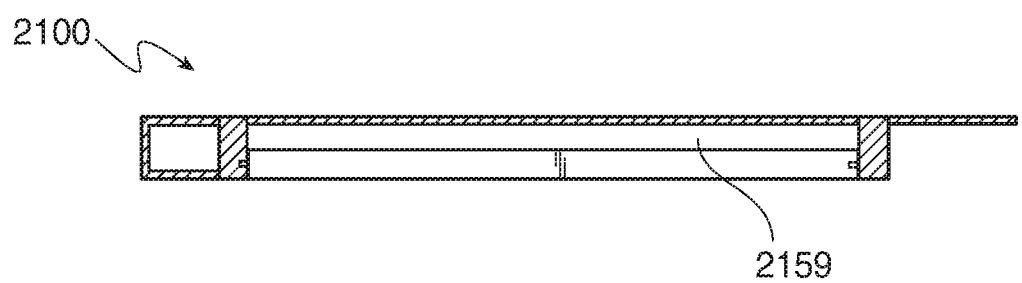
FIG. 22 is a top sectional view of the forward side panel and forward post shown in FIG. 18 with a cartridge retained in the panel.

FIGS. 21 and 22 are top sectional view of panel 2100 that shows how cartridge is received in the panel. In this regard, the cartridge is retained in place by pins 2165 and 2166 which engage upright members 2168 and 2169 located in the lateral panel. The assembly creates a void 2159 behind the cartridge. FIG. 22 depicts a top section view of the engagement of the cartridge with a side panel member 2100.

Figures 23, 24:
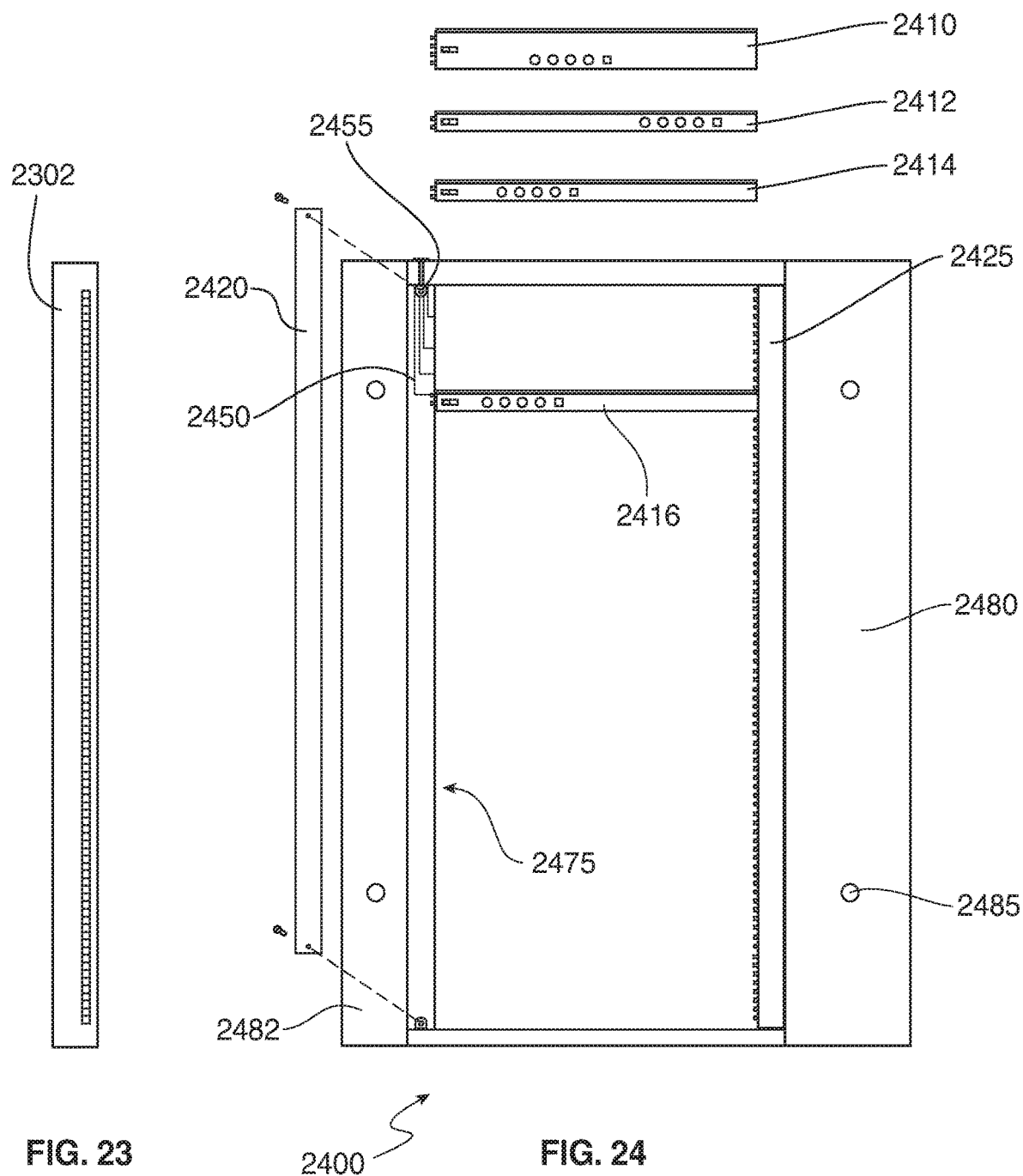
FIG. 23 is a front view in elevation of a post member used in connection with the invention.
FIG. 24 is a fragmented view in elevation of a forward side panel, a series of cartridges, a cover plate and a forward post according to an embodiment of the invention.

FIG. 24 includes a side view of a series of different cartridges 2410, 2412, 2414, and 2416 that have passages through their respective lateral sides that are at different locations. The cartridges are designed to complement different servers that may be used in the rack system. Cartridge 2416 is depicted in engagement with side panel member 2400. It is in electrical connection to a central bus 2455 by control wire 2450 that is routed through a cavity in the side portion of panel 2400. The cavity within the side panel is covered by plate 2420 or plate 2425. FIG. 23 is a front view of member 2482 and surface 2302 depicts holes provided for attachment of the rails members. Flange section 2480 is provided for attachment to the supporting frame for the rack system.

Figure 25:
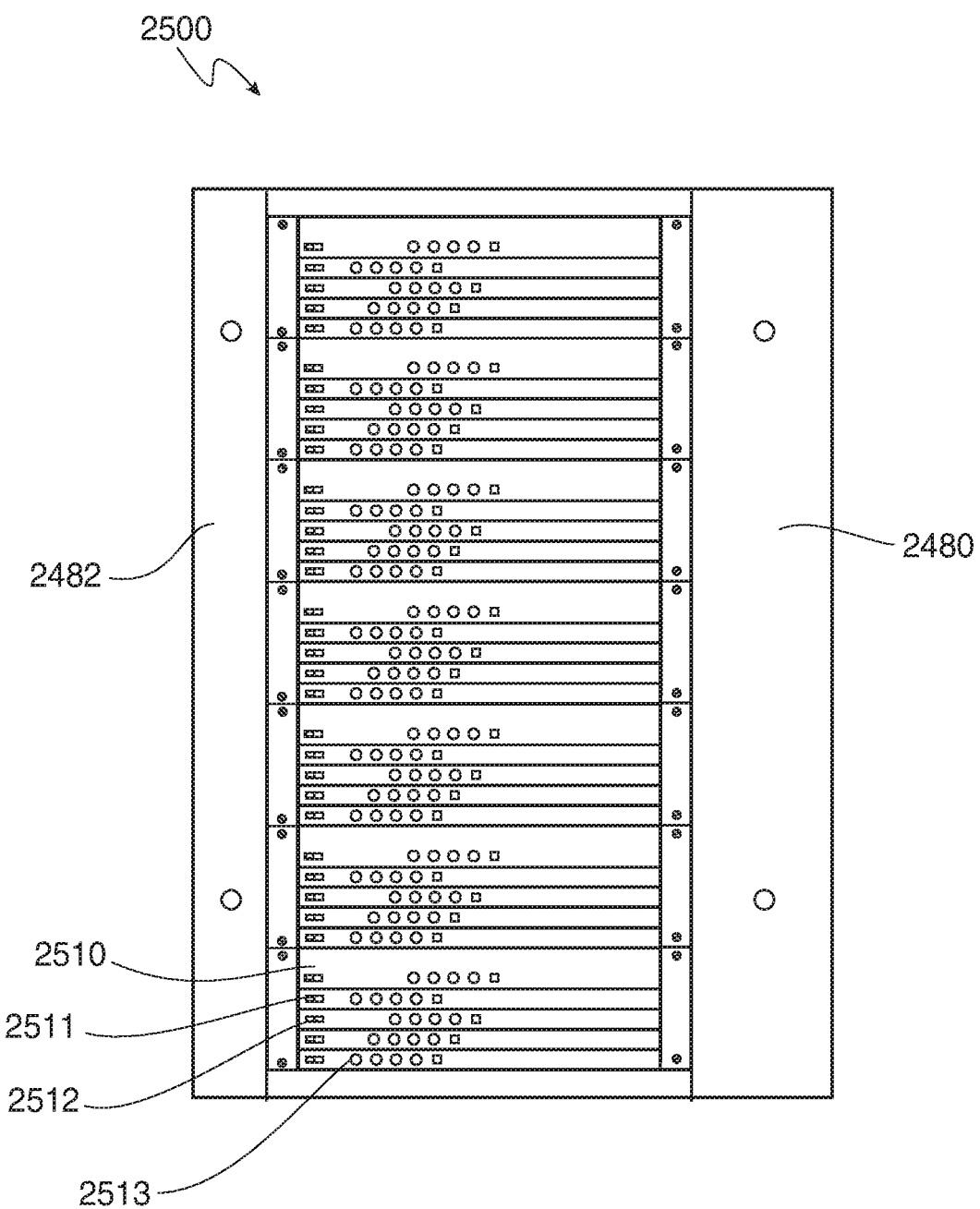
FIG. 25 is a front view in elevation of a forward panel having a complete complement of cartridges.

FIG. 25 depicts a side view of an exemplary panel containing a plurality of cartridges, such as cartridges 2510, 2511, 2512, and 2513. In addition, FIG. 25 depicts an alternative configuration of cover plates to 2420 or 2425.

Figure 26:
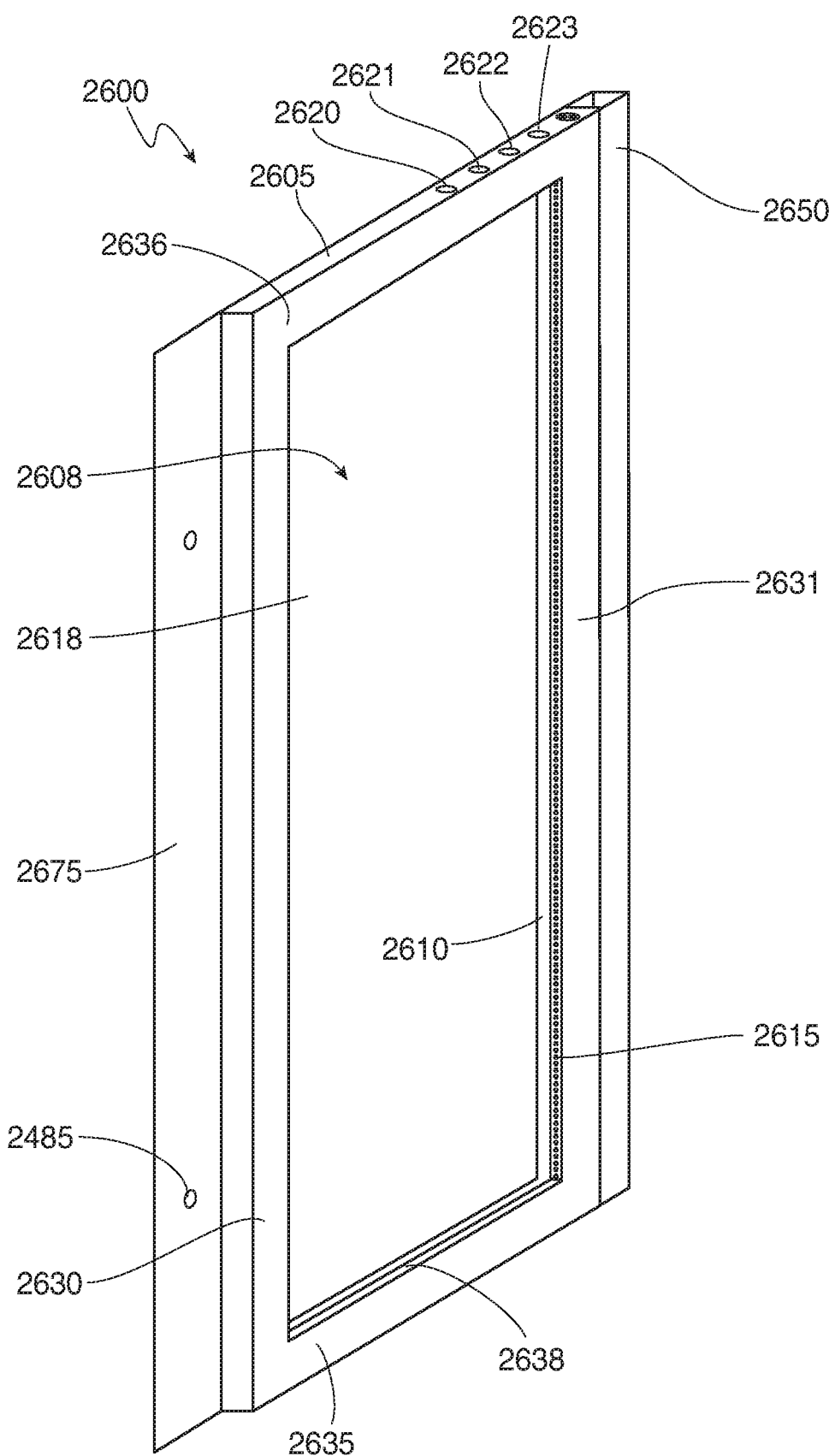
FIG. 26 is a perspective view of a rearward side panel depicting the top surface.
Figure 27:
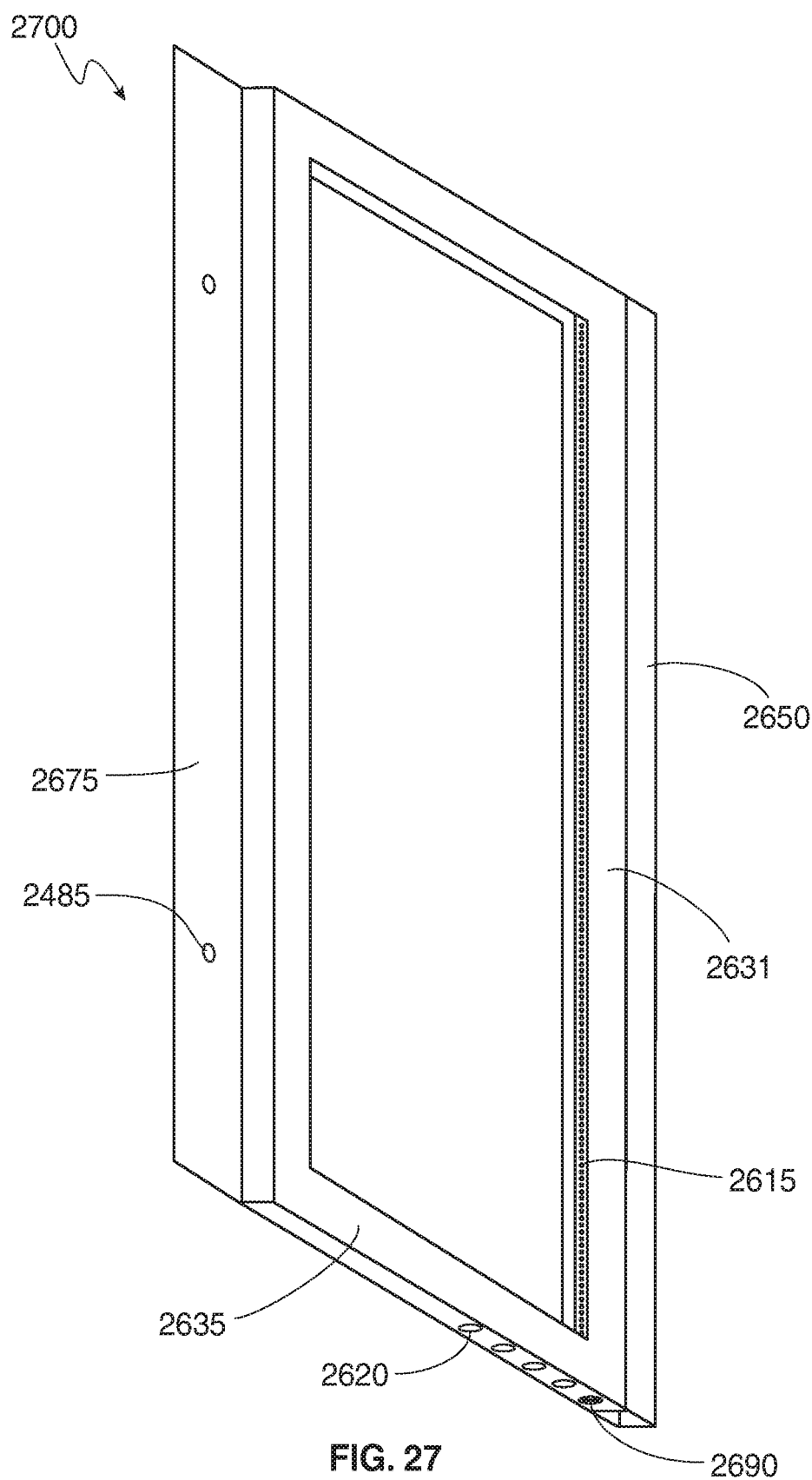
FIG. 27 is a perspective view of a rearward side panel depicting the lower surface.

FIG. 26 depicts a rearward side panel 2600 designed to be used in the rack system of the invention. Like the front panel, rearward panel includes a series of vertical passages 2620, 2621, 2622, and 2623 though top surface 2605 of panel 2600. The passages terminate in the recess region 2608 defined by upright members 2630 and 2631 and horizontal members 2635 and 2636 and rear flat section 2618. The panel 2600 is attached to the supporting frame for the rack using flange member 2675. At the rear of the section, upright post member 2650 provides additional structural support for the panel. As shown in FIG. 27, panel 2600 also includes passages through the lower member 2635 such as passage 2620. A series of connector pins 2615 is provided on upright member 2631 for engagement to the cartridges.

Figure 28:
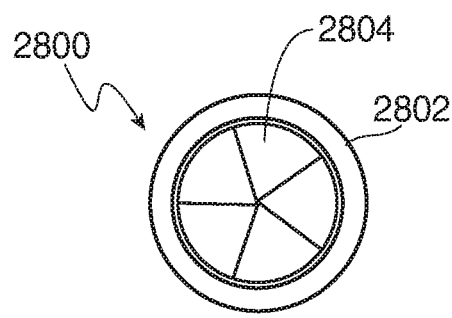
FIG. 28 is a top view of an iris air flow control valve used in a cartridge according to an embodiment of the invention.
Figure 29:
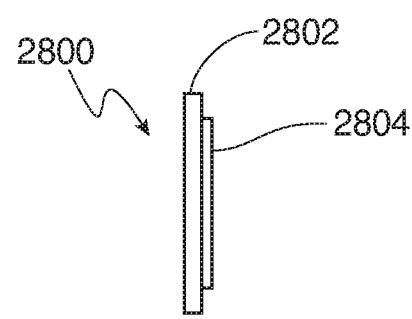
FIG. 29 is a side view of an iris valve used in a cartridge according to an embodiment of the invention.
Figure 30A:
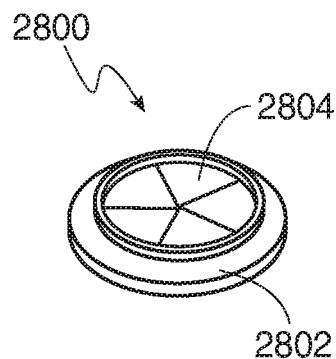
FIG. 30a is a perspective view of an iris valve used in a cartridge according to an embodiment of the invention in a closed position.
Figure 30B:
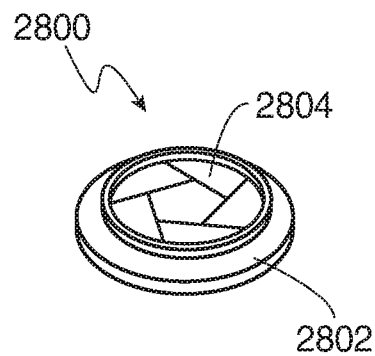
FIG. 30b is a perspective view of an iris valve used in a cartridge according to an embodiment of the invention in a partial opened position.
Figure 30C:
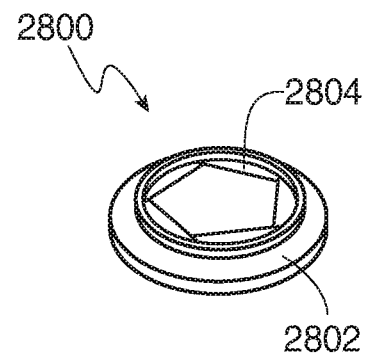
FIG. 30c is a perspective view of an iris valve used in a cartridge according to an embodiment of the invention in a fully opened position.

Now referring to FIGS. 28-30 an exemplary iris control valve is shown. The valve includes movable panel 2804 that can be opened and closed to define different sized openings that are retained by an annular ring 2802.

Figure 31:
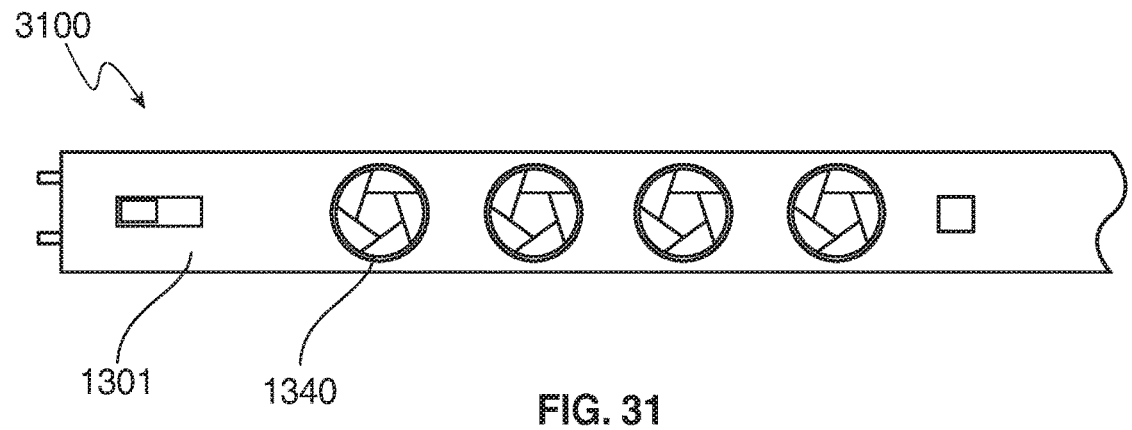
FIG. 31 is a side fractional view in elevation of a cartridge assembly with the valves partially opened.
Figure 32:
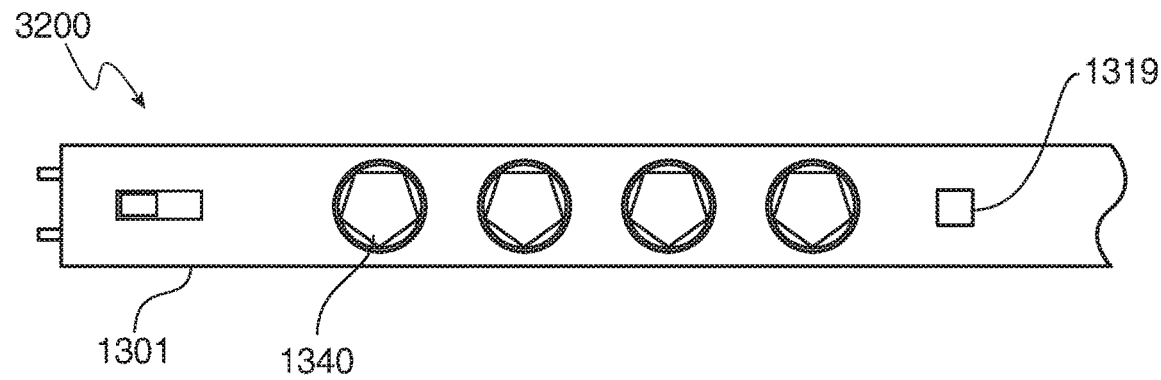
FIG. 32 is a side fractional view in elevation of a cartridge assembly with the valves fully opened.
Figure 33:
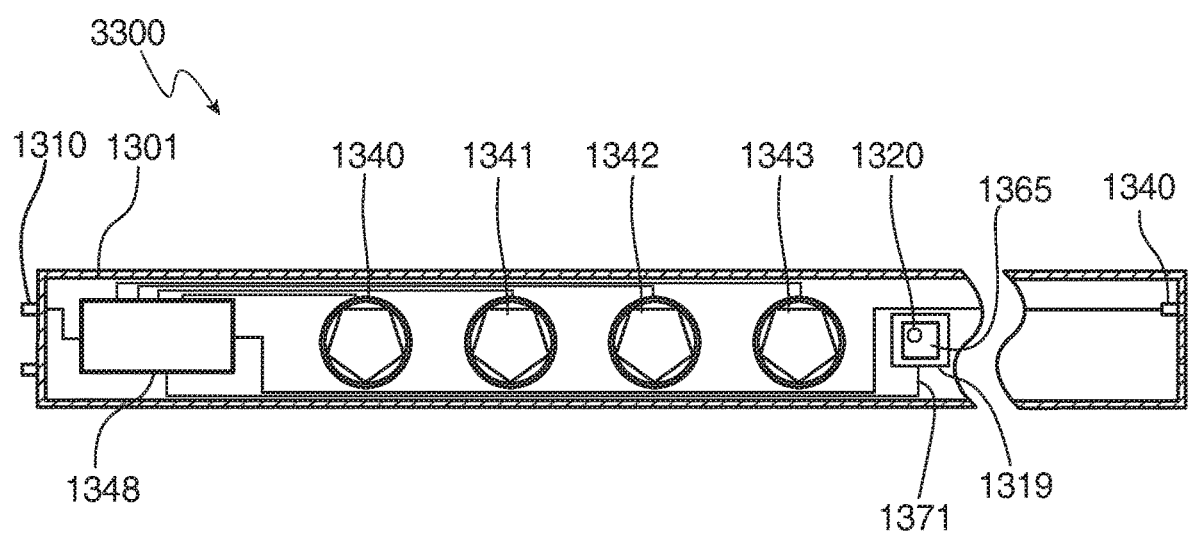
FIG. 33 is a side sectional fractional view in elevation of a cartridge assembly.

FIG. 31 depicts cartridge assembly 3100 that includes a control switch 1301 which can be used to slide the pin members into or out of the panel to lock the cartridges into place. In embodiments, a control value is manually manipulated to selectively open and close the values 1340, 1341, 1342 and 1343. In further contemplated embodiments, valves may be opened and closed using a sliding planar sheet that covers the passage. In yet further embodiment the cartridge may use a motorized screw gear that may be controlled by a rotating handle at the top of the panel attached to an extended threaded rod and the rotational movement of the rod is translated to rectilinear motion. In yet a further embodiment the cartridge may use a servo-motor that may be connected to the iris valve selector arm by a connecting rod. In embodiments, on the ends of the cartridge are spring biased contact pins such as pin 1310 that is designed to engage the lateral interior side surfaces of forward or rearward panel members. As seen in FIG. 33, sensor 1391 is designed to detect the presence of an adjacent server. In an embodiment, the sensor includes is an infrared light 1320 and photo detector 1356 wherein light is reflected from a reflective surface provided on the server can be detected. When the server is present opposite the detector infrared light is reflected off of a surface on the server and impinges on the photo detector. The photo detector then sends a signal via wire 1371 to controller 1348 which in turn can provide a signal to open the valves, such as valve 1340, on the cartridge opposite the sever and allow air to flow.

In yet further contemplated embodiments the sensor can communicate with the server transmitted by the server, such as a signal containing information relating to the internal temperature of the server components. This signal is transmitted to the controller and may be further related to the processor associated with a server rack. The server rack processor received data from the various servers and the status of the valves that are associated with the cartridges. As discussed below the processor may be configured to communicate with a remote computer that may include a display that allows for remote monitoring and control by an administrator and alerts that provide information that relates to the status of the respective servers. Such communication may employ an Ethernet connection, USB connection, other cabling, or using wireless technology.

As best seen in FIG. 33, pin 1310 is also connected to the controller 1348 which can bring power and control signals from an external source. Contact member 1340 is on the opposite end of the cartridge 3300 from pin 1310. Contact member 1340 engages its adjacent side panel in order to complete a power circuit. The contact surfaces along the side surface and top interior surfaces are made of an elastomeric material and, when the cartridges are in an engaged position with the panel, an air tight seal is established wherein a cavity formed in the panel behind the cartridges can be pressurized.

Controller 1348 is attached to valves 1340, 1341, 1342, and 1343. In an embodiment, sensor 1319 includes an infrared light source and photo detector and will send a signal to the controlled reflecting the presence of absence of a server opposite the sensor. If a server is present, the valves will be opened. If no server is detected opposite the sensor, the valves remain closed.

Figure 34:
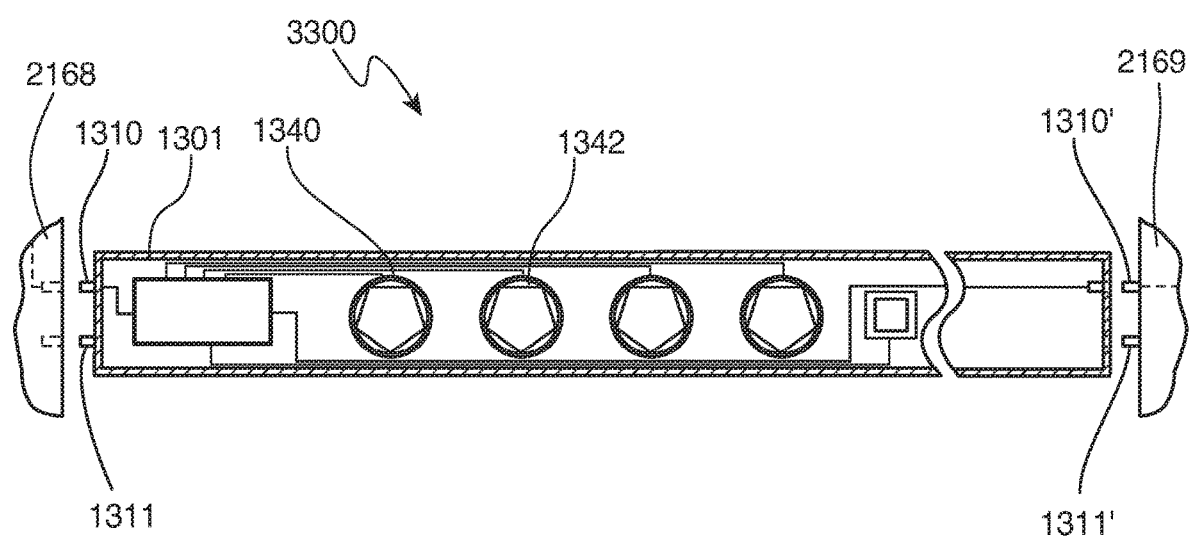
FIG. 34 is side sectional fractional view of a cartridge according to an embodiment of the invention.

Now referring to FIG. 34, cartridge 3300 is shown opposite side members 2168 and 2169.

Figure 34B:
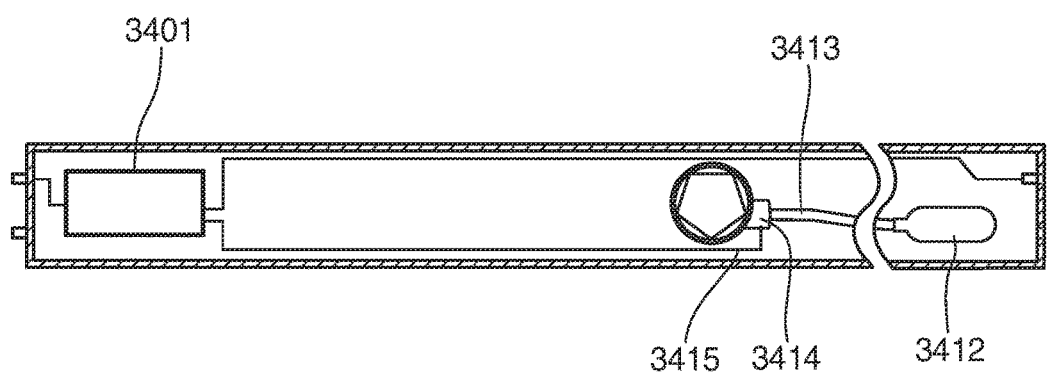
FIG. 34B is side sectional fractional view of a cartridge according to a further embodiment of the invention.

FIG. 34B depicts a further embodiment wherein the cartridge includes a reservoir 3412 (not shown to scale) which contains an inert gas under pressure that can be used for fire suppression. Reservoir 3412 is connected to a valve 3414 by tubular passage 3413. Valve 3414 controls the regulation of the inert gas into one of the passageways through cartridge 3400. Valve 3414 is controlled by controller 3401 and, in embodiments, a temperature control sensor in communication with the central controller can send a signal indicative of temperature. The central controller is programmed to send a signal to local controller 3401 over wire 3415 when the temperature within a server has rapidly increased thereby reflecting a possible fire event.

Figure 35:
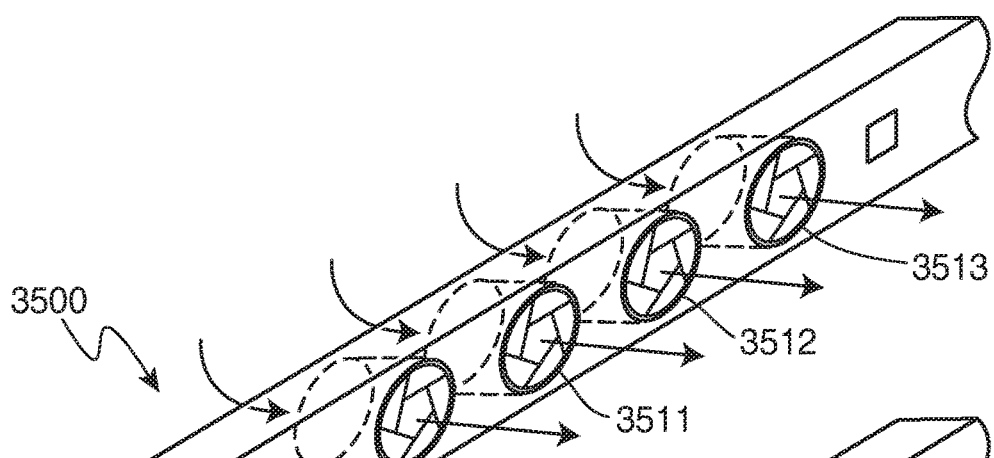
FIG. 35 is a perspective partial view of a cartridge according to an embodiment of the invention.
Figure 36:
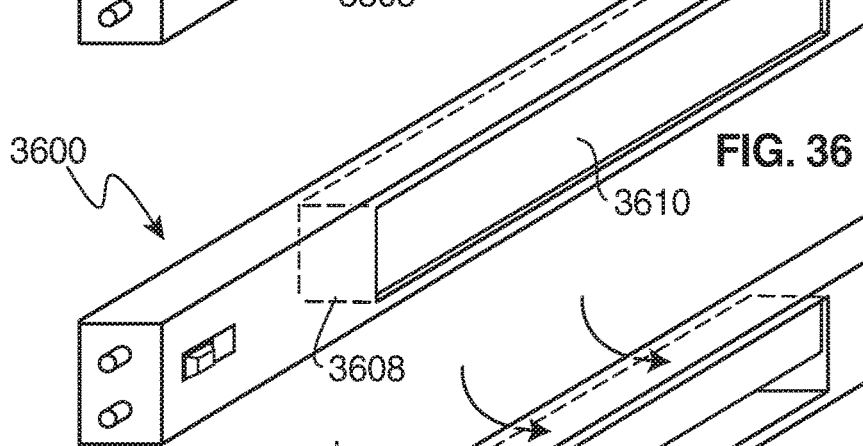
FIG. 36 is a perspective partial view of a cartridge according to an embodiment of the invention depicting a central channel impeded by a block member.
Figure 37:
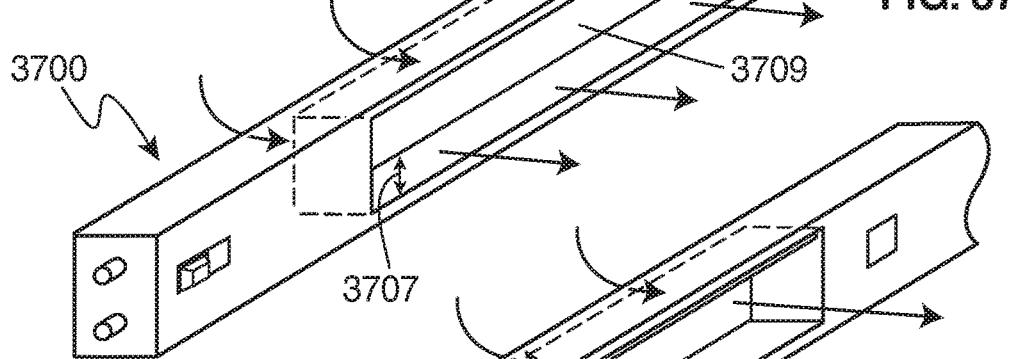
FIG. 37 is a perspective partial view of a cartridge according to a further embodiment of the invention with a central channel that is partially impeded by an adjustable shutter and that schematically depicts air flow through the device.
Figure 38:
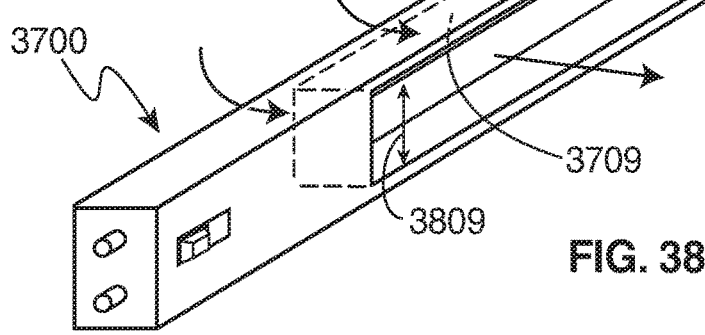
FIG. 38 is perspective partial view of a cartridge according to the embodiment depicted in FIG. 36 that schematically depicts air flow through the device.

FIG. 35 depicts air flow through an exemplary cartridge 3500 that includes valves 3505, 3511, 3512, and 3513 in a partially-opened position. As shown in FIG. 36 an alternative embodiment of the cartridge 3600 depicts cavity 3608 that may receive removable insert 3610 that functions to block airflow through the cartridge. In a further embodiment, depicted in FIG. 37 and cartridge 3700, a movable flap 3709 is provided to regulate air flow. As depicted the shutter 3709 or shutter is mounted for pivotal movement and only allows flow through gap 3707. In embodiments shutter is 3709 is incrementally opened using a stepper motor that can incrementally adjust the position of the shutter and correspondingly incrementally adjust the size of the opening. In other embodiments the shutter can be manually adjusted. It is contemplated that this cartridge design may be used with a server that has corresponding rectangular passages on the lateral sidewall (not shown). Referring to FIG. 38, the shutter is depicted in a fully opened position and the gap or opening is defined by space 3809. In this position the air flow through the cartridge is maximized.

Figure 39:
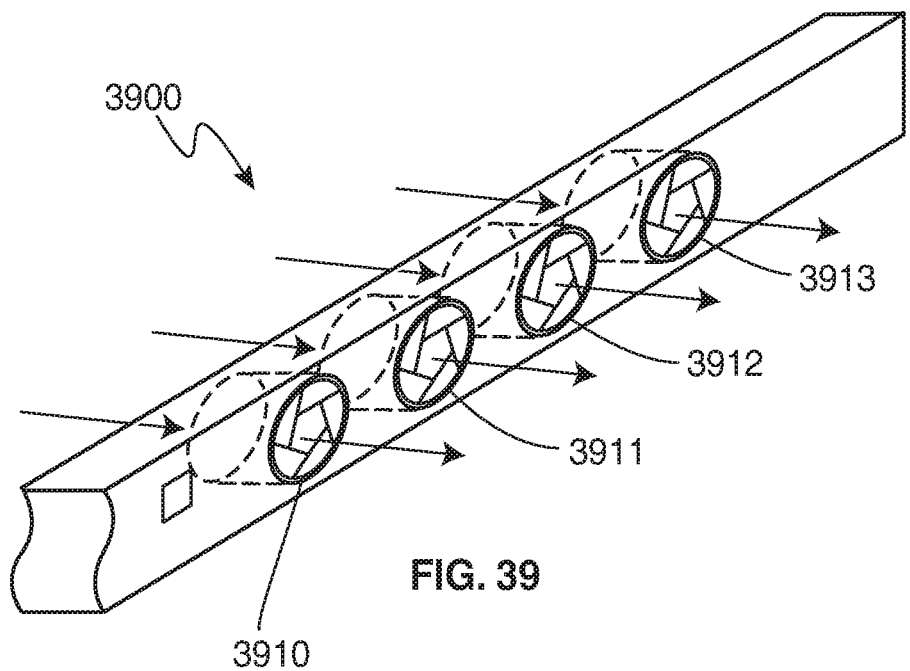
FIG. 39 is a perspective partial view of an alternative cartridge according to a further embodiment of the invention with iris valves in partially open position that schematically depicts air flow through the device.
Figure 40:
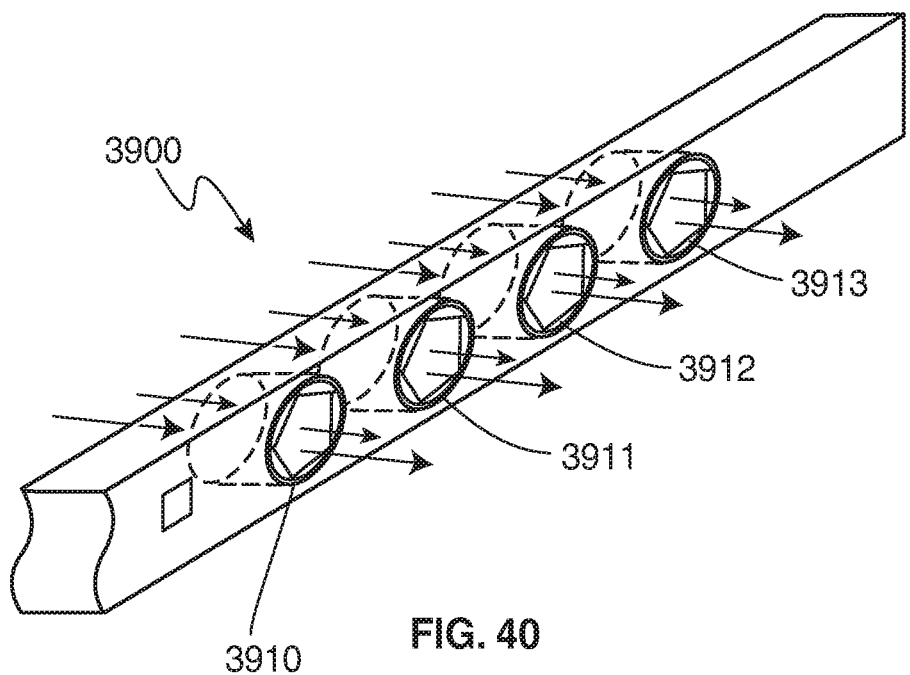
FIG. 40 is a perspective partial view of a cartridge according to the embodiment depicted in FIG. 39 with iris valves in fully open position and that schematically depicts air flow through the device.

FIG. 39 illustrates a fractional view of a cartridge 3900 having a series of valves 3910, 3911, 3912, and 3913 in a partially open position and depicts the direction of airflow through the valves. FIG. 40 depicts valves 3910, 3911, 3912, and 3913 in a fully open position wherein the air flow is increased.

Figure 41:
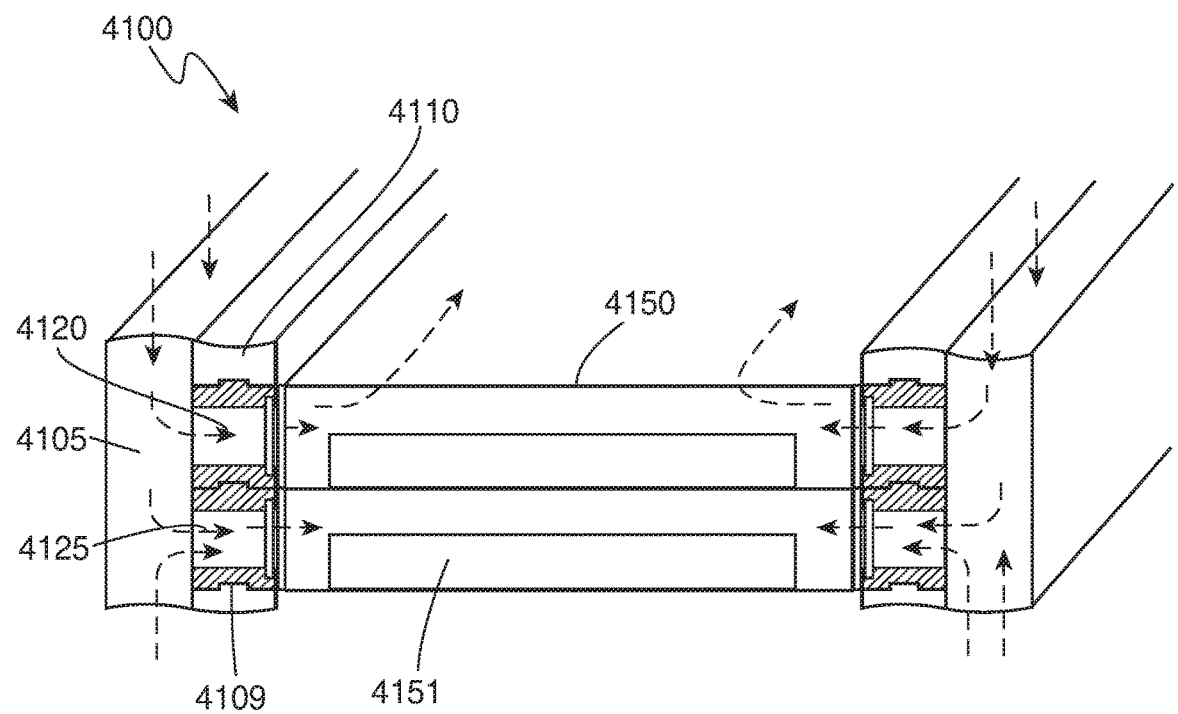
FIG. 41 is a perspective fractional front view of side panel members and servers that schematically depicts air flow through the device.
Figure 42:
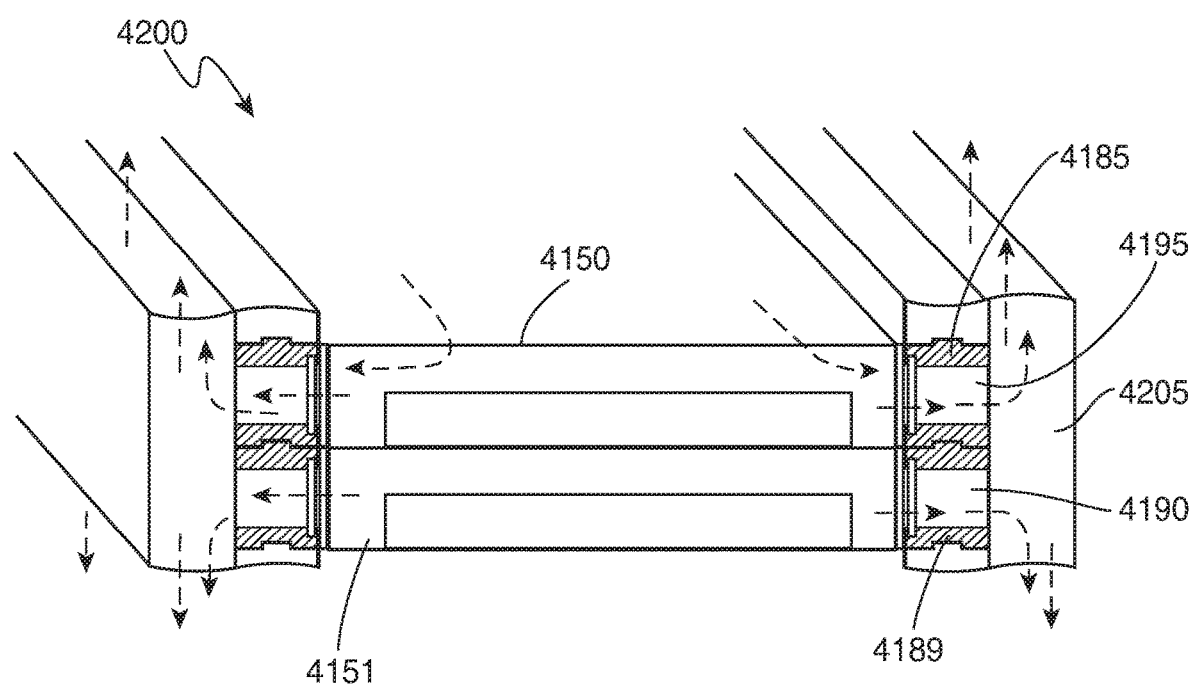
FIG. 42 is a perspective fractional rear view of side panel members and servers that schematically depicts air flow through the device.

FIG. 41 is a sectional view of a front section of a rack system and server depicting air flow first into the received cavity section 4105 of panel 4100 from both the lower and upper directions. Air flows into passage 4120, through a rail section (not shown) and into server 4150. Another flow path that is illustrated travels from the panel cavity 4105 through passage 4125 that is provided through cartridge 4109. Air introduced in the front of servers 4150 and 4151 cools components within the servers and flows rearward. As shown in FIG. 42, air flows from the front of server 4150 passes through passage 4195 that is provided though cartridge 4185 and into panel cavity section 4205. From the rear cavity 4205 the air flows either upwardly or downwardly to the passages in the top and bottom of the rearward side panel section.

Figure 43:
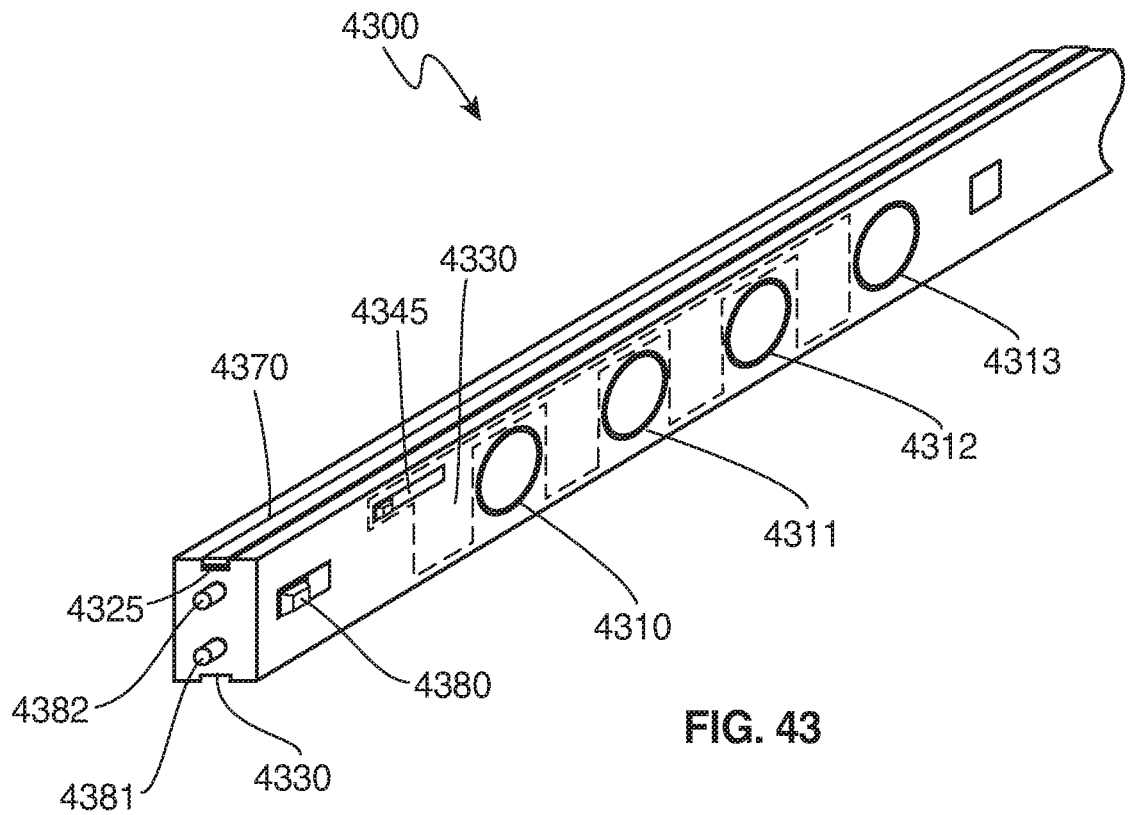
FIG. 43 is a perspective partial view of a cartridge according to a further embodiment of the invention with a series of circular passages.
Figure 43A:
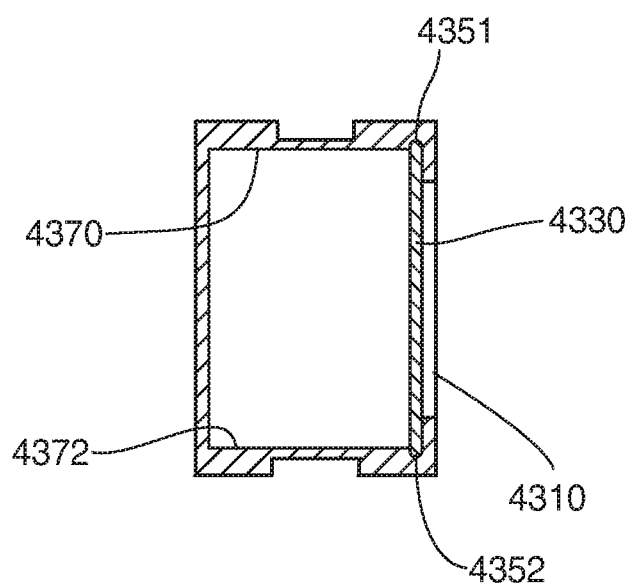
FIG. 43A is a side sectional view of the cartridge embodiment depicted in FIG. 43 without the top seal member.

FIG. 43 depicts an embodiment of a cartridge member 4300 having a plurality of passages 4310, 4311, 4312, and 4313 depicted in an open position. In this embodiment there is a sealing member 4370 received in a groove 4325 provided along the top surface of the cartridge member 4300. Sealing member 4370 designed to engage the bottom surface of an adjacent cartridge or a top horizontal member of a panel and form an air tight seal. Sealing member 4370 can be raised and lowered via a mechanical connection with member 4380. When member 4380 is in the retracted position, pins 4381 and 4382 will be retracted along with seal 4370 being lowered. When member 4380 is in the engaged position, pins 4381 and 4382 will be moved forward and seal 4370 will be in the raised position. The bottom of the cartridge is also provided with a lower groove 4330 that can be received the top of a cartridge positioned under cartridge 4300. In this embodiment a flat blocking member 4330 is provided within the cartridge 4300 which can be controlled by engagement of member 4345 to laterally slide the member to block the passages and thereby impede the flow of air through the cartridge. In this embodiment pin 4381 and pin 4382 are spring biased and can be retracted by sliding control lever 4380 in a lateral direction. Upon release of the lever, the pins may be received in opposite openings provided on the side panel members to retain the cartridge members in place. In FIG. 43A, blocking member 4330 is depicted retained within opposite grooves 4351 and 4352 provided in the interior top surface 4370 and bottom interior surface 4372 of the cartridge 4300 and engaged to allow for movement within the grooves.

Figure 43B:
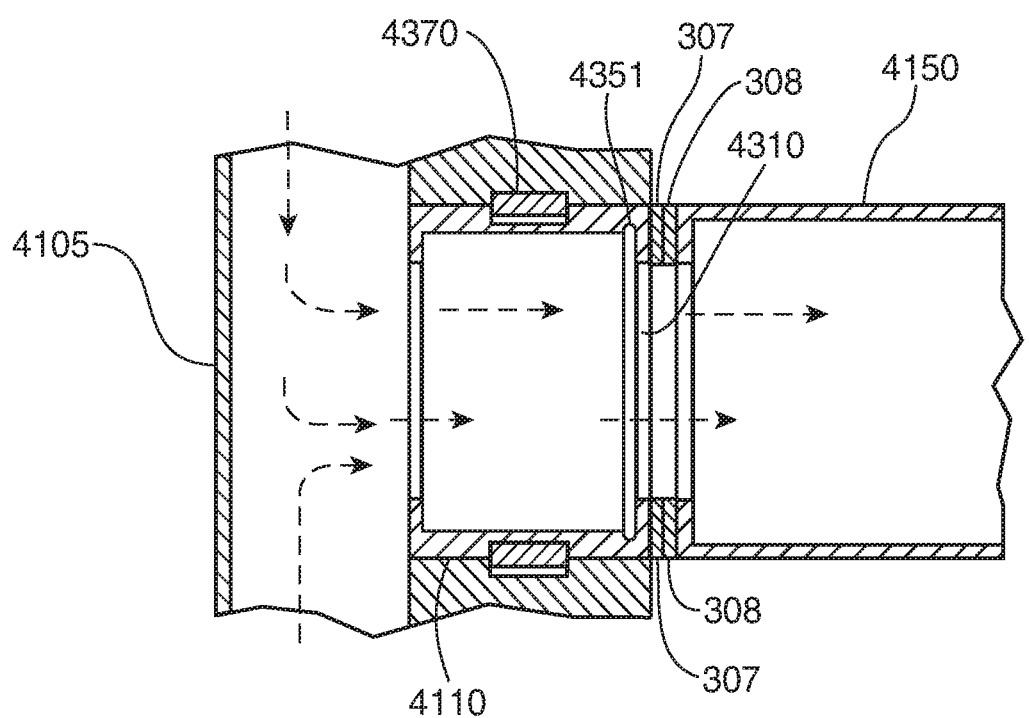
FIG. 43B is a sectional view of a forward panel, a cartridge rail and server that illustrates the direction of airflow through the elements.

FIG. 43B depicts a sectional view of an assembly that includes the planar sheet member 4105 that defines a void region through which air flows into the rear of a cartridge 4110. The cartridge includes a top sealing member 4370 that is comprised of a resilient material which is provided to assist with forming a seal with an adjacent cartridge. The air flow is interfered by member 4351 which will slide to open and close a passage 4310 that allows air flow to server 4150. The rail member is depicted as two part member 307 and 308 through which is provided with a passage to allow for air flow from cartridge 4110 to server 4150.

Figure 43C:
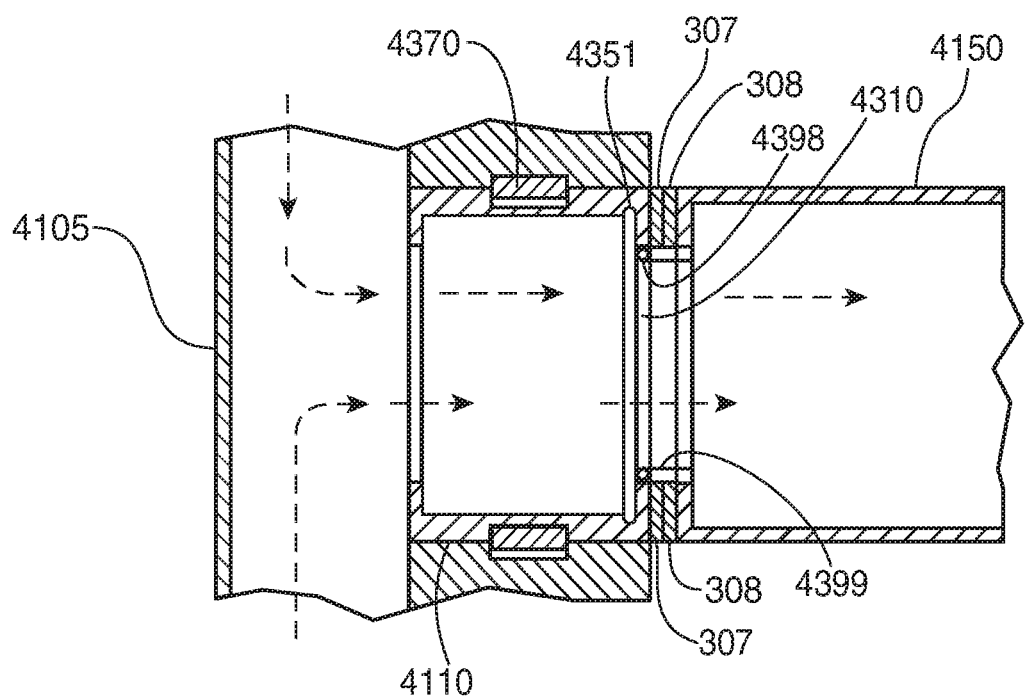
FIG. 43C is a sectional view of a forward panel, a cartridge, a rail and server that illustrates the direction of airflow through the elements according to a further embodiment of the invention.

FIG. 43C depicts a further embodiment that include annular seal ring member 4398. In this embodiment an annular fabric shroud will axially extend from the annular ring 4399 provided at the junction of air passages and, in response to air flow, shroud 4399 is radially displaced to seal the junction between the components. As such when air flows, the shroud fills the gap between the cartridge, rail, and server.

Figure 43D:
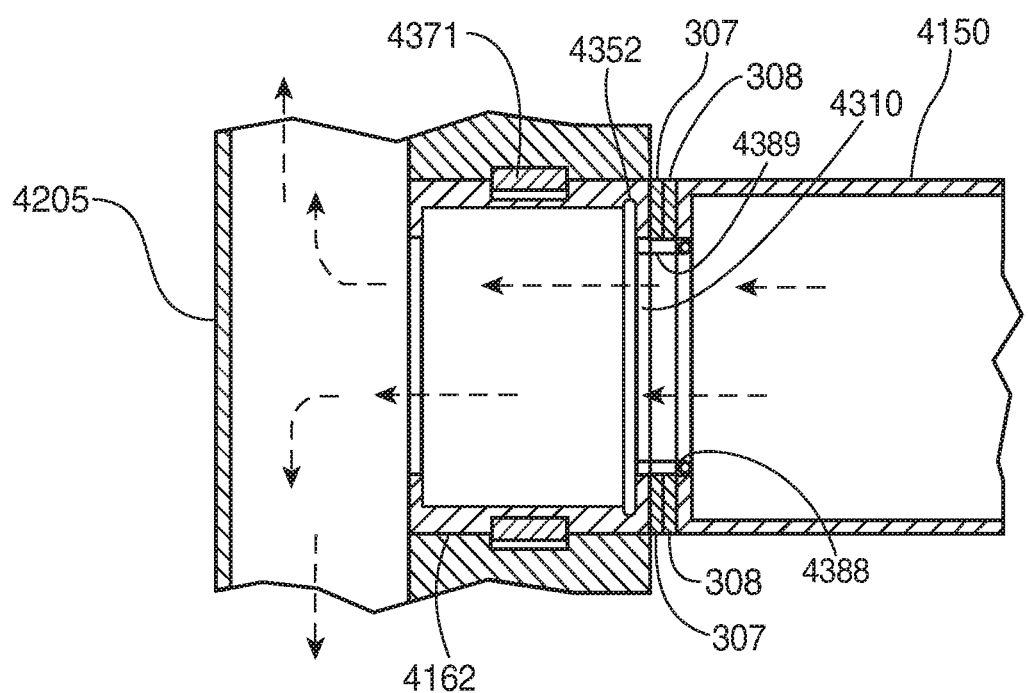
FIG. 43D is a sectional view of a rearward panel, a cartridge, a rail and server that illustrates the direction of airflow through the elements according to an embodiment of the invention.

FIG. 43D schematically depicts air flow from server 4150 to a rear panel. Like the embodiment depicted in FIG. 43C, the embodiment includes annular seal member 3488 and shroud member 4389 that, in response to air flow is displaced to minimize the air loss through the interface between server 4150, rail members 307 and 308 and cartridge 4162.

Figure 44:
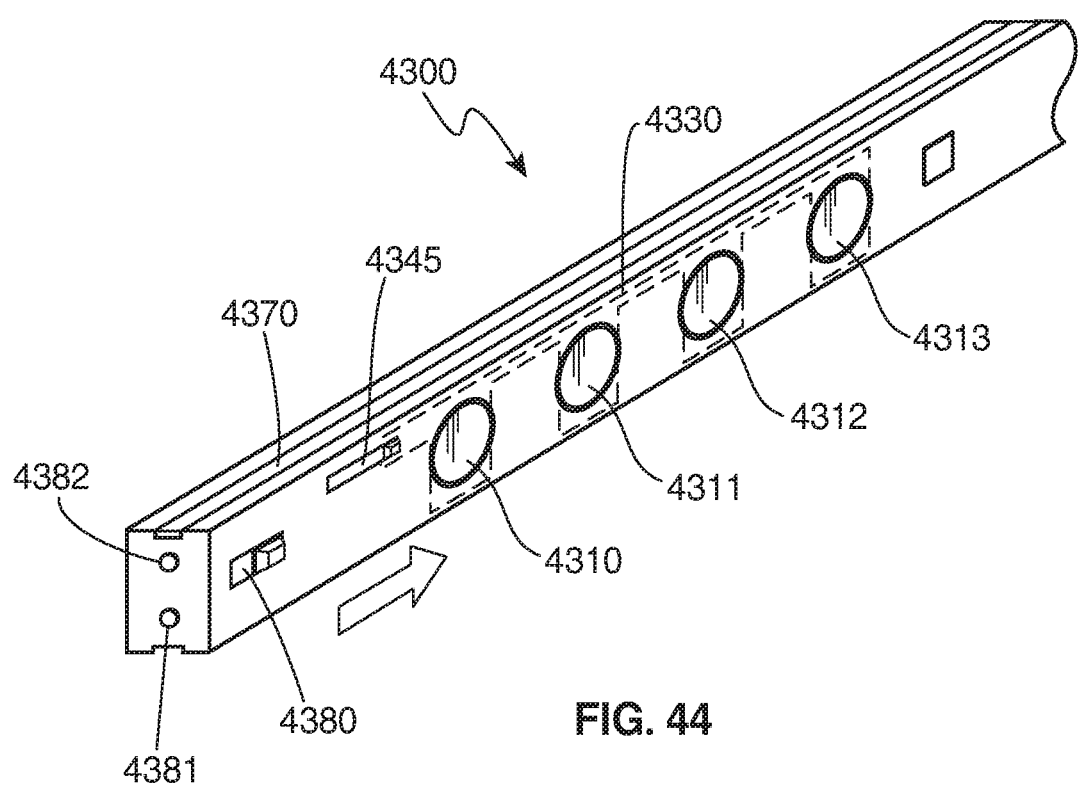
FIG. 44 is a perspective partial view of a cartridge according to the embodiment of 43 with the passages obstructed.
Figure 45:
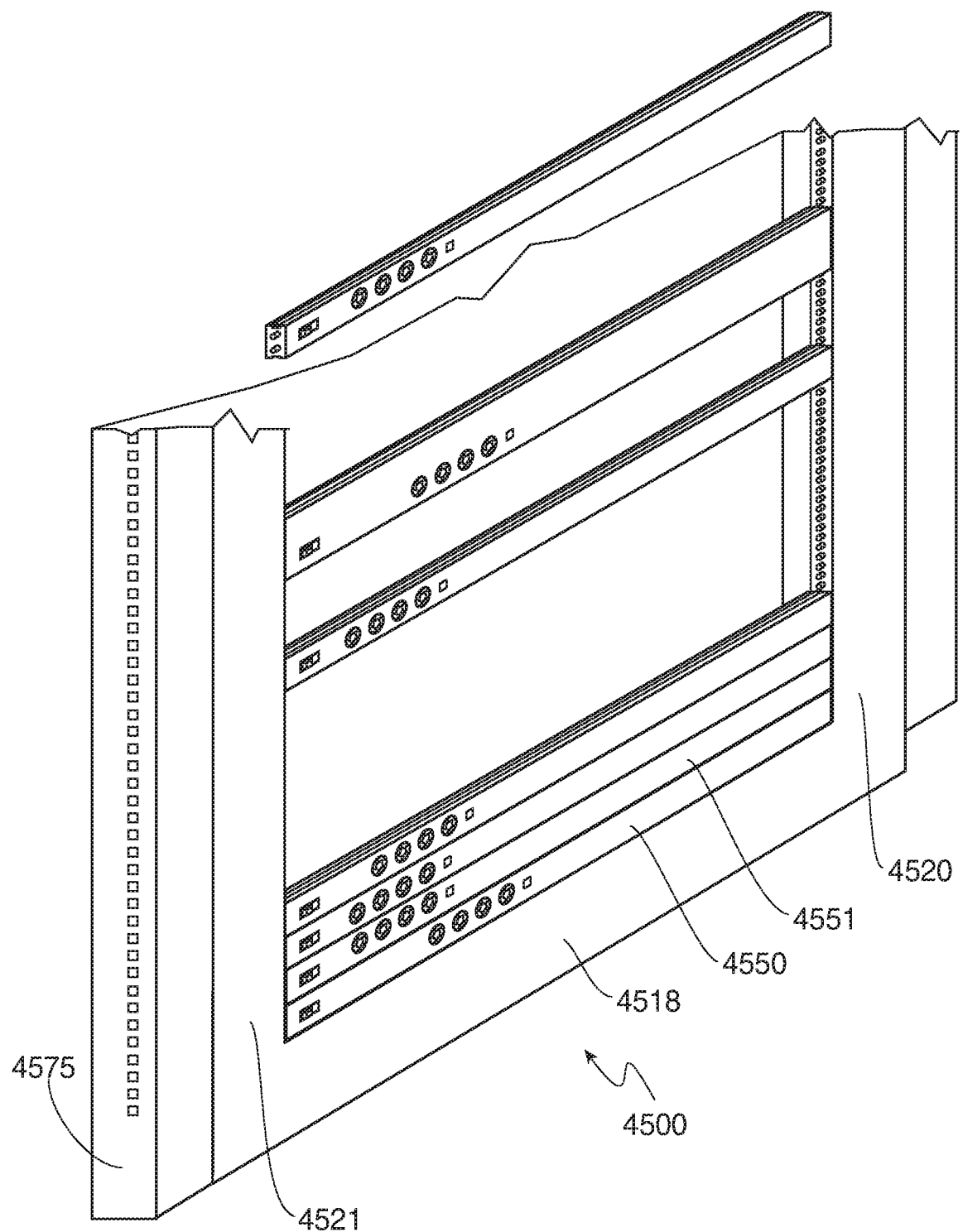
FIG. 45 is a perspective fractional view of a forward side panel depicting a plurality of different cartridges.

FIG. 44 depicts cartridge 4300 wherein the blocking member 4330 has been moved to close the passages 4310, 4311, 4312, and 4313 and the pins 4381 and 4382 are depicted in a retracted position. In embodiments, the seal is mechanically lifted by rotation of a cam member that alternatively lowers and raises a seal member such as seal member 4370. In yet alternative embodiments, the resilient member is spring biased and can be displaced downwardly upon assembly. In yet further embodiments, a mechanical switch is provided that lifts and mechanically locks the resilient member by lateral movement of a switch extension that is accessible through an L shaped opening. FIG. 45 illustrates a side panel assembly 4500 including a plurality of cartridges such as cartridges 4550 and 4551 that span upright member 4521 and upright member 4520. The rear surface of the cartridges define a front surface of an internal cavity of the panel. Adjacent to upright member 4521 is an upright front post member 4575 that is provided to support the servers and rails of the device.

Figure 46:
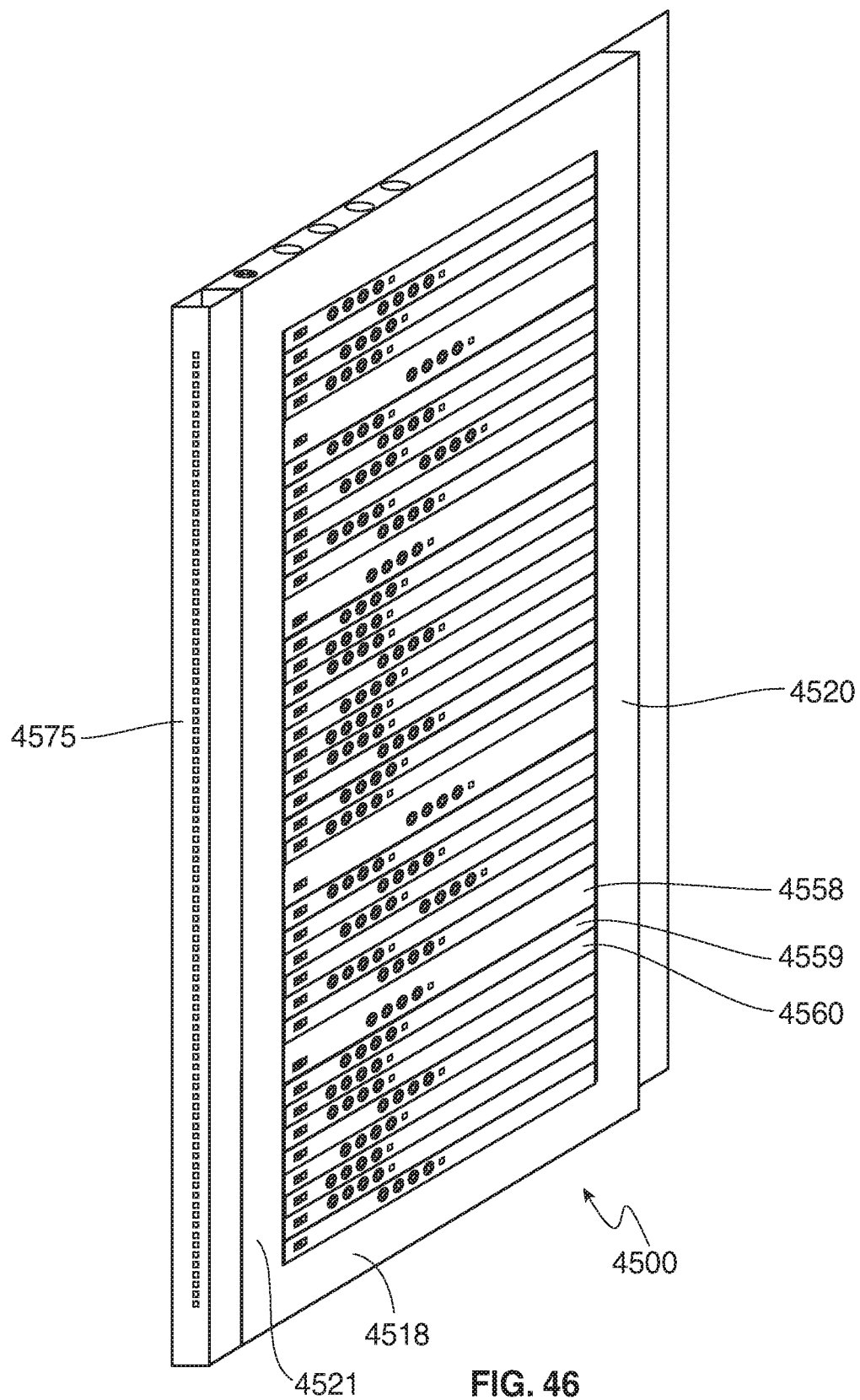
FIG. 46 is a perspective view of a forward side panel depicting a plurality of different cartridges.
Figure 47:
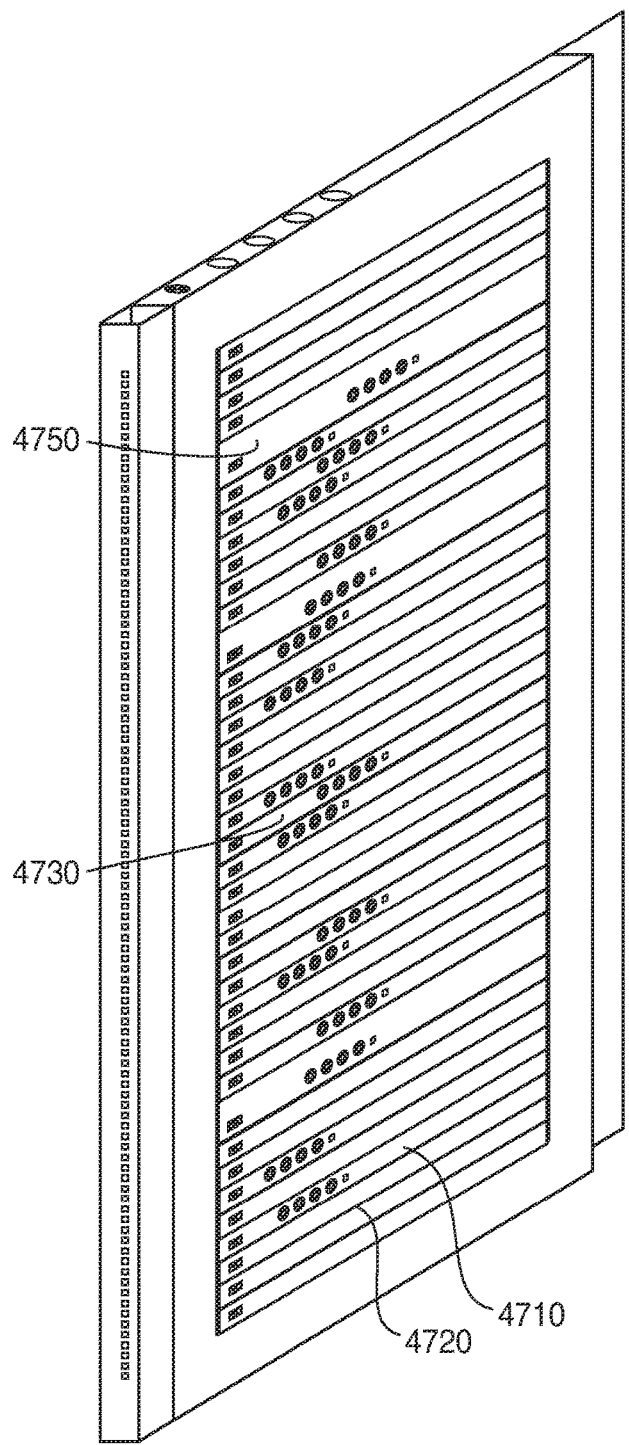
FIG. 47 is a perspective view of a forward side panel in an alternative embodiment depicting a plurality of different cartridges.
Figure 48:
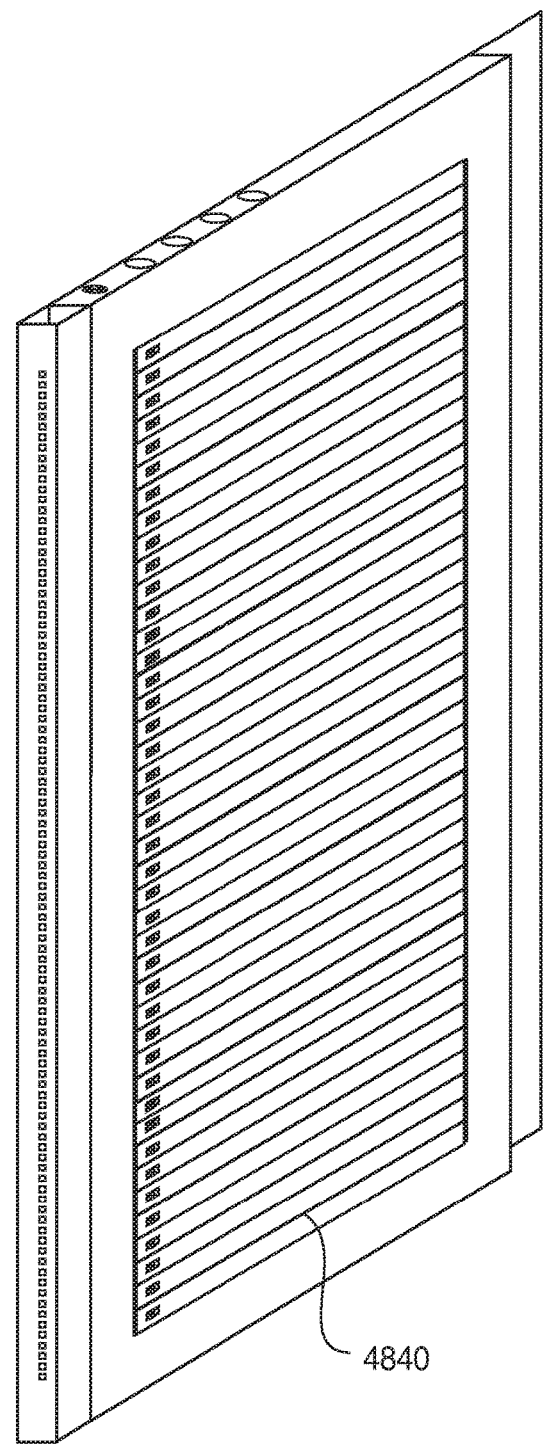
FIG. 48 is a perspective view of a forward side panel depicting a plurality of different cartridges that are all devoid of passages.

FIG. 46 depicts a completely assembled forward panel including upright front post member 4575, section and cartridges such as 4558, 4559, 4560. FIG. 47 depicts an alternative assembly that includes a number of cartridges that are devoid of valves and passages. FIG. 48 depicts a further alternative assembly where the cartridges that were selected include no valves or passages. Thus FIGS. 47 and 48 illustrate alternative configurations of cartridges that may be used with the invention. As best seen in FIG. 47, the cartridges may have different vertical dimensions to conform the vertical dimension of a server. In addition, in embodiments cartridges may have different lateral placement of the iris valves and passages to conform to the needs of differing servers and network equipment.

Figure 49:
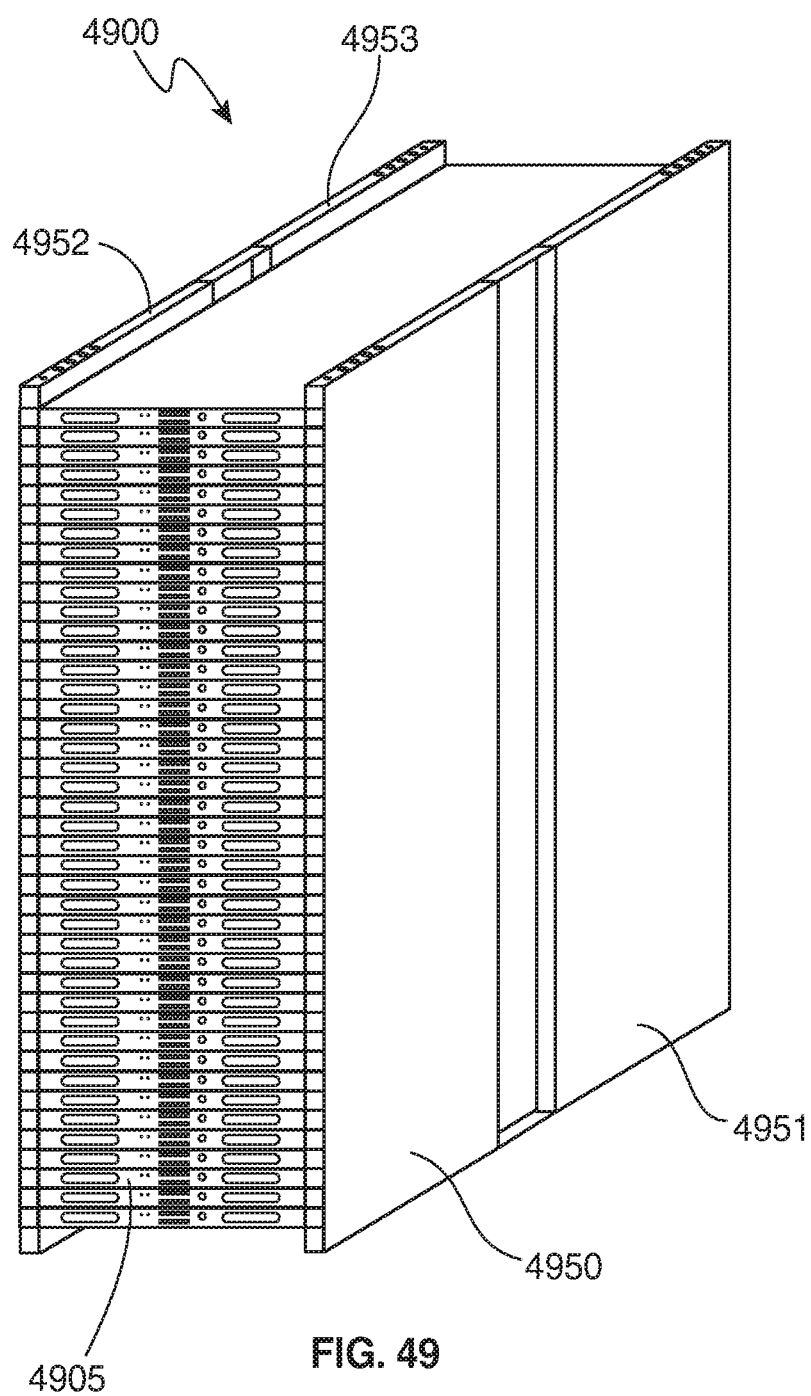
FIG. 49 is a perspective view of an embodiment of the rack according to the invention with a full complement of servers.

FIG. 49 depicts a server assembly with a full complement of single rack unit servers.

Figure 50:
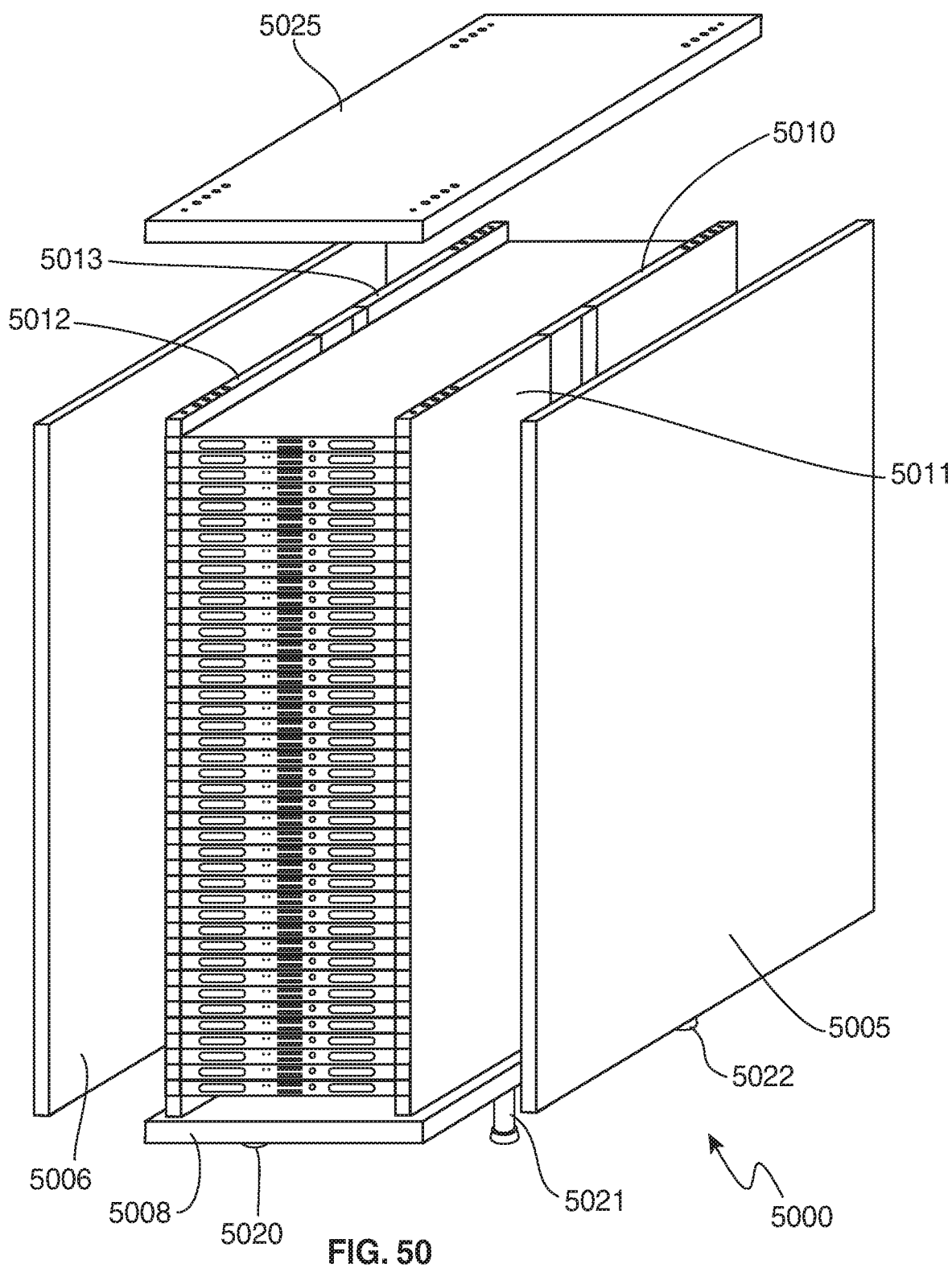
FIG. 50 is a perspective exploded view of an embodiment of the rack of the invention and depicting external paneling.

As shown in FIG. 50, the server rack assembly and servers are optionally enclosed in a cabinet 5000 that includes side exterior panels 5005 and 5006, top exterior panel 5025 and bottom exterior panel 5008. All of the quarter panels are attached to an intermediate frame to be fully supported. The entire rack is elevated from a support surface by legs 5020 or 5021 or, alternatively, on casters. The top panel is provided with passages that allow air to flow to the forward panel 5012 and rearward panel 5010 that is contained within exterior panels. Additional passages, not pictured, may be added to 5008 and 5025 for power, network cables, and other cabling.

Figure 51:
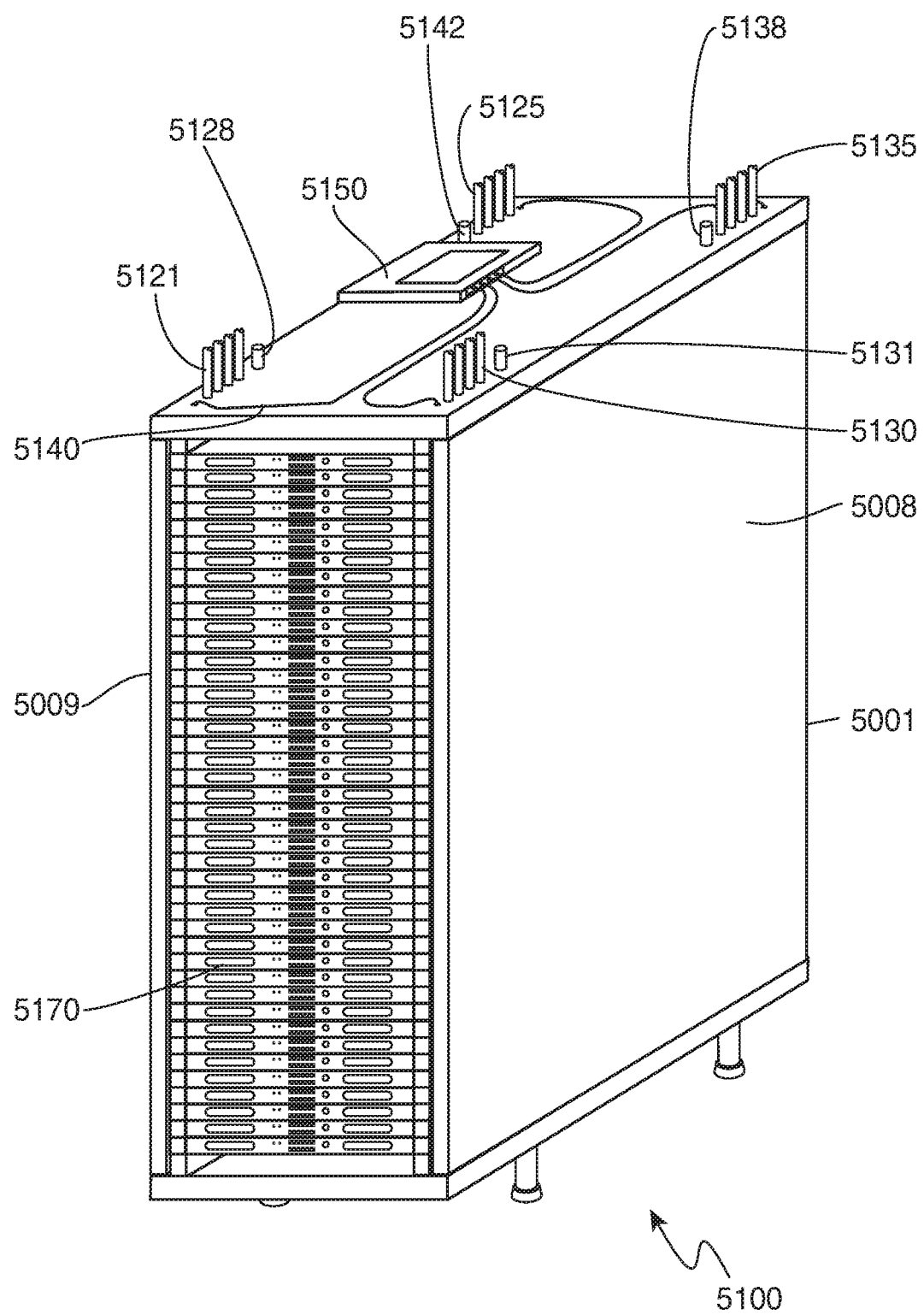
FIG. 51 is a perspective view of an embodiment of the invention depicting a controller and external paneling.

Referring now to FIG. 51, an assembled rack system 5100 includes exterior side panels 5008 and 5009 that contain the side forward panels and rearward side panels.

In embodiments, there are front and rear doors provided that can be used to close and lock the whole rack. In further embodiments, the panels used are insulated. Again referring to FIG. 51, the top of the device includes front top passages 5121 and 5130 that communicate with the forward lateral side panels. Next to the inlet passages 5121 and 5130 are pressure relief valves 5128 and 5131. When the pressure in the system exceeds a predetermined pressure, the values will release air to the atmosphere and prevent damage to components of the system. Similar pressure relief values 5138 and 5142 are located in the rear panel. On the top of the panel is a controller 5150 that is in communication with the cartridges via wires 5140.

Figure 52:
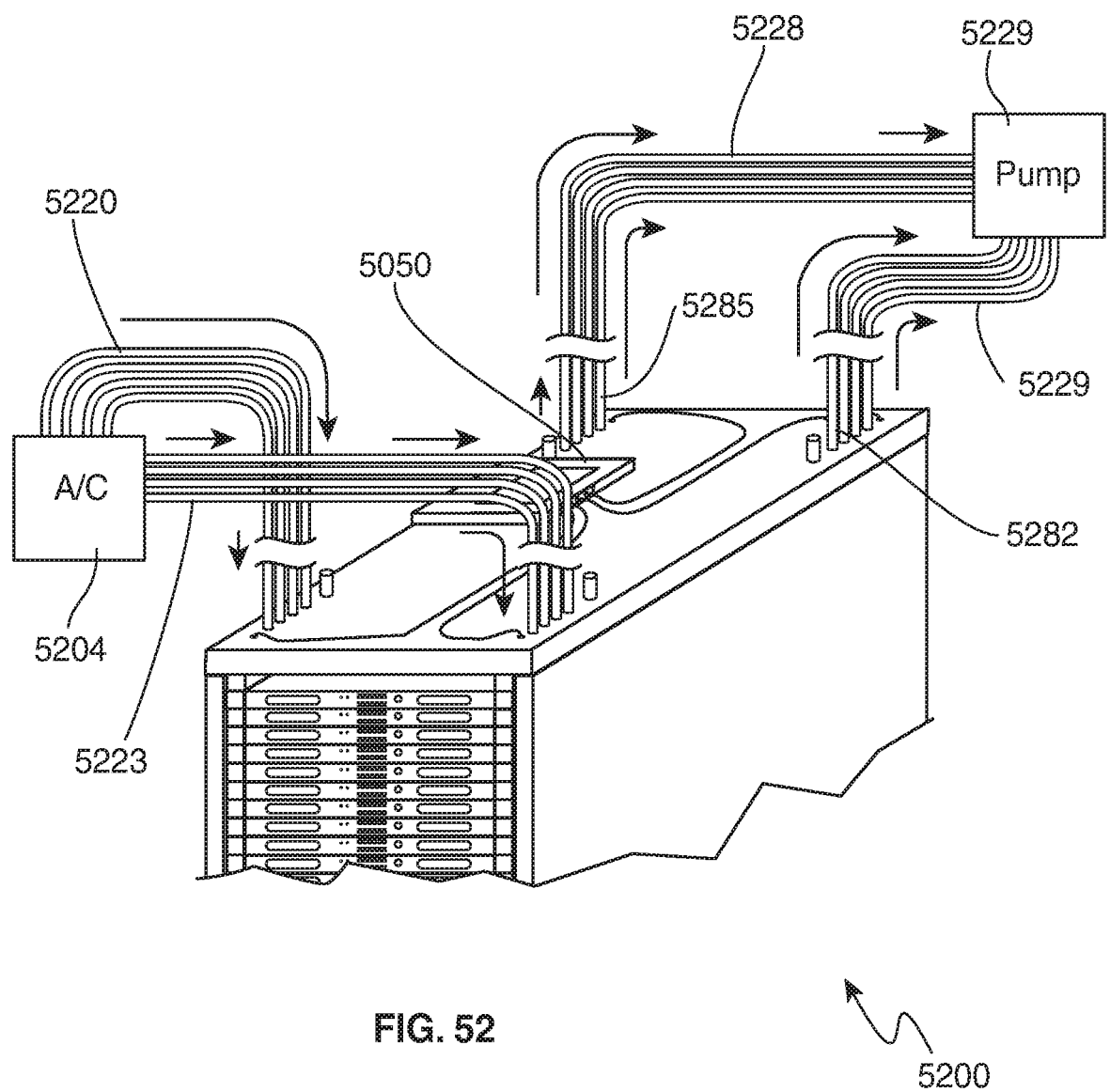
FIG. 52 is a perspective fractional top view of an embodiment of the invention with an air conditioner and air pump system with a schematic representation of an air flow system.

A top view of a rack device 5200 is depicted in FIG. 52 that includes an air conditioner 5204 that provides cool air to top inlet passages in forward panels thought conduits 5220 and 5223. Air, after it has passed through a server, flows to the rearward panels and may exit through top passages 5282 and 5285. Air exiting the panels is then directed through conduits 5228 and 5229 to pump 5229 that maintains negative pressure in the exhaust system and moves the air from the forward panels, through the servers and out to the rearward panels. Air from the pump may be transferred back to the air conditioner through passages (not shown) for recirculation through the system.

Figure 53:
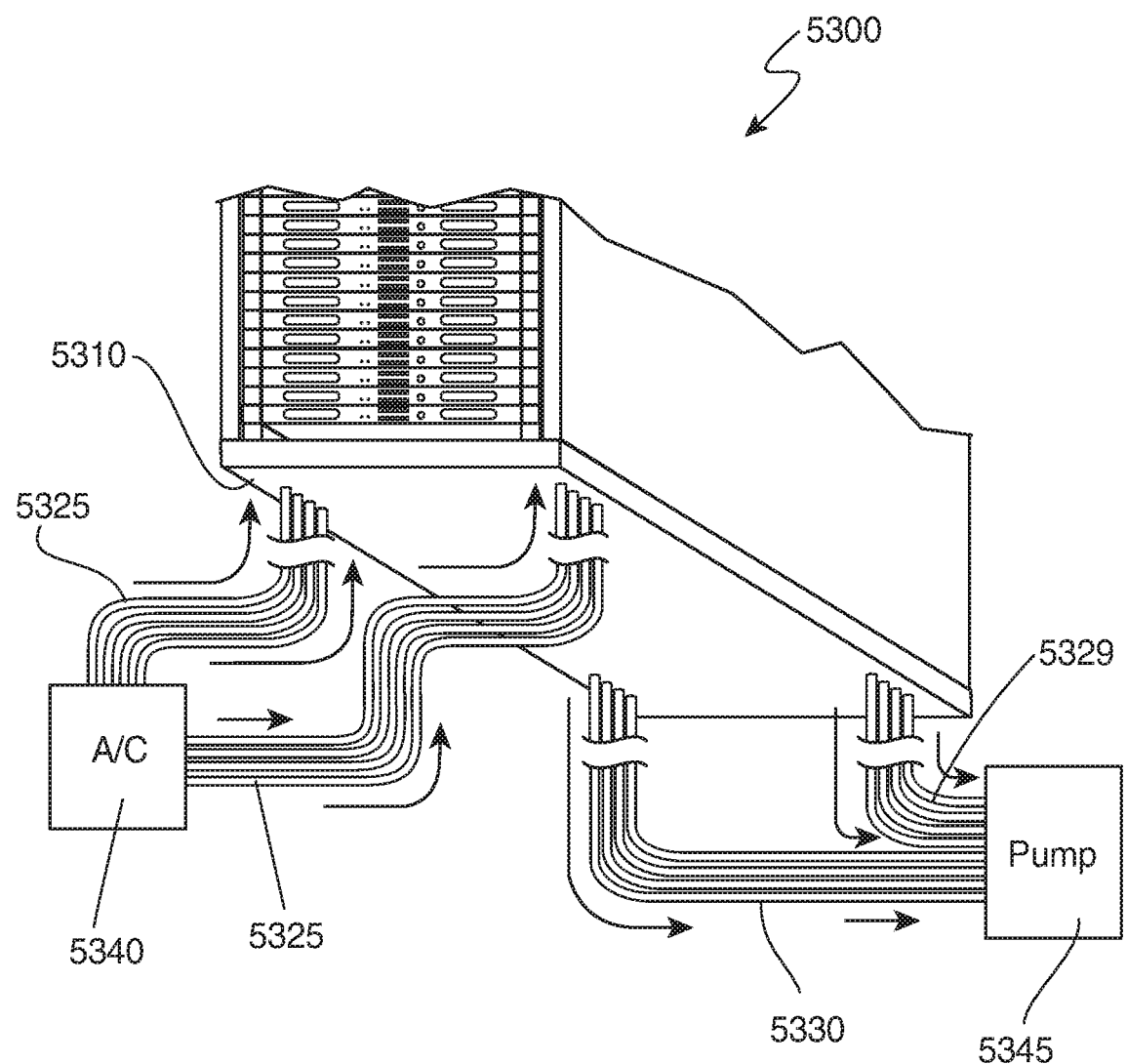
FIG. 53 is a perspective fractional bottom view of an embodiment of the invention with a schematic representation of an air flow system with an air conditioner and air pump system.

As shown in FIG. 53 the bottom surface 5310 of a rack system 5300 receives cool air from air conditioner 5340 from conduits 5325. Air is vented from the system through conduits 5329 and 5330. A pump 5345 is provided that creates and maintains negative pressure in the exhaust air flow system and may transfer air back through passages (not shown) to the air conditioner.

In embodiments, the system includes a controller and servo motor that can adjust the flow parameters depending on the temperature of the server or group of servers. In further embodiments, the system includes a control board that includes a small circuit board with an Ethernet communications port for communication with the servers, a valve controller, air conditioner, heat pump, and a remote central monitoring and control location.

Figures 54, 55:
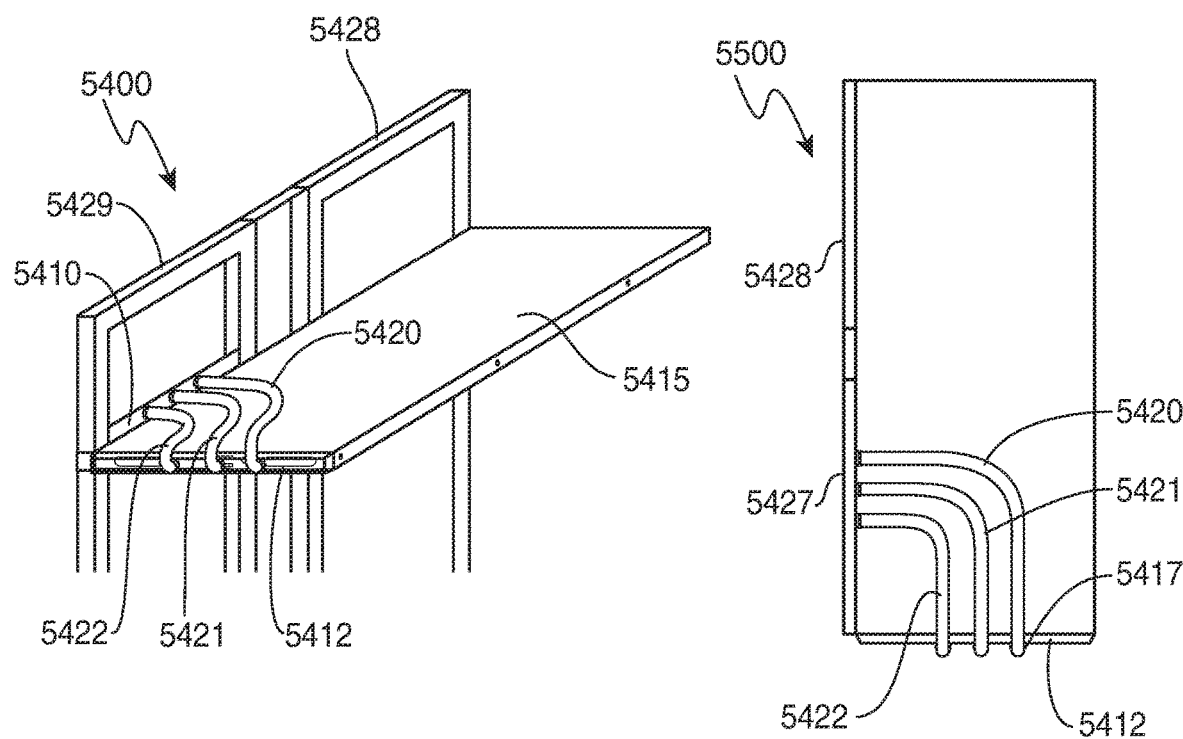
FIG. 54 is a perspective fractional front view of an embodiment of the invention wherein air is delivered from the side panel cartridge to the front of a server using a flexible hose.
FIG. 55 is a top view of the embodiment depicted in FIG. 54.

Referring now to FIG. 54, in a further embodiment 5400 air is directed from a cartridge member 5410 to openings provided in the front panel 5412 of server 5415 using flexible tubular members 5420, 5421, and 5422. The depiction includes panels 5428 and 5429 that receive the cartridges that are described herein, FIG. 55 depicts a top view of the system described above and includes the flexible tubes 5420, 5421, and 5422 that are depicted extending past the front edge of the server 5417.

Figures 56, 57:
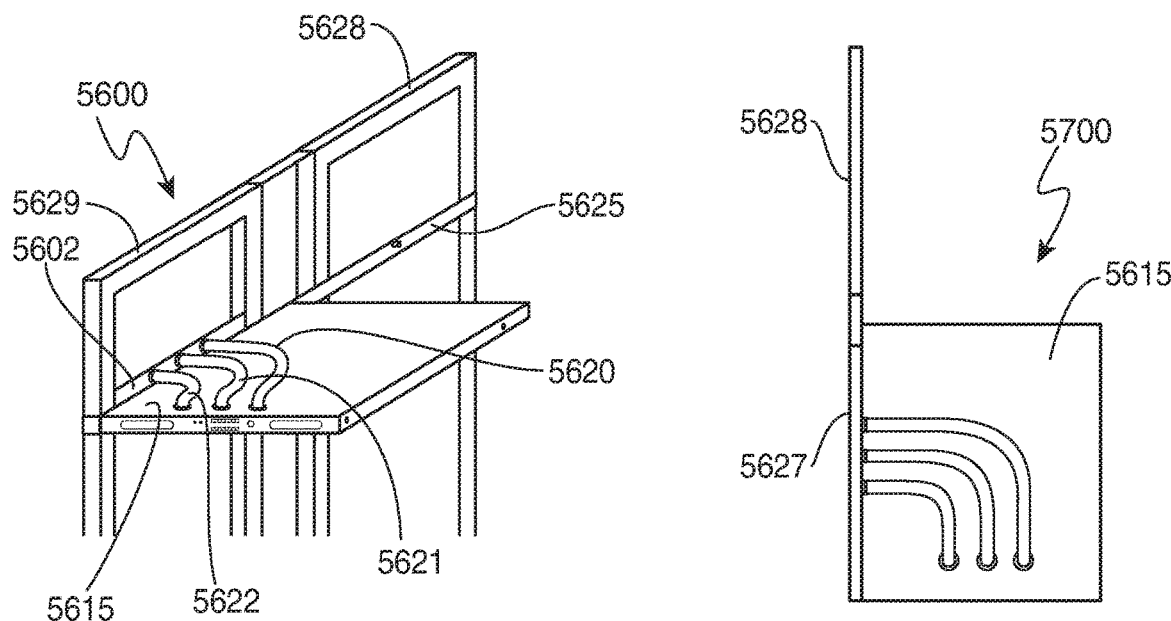
FIG. 56 is a perspective fractional front view of an embodiment of the invention wherein air is delivered from the side panel cartridge to an opening in the top of a server using a flexible hose.
FIG. 57 is a top view of the embodiment depicted in FIG. 54.
Figure 58:
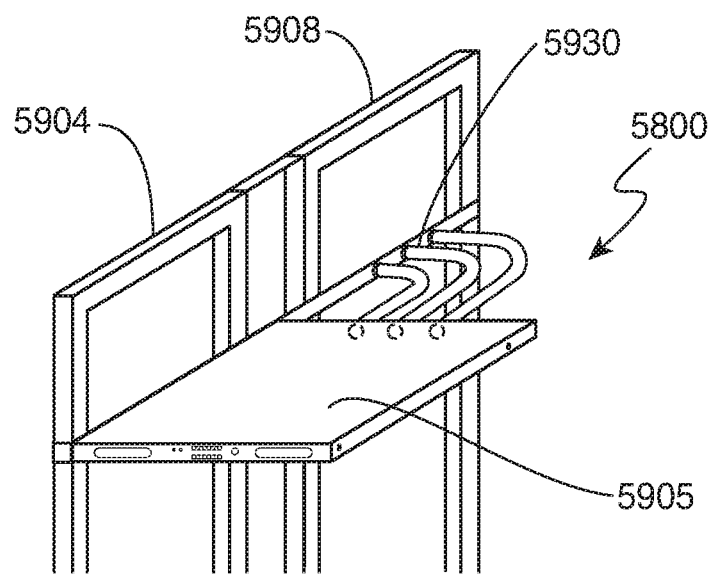
FIG. 58 is a perspective fractional front view of an embodiment of the invention wherein air is delivered from the rear of a server to a rear cartridge using a flexible hose.
Figure 59:
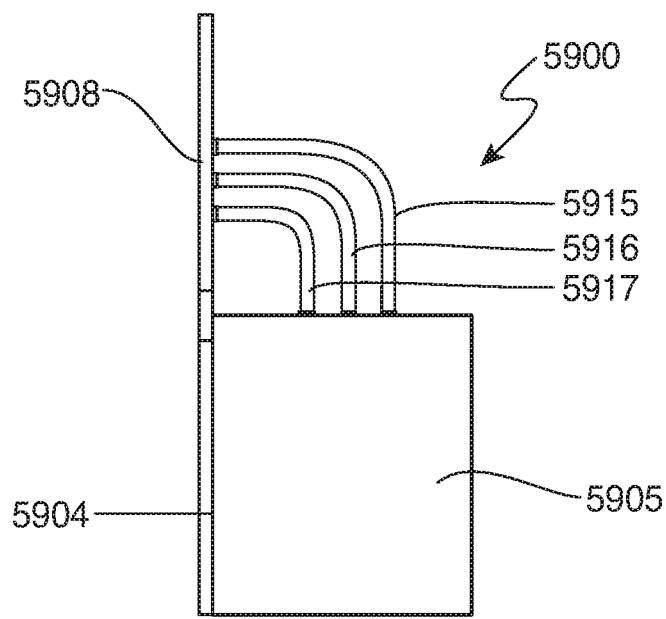
FIG. 59 is a top view of the embodiment depicted in FIG. 58

In another embodiment of the invention that is depicted in FIG. 56, air is distributed from cartridge member 5602 through flexible tubular members 5620, 5621, and 5622 to openings on the top of a server 5615. In this embodiment, server 5615 only extends one half the distance of the server rack. FIG. 57, a top view of the embodiment depicted in FIG. 56, shows conduits that extend from the lateral panel 5627 to the top of server 5615. Now referring to FIG. 58, a further aspect of the invention is depicted wherein air is removed or vented from the rear of server 5905 using flexible hoses or tubular members to cartridge 5930 in rear panel 5908. As seen in FIG. 59, the air is directed from server 5905 to the rear panel section 5908 using tubular members 5917, 5916 and 5915.

Figure 60:
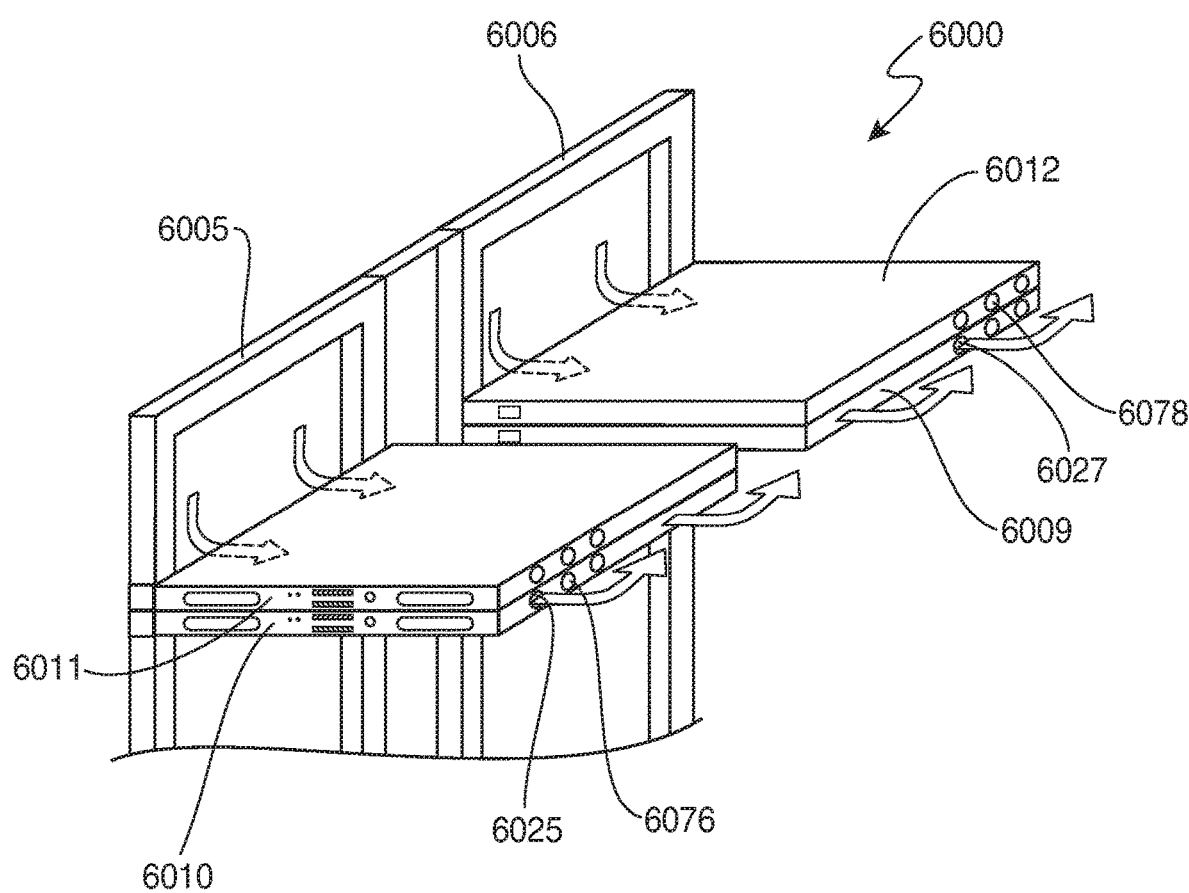
FIG. 60 is a perspective view of a further embodiment that uses two servers in a single rack unit and an alternative air flow configuration.

FIG. 60 depicts a schematic representation of an alternative air flow arrangement in a further embodiment of the invention. In this embodiment servers 6011 and 6012 are attached to the same vertical location that is in turn attached to the front side panel 6005 and rear side panel 6006. Also shown are servers 6010 and 6009 that are also attached to the front side panel opposite 6005 and rear side panel opposite 6006 using conventional a rack mount hardware. Air from cartridges provided in the front panel 6005 and rear panel 6006 flows laterally into the servers 6009, 6010, 6011, and 6012 and exits the servers through openings such as openings 6025, 6076, 6027 and 6078. The openings are on the opposite sides of the servers and passages on cartridges (not shown) provided on lateral panels (not shown) that are opposite panels 6005 and 6006 and which receive from the servers and distribute the air out of the panels.

Figure 61:
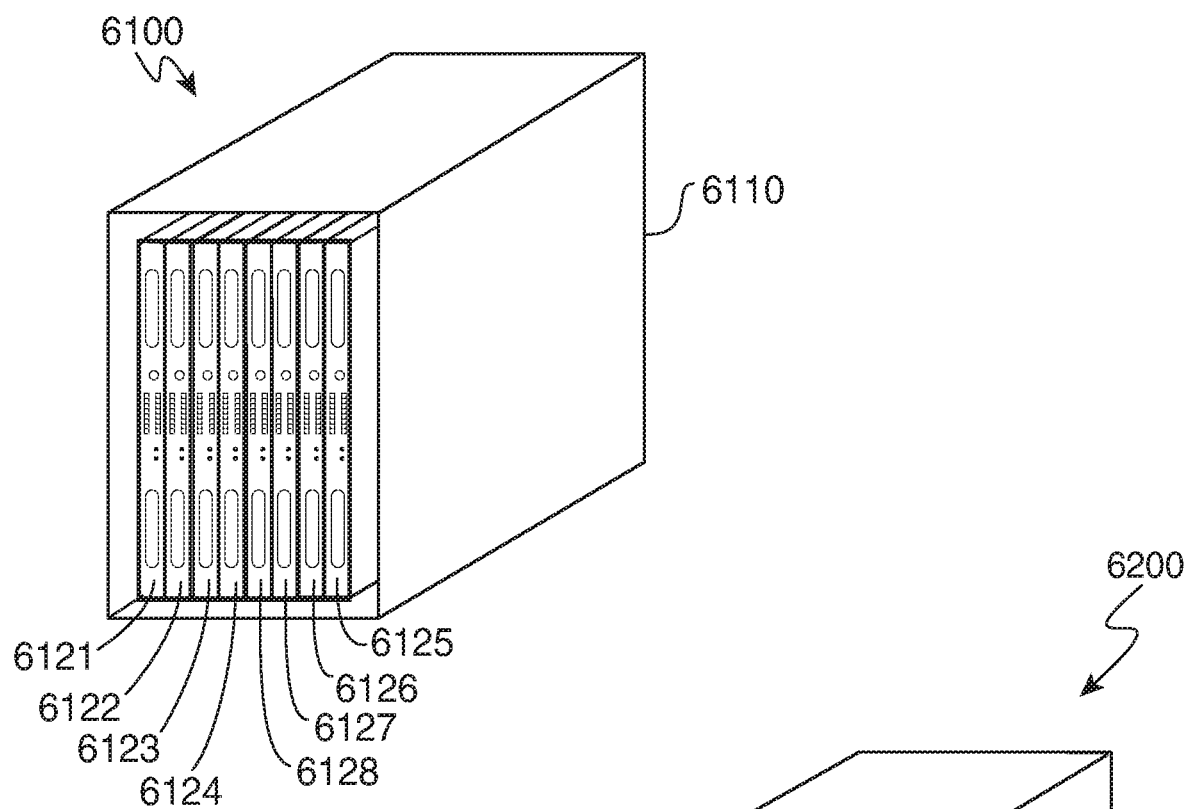
FIG. 61 is a perspective view of a plurality of blade servers according to prior art.
Figure 62:
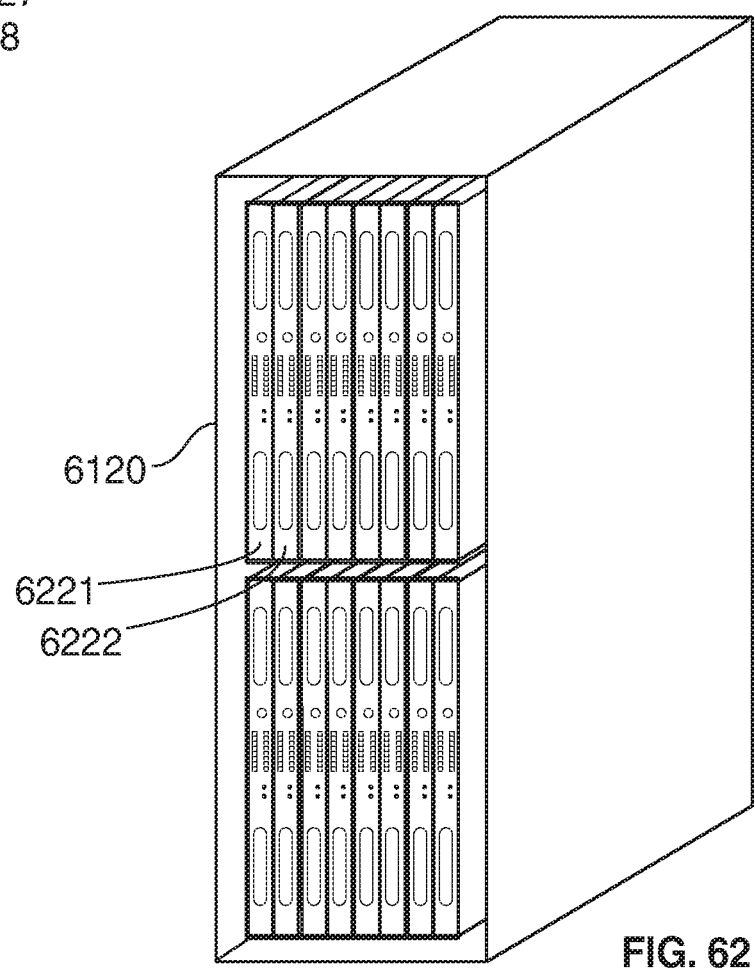
FIG. 62 is a perspective view of an alternative arrangement of blade servers according to the prior art.
Figure 63:
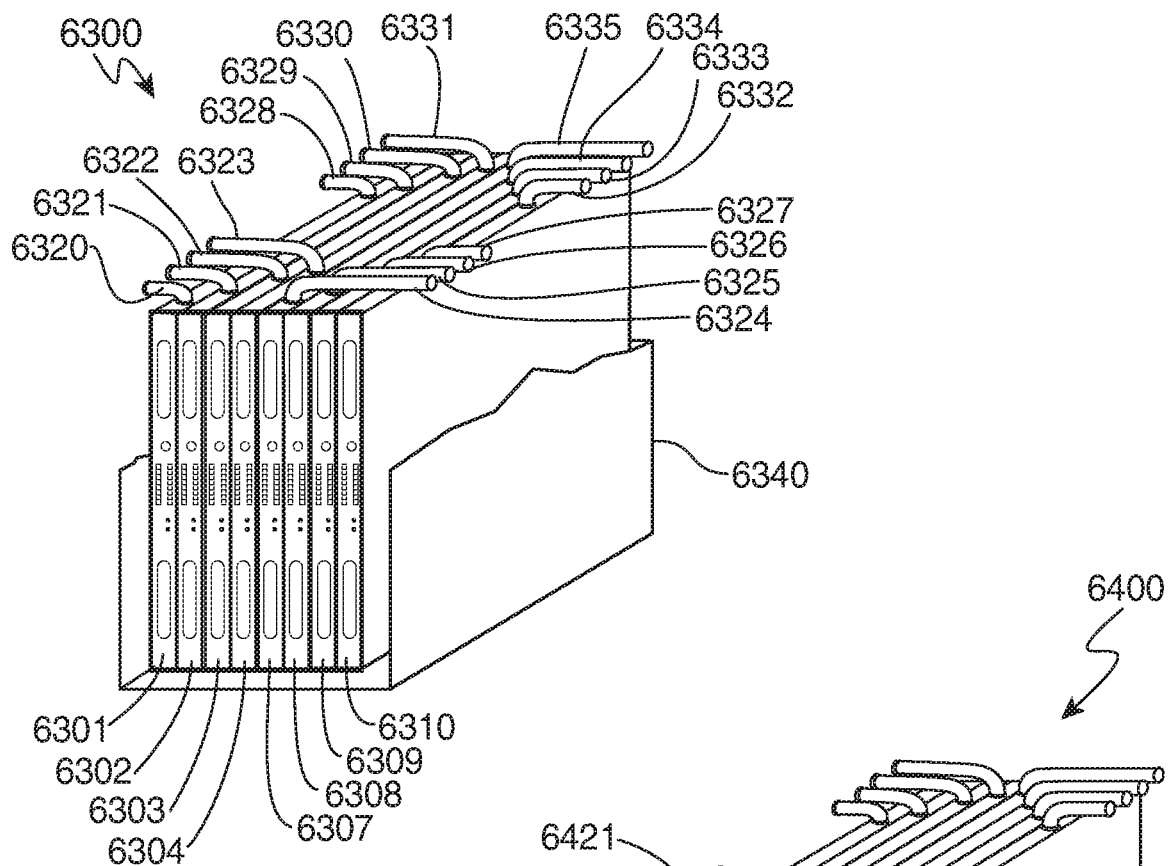
FIG. 63 is a front perspective fractional view of a chassis containing a number of blade servers according to an embodiment of the invention.

FIG. 61 is a depiction of prior art blade server system 6100 wherein a plurality of server blades 6121, 6122, 6123, 6124, 6125, 6126, 6127 and 6128 are oriented in a vertical direction and contained in an external housing 6110. External hosing 6110 is designed to be received in server rack. FIG. 62 depicts a further alternative wherein an external housing 6120 encloses a plurality of servers such as 6221 and 6222. Blade server system 6200 includes two rows of vertically oriented servers. FIG. 63 depicts an embodiment of the invention adapted to provide cool air to and remove air from vertically oriented blade servers. Here, conduit 6320 is connected to a cartridge according to one of the embodiments of the invention discussed above and direct air to an opening provided on the top surface of server 6301. Air is removed from server 6301 using hollow tubular conduit 6328 which is directed air to a cartridge provided in rearward lateral panel as described above. FIG. 63 therefore depicts a server device in which each of the serves 6301, 36302, 6303, 6304 6307, 6308, 6309 and 6310 are provided with air flow to and from the server. These conduits pass through the external casing 6340 that retains the servers and then direct the air laterally.

Figure 64:
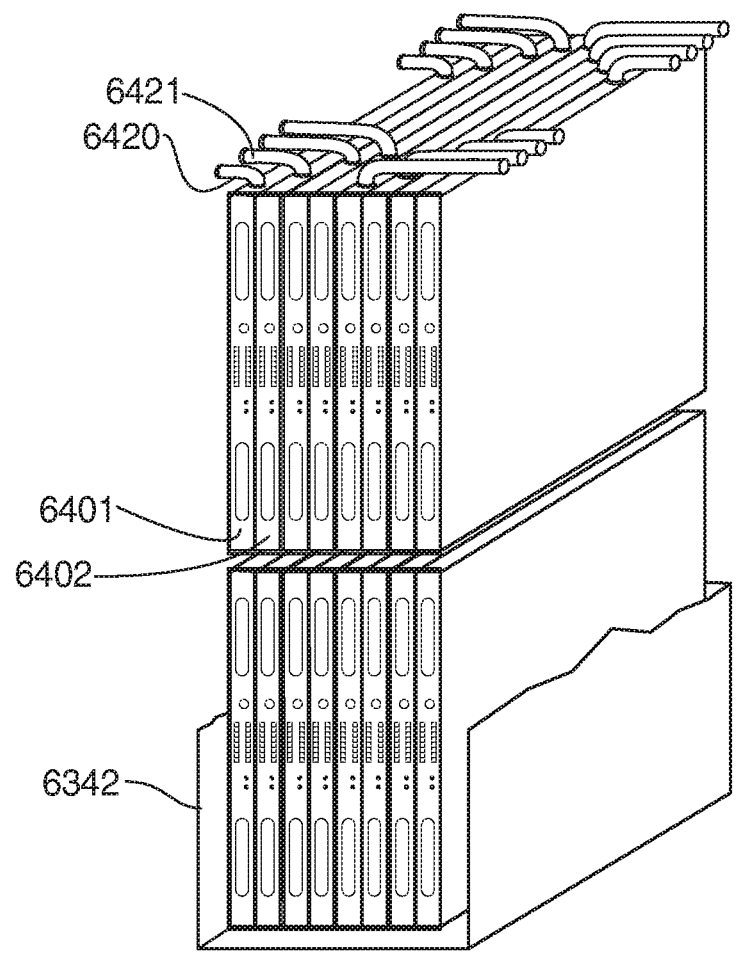
FIG. 64 is a front perspective fractional view of a chassis containing a number of blade servers in multiple rows.

FIG. 64 depicts a further embodiment 6400 wherein hollow tubular cooling conduits such as 6420 and 6421 provide airflow into servers 6401 and 6402. Air is removed from the servers in a similar manner as described with respect to the embodiment 6300 depicted herein.

Figure 65:
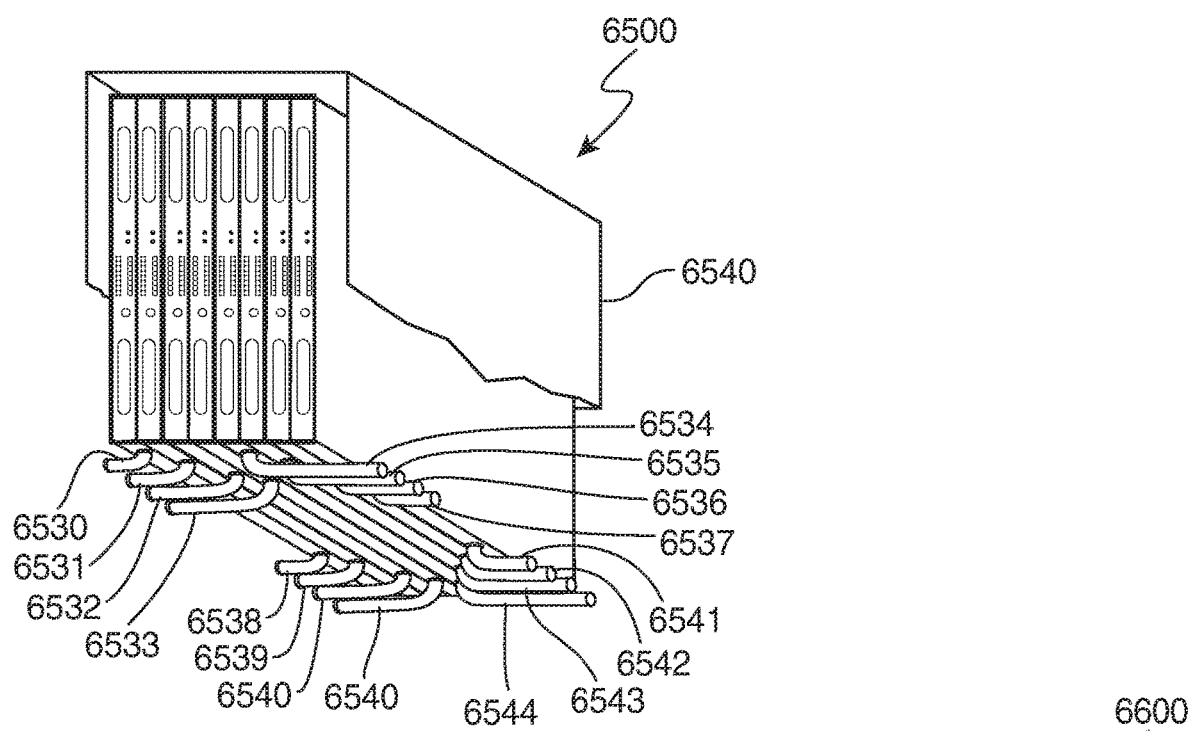
FIG. 65 is a front fractional view of a chassis containing a number of blade servers according to an embodiment of the invention.
Figure 66:
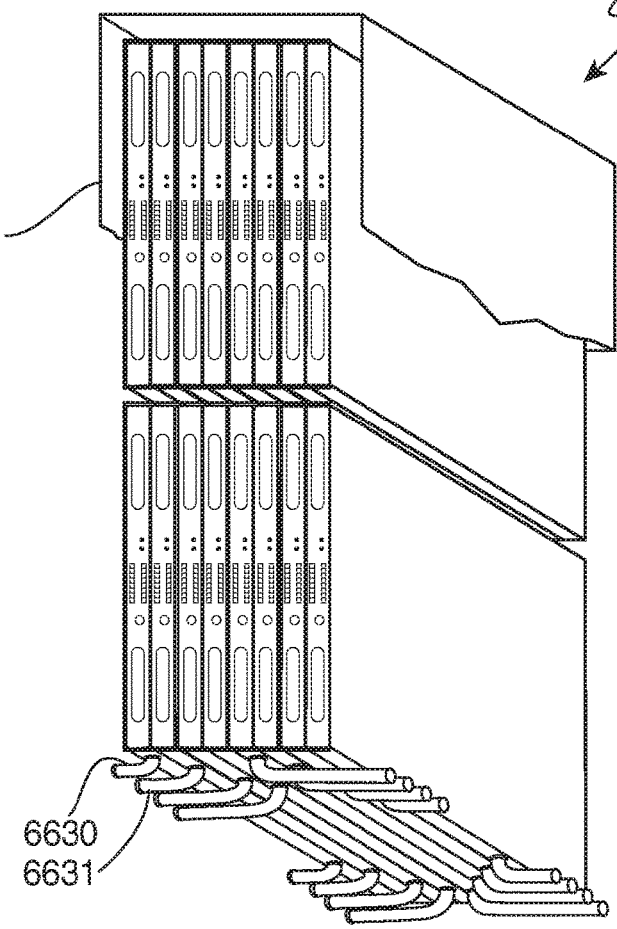
FIG. 66 is a front perspective fractional view of a chassis containing a number of blade servers in multiple rows according to an embodiment of the invention.

FIG. 65 depicts a blade server arrangement 6500 wherein air is distributed to servers through openings on their bottom surfaces through tubular conduits 6530, 6531, 6532, 6533, 6534, 6535, 6536 and 6537. Air is removed from the servers using tubular conduits 6538, 6539, 6540, 6541, 6542, 6543 and 6544 and is directed laterally wherein it can be received by cartridge members as described herein provided on lateral panels. In a further embodiment 6600 depicted in FIG. 66, a row of blade servers includes multiple rows of servers oriented vertically. Air is provided to servers on a lower row using through tubular conduits such as 6630 and 6631. These conduits provide air flow from lateral sides of the device 6600 and deliver the air to the bottom surface of severs. Air is removed from the servers using similar conduits and directed laterally.

In further embodiments (not shown), fans are provided in the cartridges to assist with air flow to the servers and to assist with the removal of air from the servers. In yet other embodiments the fans may be provided in connection with the intake openings and exhaust opening in the panels, or along the conduits that provide for air handling to and from the panels.

Figure 67:
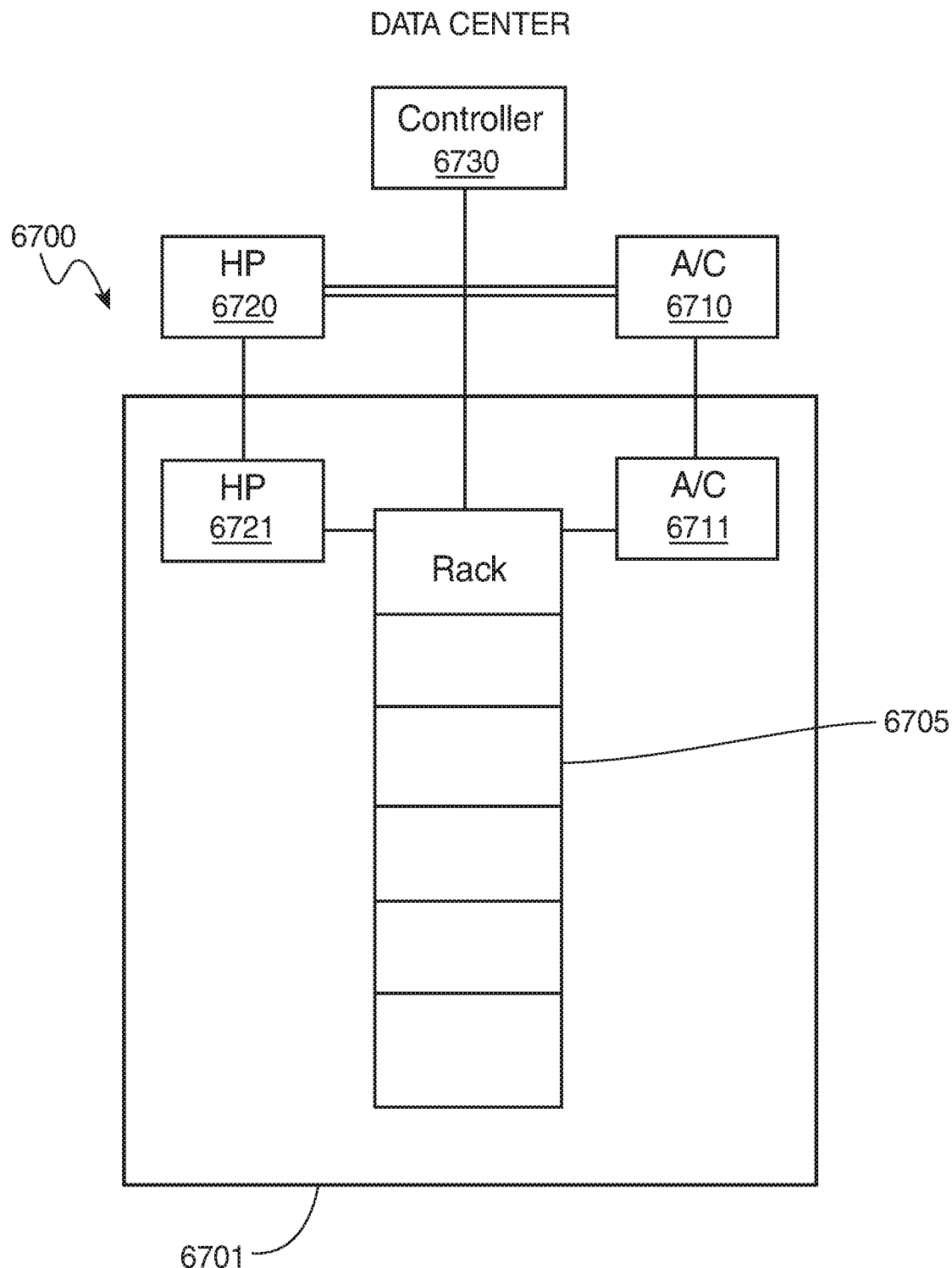
FIG. 67 is a schematic illustration of a system used according in connection with a data center.

FIG. 67 is a schematic view of an embodiment wherein a plurality of racks 6705 are positioned in a building structure 6701 to constitute a server facility or data center. The data center includes a central controller 6730 that may be in proximity to the data center or in remote communication. The system optionally includes an air conditioner system that includes conventional exterior components 6710 such as a compressor, condenser element and a fan and interior components 6711 that include fans, evaporator coils, and an expansion device for the coolant used in the system. The system may also include heat pump technology including interior components 6721 (not shown) which may include a blower, an expansion device, and an exterior coil and conventional exterior components 6720 including a compressor, check valves, an expansion device, exterior coils and a fan.

In yet further embodiments, a variety of rails members are provided in connection with the rack systems to receive different server models, wherein the rails have different designs with different passages to complement the passages in different servers.

It is to be understood, however, that even though numerous characteristics and advantages of the embodiment have been set forth in the foregoing description, together with details of the structure and function of the embodiment, the disclosure is illustrative only, and changes may be made in detail, especially in the matters of shape, size, and arrangement of parts within the principles of the present disclosure to the full extent indicated by the broad general meaning of the terms in which the appended claims are expressed.

Figure 68:
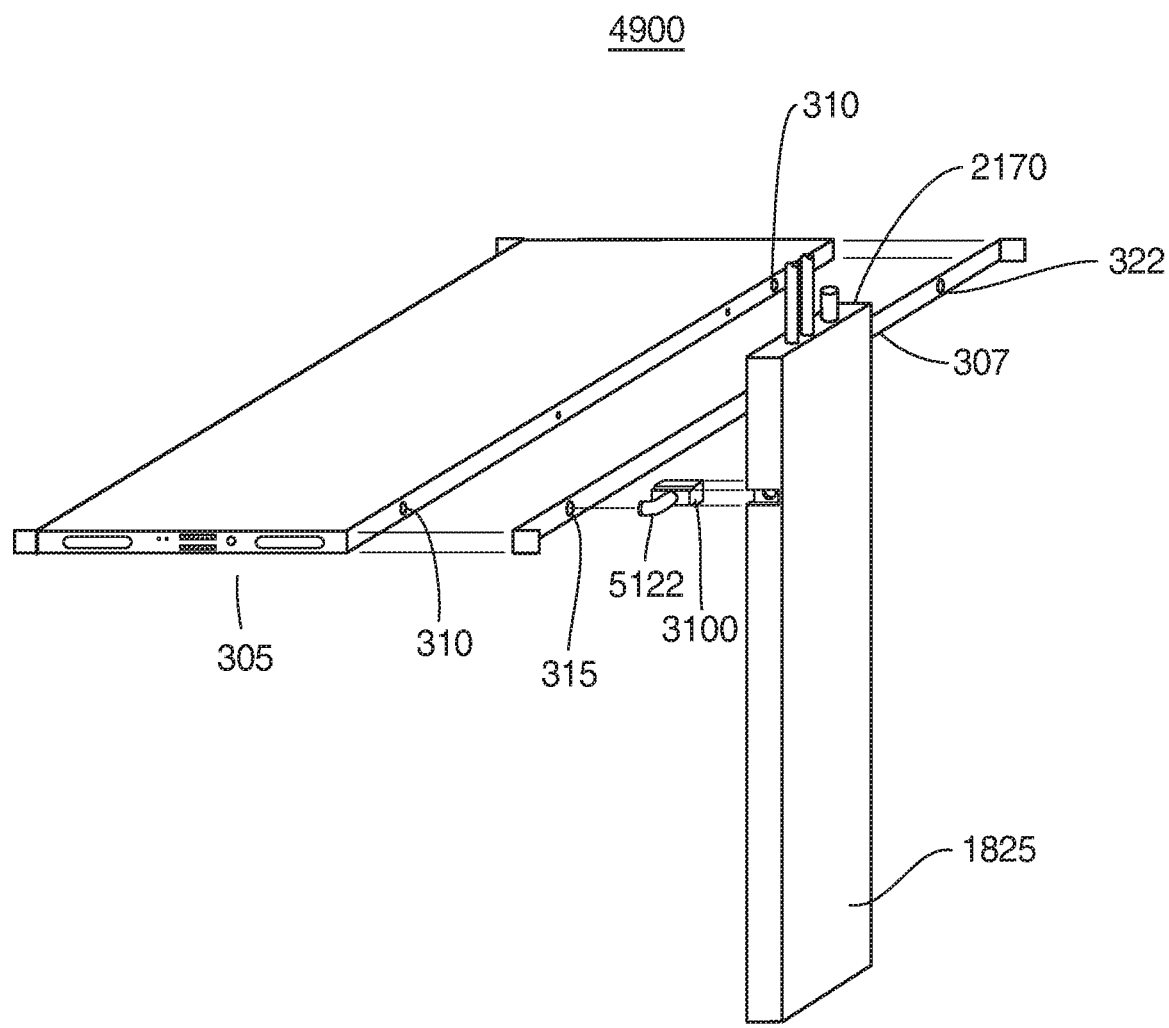
FIG. 68 is a perspective, partial view of a server rack stand of the present invention.
Figure 69:
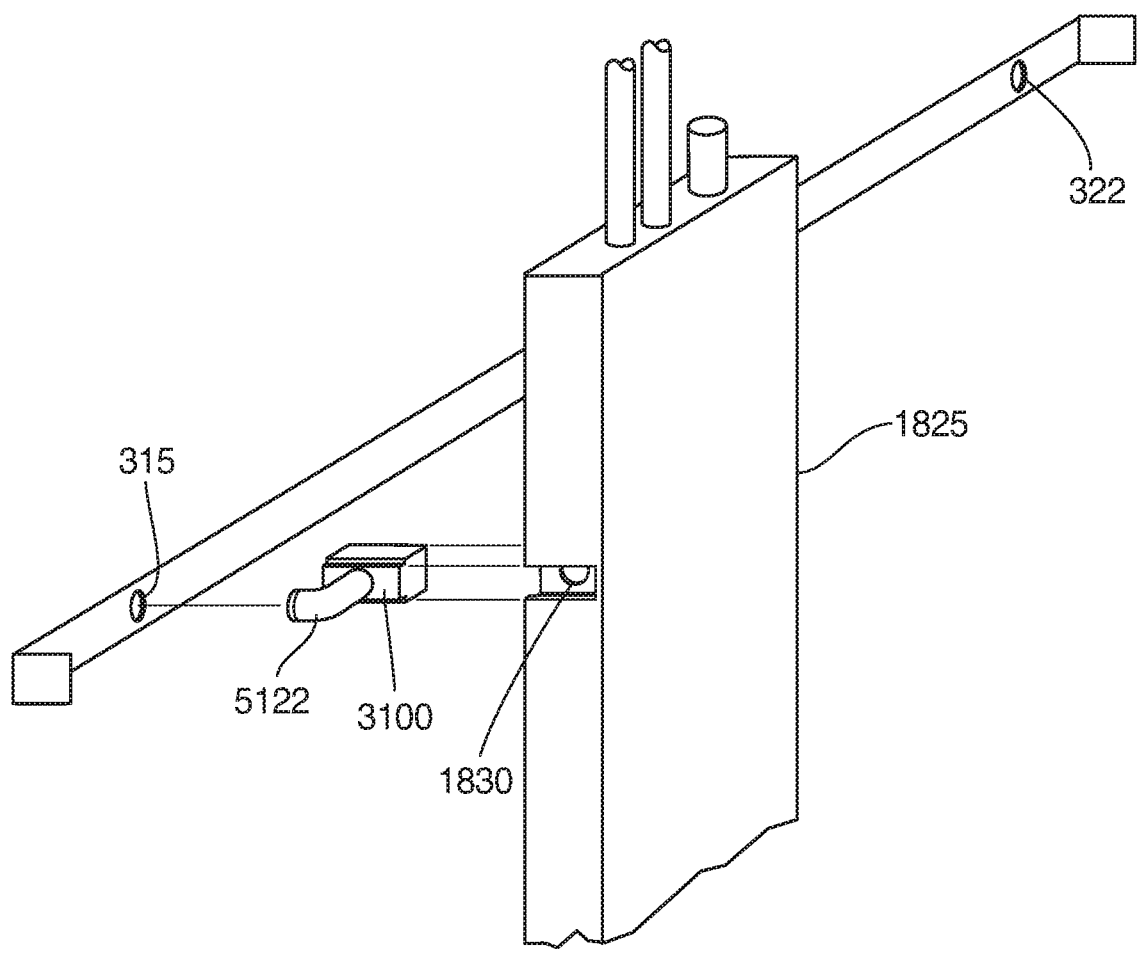
FIG. 69 is a perspective, partial view of a server rack stand of the present invention.
Figure 70:
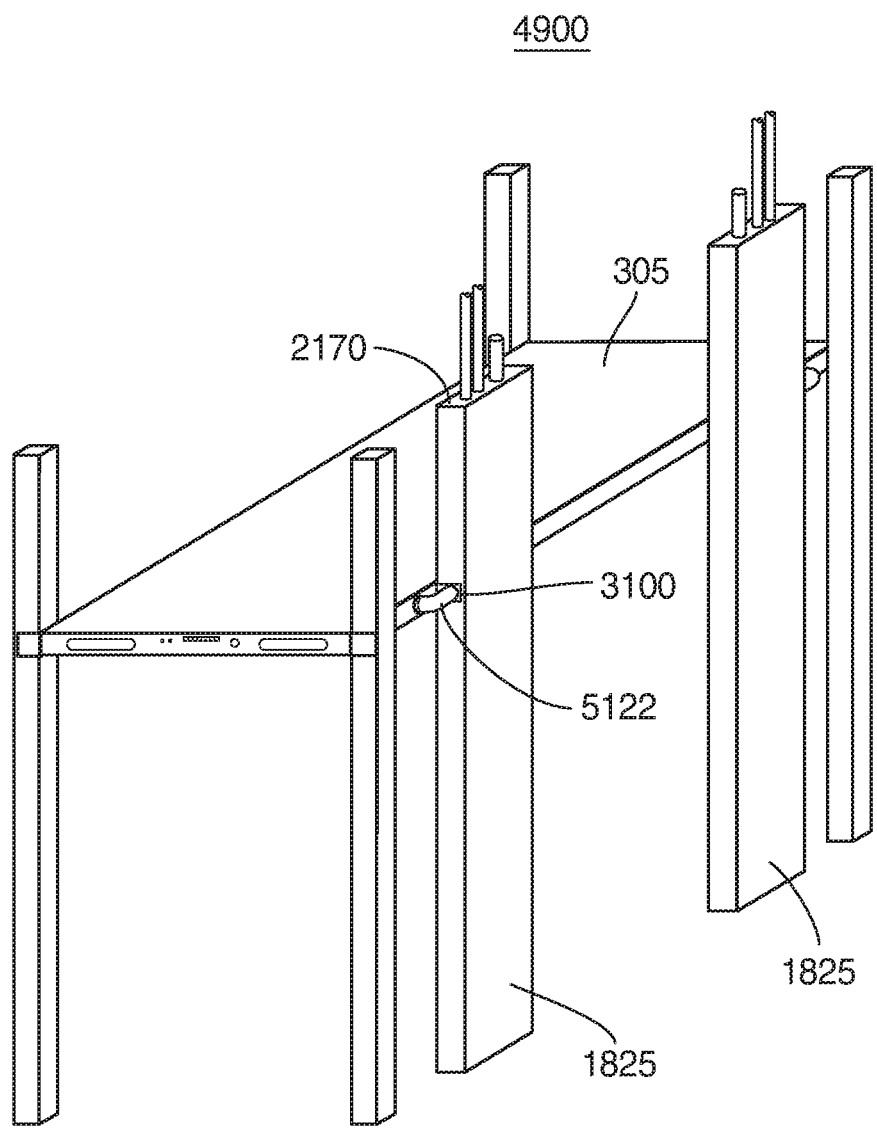
FIG. 70 is a perspective, partial view of a server rack stand of the present invention supporting a computer.
Figure 76:
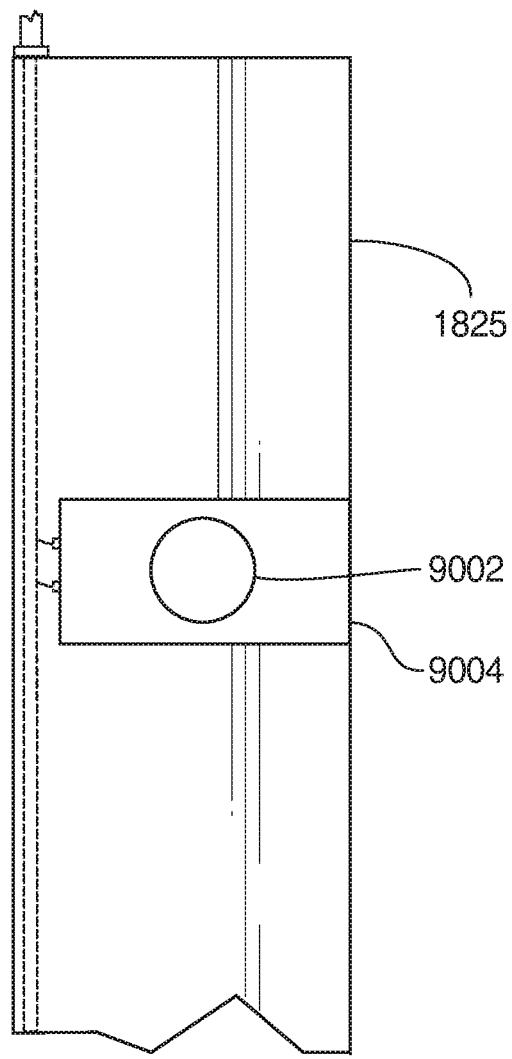
FIG. 76 is an orthographic, partial view of a server rack stand of the present invention.
Figure 77A:
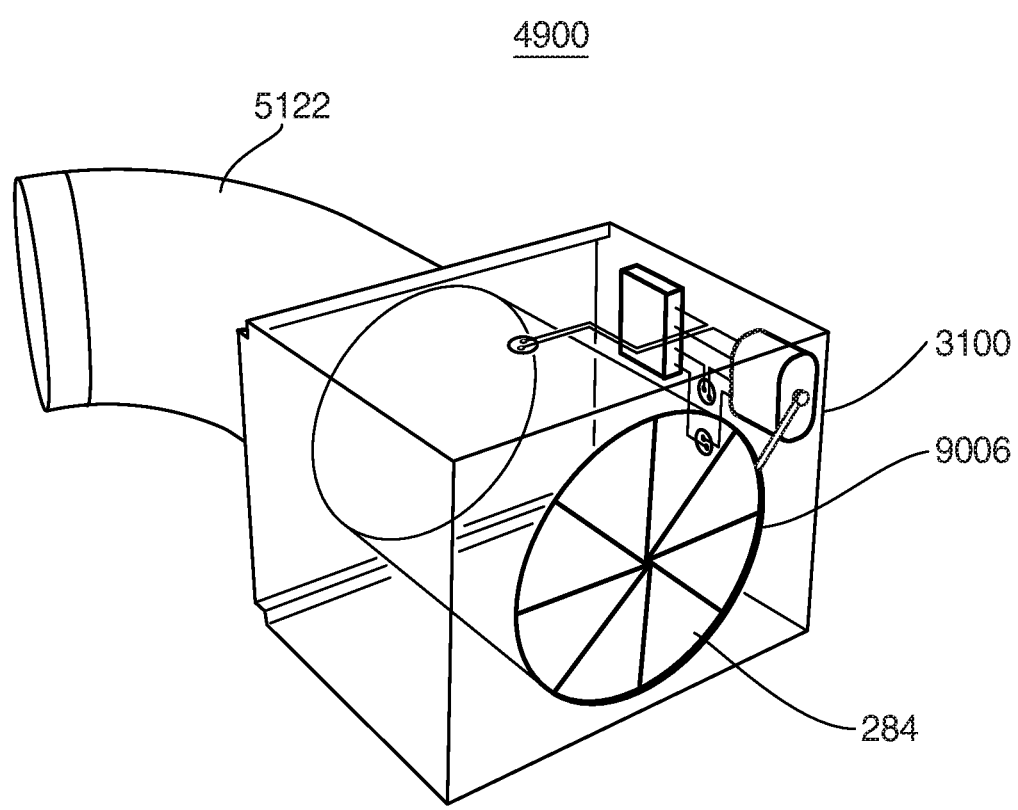
FIG. 77A is a perspective view of a cartridge of the present invention.
Figure 77B:
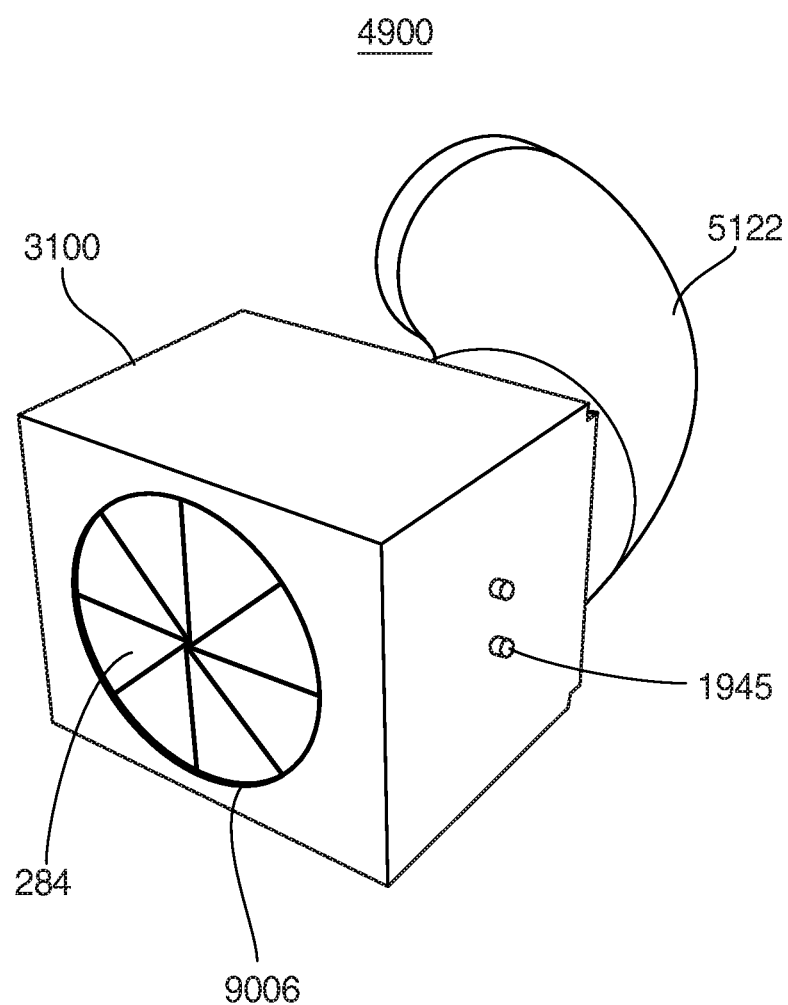
FIG. 77B is a perspective view of a cartridge of the present invention.
Figure 78A:
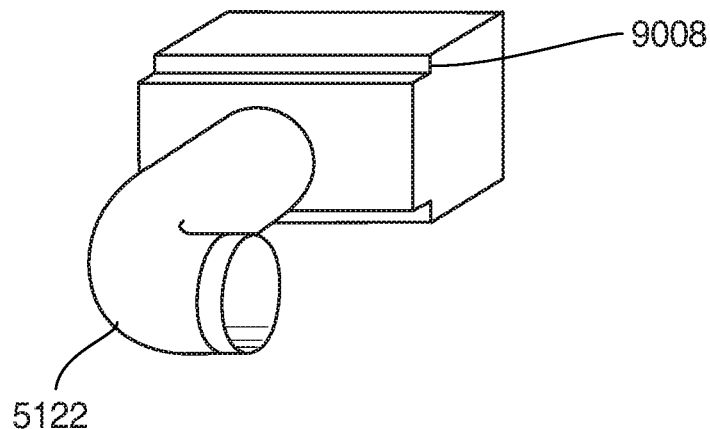
FIG. 78A is a perspective view of a cartridge of the present invention.
Figure 78B:
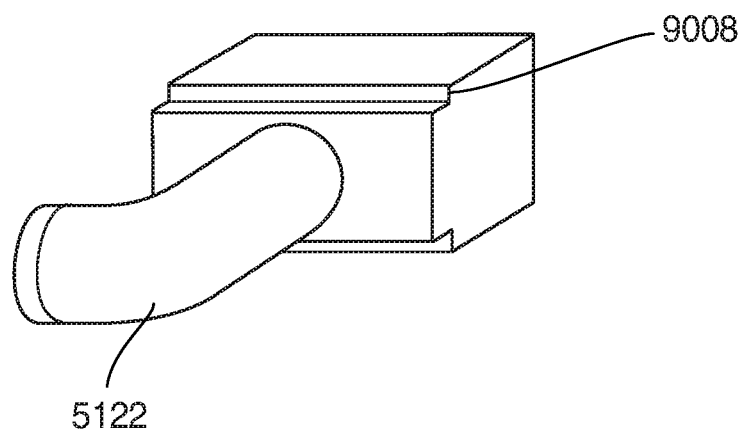
FIG. 78B is a perspective view of a cartridge of the present invention.

Turning now to FIGS. 68-71, the present invention features an embodiment of the cartridge 3100 that is peripherally mounted to the rack stand 4900. Prior versions of the present invention featured a central void that utilized hollow vertical posts 1825 to fill and accept gas therefrom. The embodiments of FIGS. 68-71 instead allow gas to enter/leave server computers without recourse to a centralized void. As shown in FIG. 68, the vertical post member 1825 includes a hollow area 2170 through which gas may be infused or withdrawn. The post 1825 includes a peripheral attachment point with an opening through which gas may enter/leave. With reference to FIG. 76, the stand of the present embodiment includes a peripheral opening 9002 which may be a simple void (e.g., lack of material) or an aperture constructed to dimensionally correspond an opening on the peripheral cartridge. The preferred peripheral cartridge may be slid into position on the member 1825 by use of a recess 9004 sized to accommodate to the body of the peripheral cartridge. Upon joinder, the cartridge/member system would be preferably exhibit a uniform entity such that the surfaces of the member and cartridge are approximately continuous.

With further reference to FIGS. 74-78, the present invention includes a cartridge 3100 capable of electrical power. The cartridge 3100 may include electrical contacts 1945 adapted to form a circuit with a power supply within, or passed through, the member 1945. The member of the present embodiment permits a user of the server rack 4900 to service computers within the rack with relatively little inconvenience.

Figure 71A:
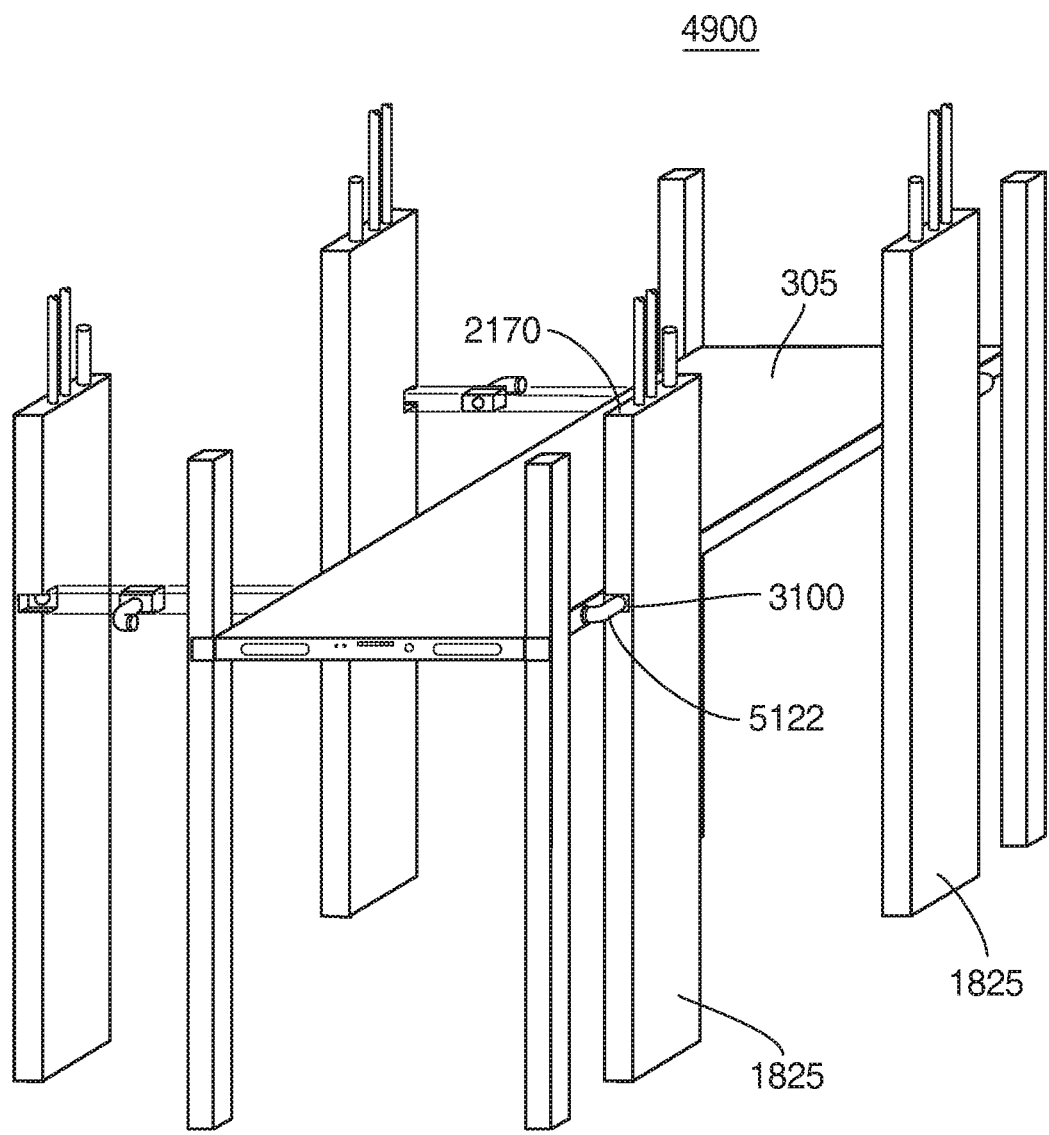
FIG. 71A is a perspective view of a server rack stand of the present invention.
Figure 71B:
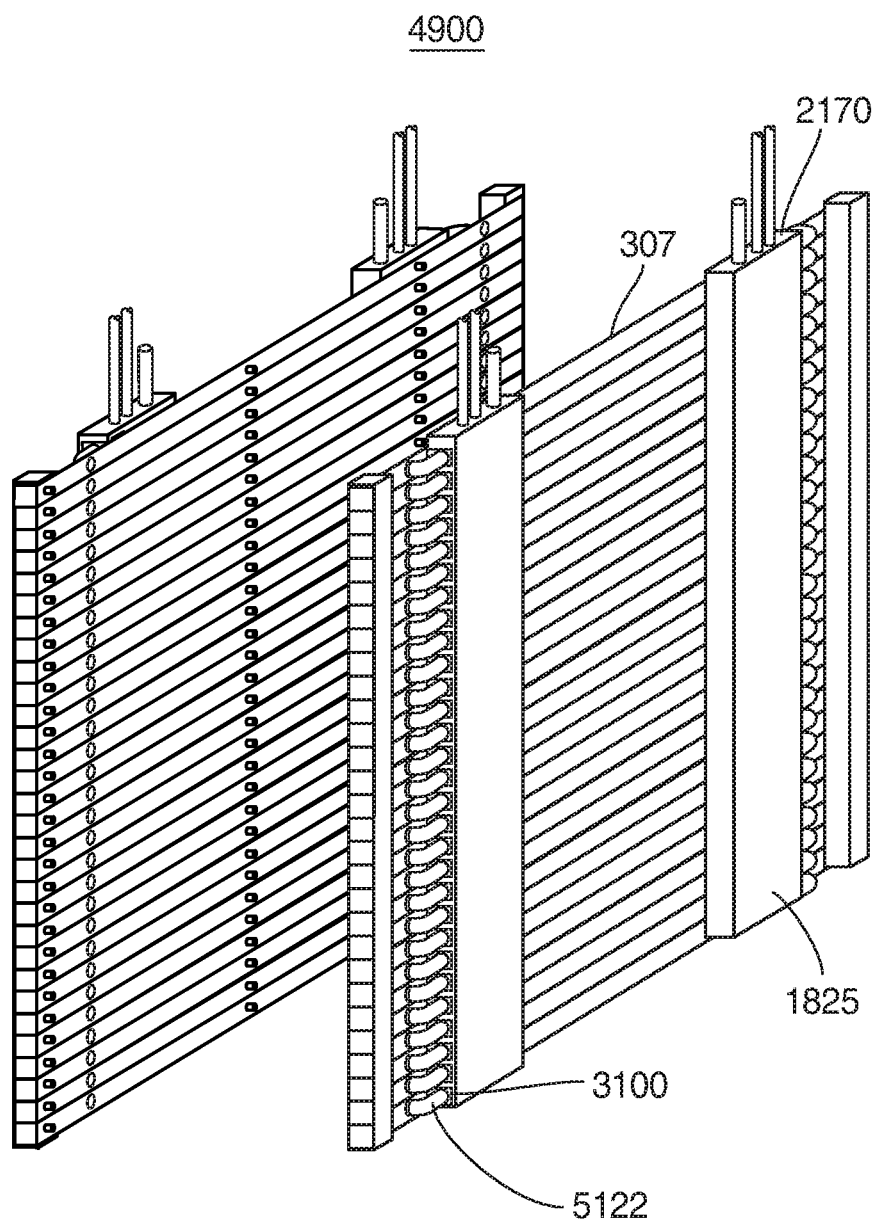
FIG. 71B is a perspective view of a server rack stand of the present invention.
Figure 72A:
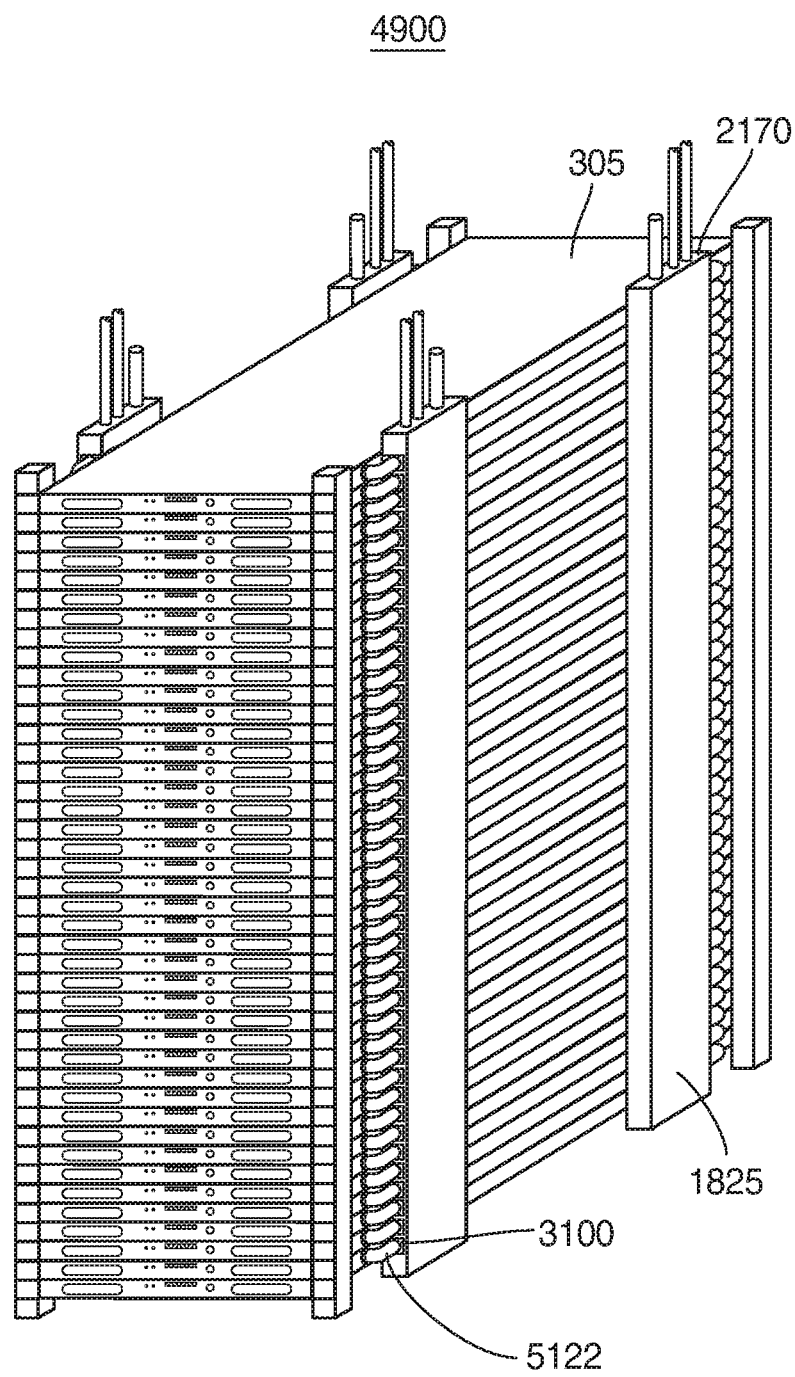
FIG. 72A is a perspective view of a server rack stand of the present invention accommodating multiple computers.
Figure 72B:
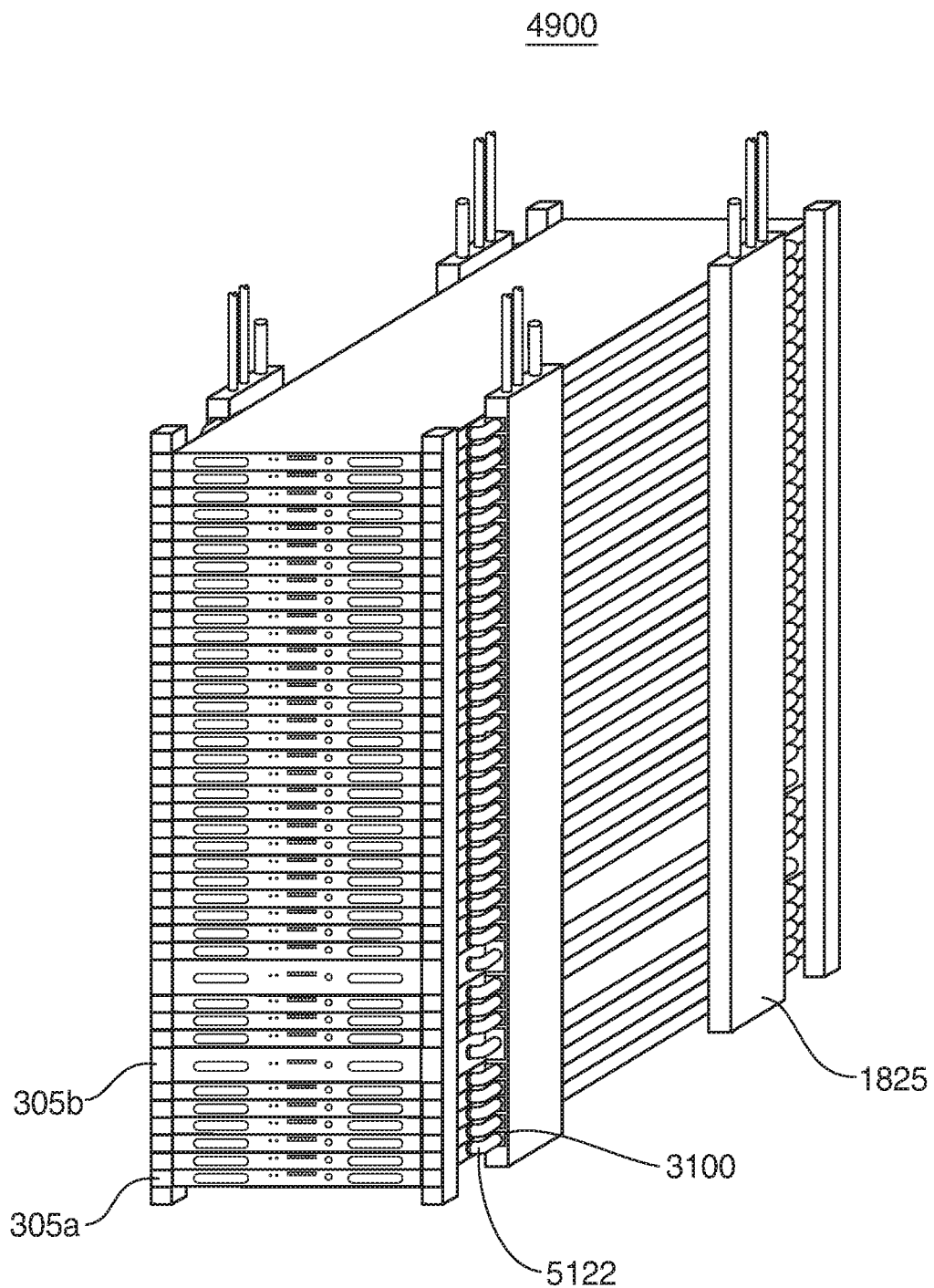
FIG. 72B is a perspective view of a server rack stand of the present invention accommodating multiple computers.
Figure 73:
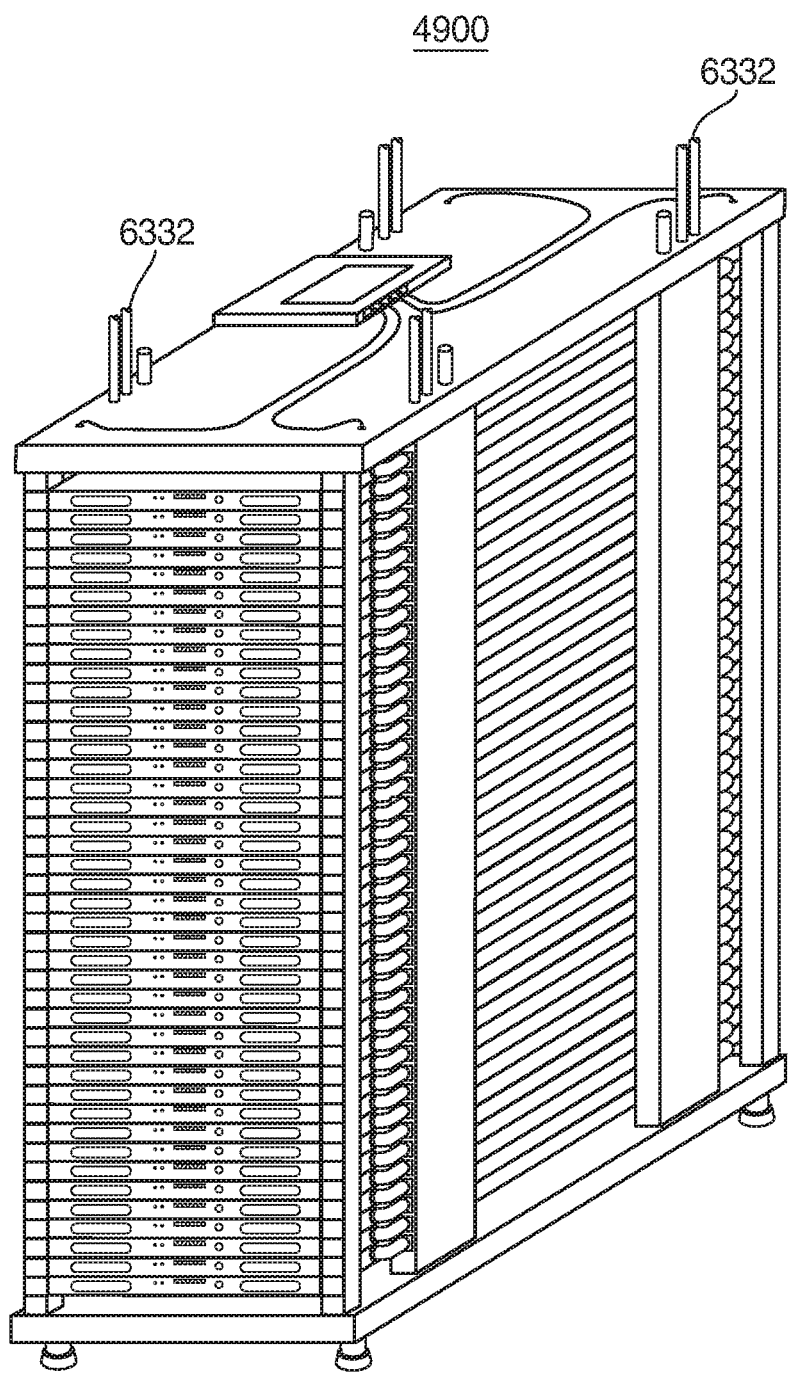
FIG. 73 is a perspective view of a server rack stand of the present invention.
Figure 74:
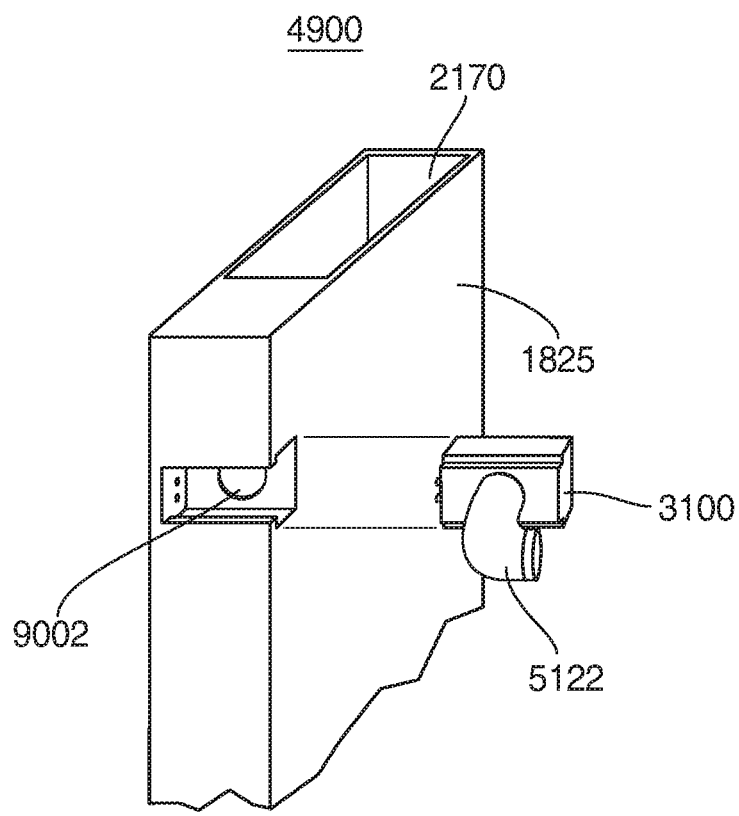
FIG. 74 is a perspective, partial view of a server rack stand and cartridge of the present invention.
Figure 75:
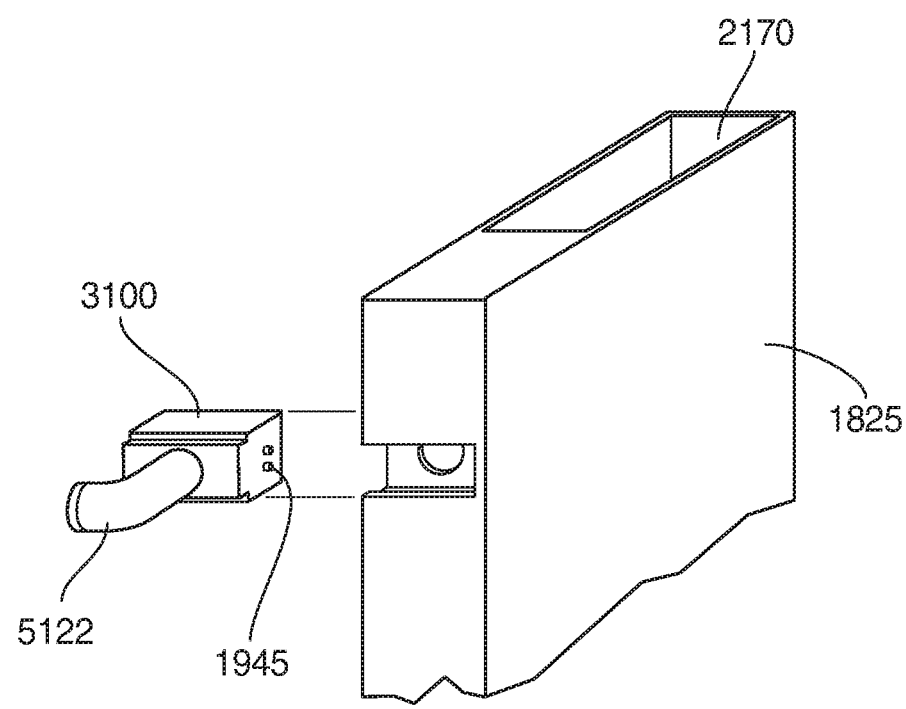
FIG. 75 is a perspective, partial view of a server rack stand and cartridge of the present invention.

The member opening 9002 is oriented away from the area that would be occupied by the computer 305. By oriented away, it is meant that opening faces a direction other than one parallel from the exact direction faced by the surface of the member 1825 immediately adjacent to the computer (or where it would be), i.e. the computer support surface. The preferred orientation of the opening is perpendicular to the computer surface such that the opening is accessible when the computer is attached to, or proximate to, the computer support surface. The cartridge is affixed into position to align the opening 9006 of the cartridge with the opening 9002 of the member. Alternatively, a surface of the cartridge may comprise mostly open space such that the cartridge forms the outer surface of the member upon fixation. The gas passes from the member opening 9002 to the cartridge opening 9006 and exits the cartridge via conduit 5122. The conduit 5122 may be directly affixed to the cartridge 3100 or a separate entity such that the cartridge has a second aperture immediately accessible to a user. The preferred embodiment of the cartridge includes a conduit integrated to the cartridge such that airflow passes from the member to cartridge and then into the conduit for transmission to a computer. The cartridge may include any of the features of cartridges previously discussed, including an impediment, e.g. shutter 284. Although the present embodiment has been discussed primarily in terms of airflow ingress from a master gas source into the member and then into the computer, as with previous rack systems disclosed herein, the cartridge/rack also serves as the basis for gas egress to a heat reservoir. As shown in FIGS. 71-73, the present invention includes cartridges both to transmit gas and receive gas to/from the computer. The rack system 4900 adapted to the peripheral cartridges may be used with any accessory or feature of previously disclosed rack systems disclosed herein, including perforated railings 307 with railing apertures 315, 322 corresponding to apertures in the computer case and the conduit from the cartridge.

Figure 79:
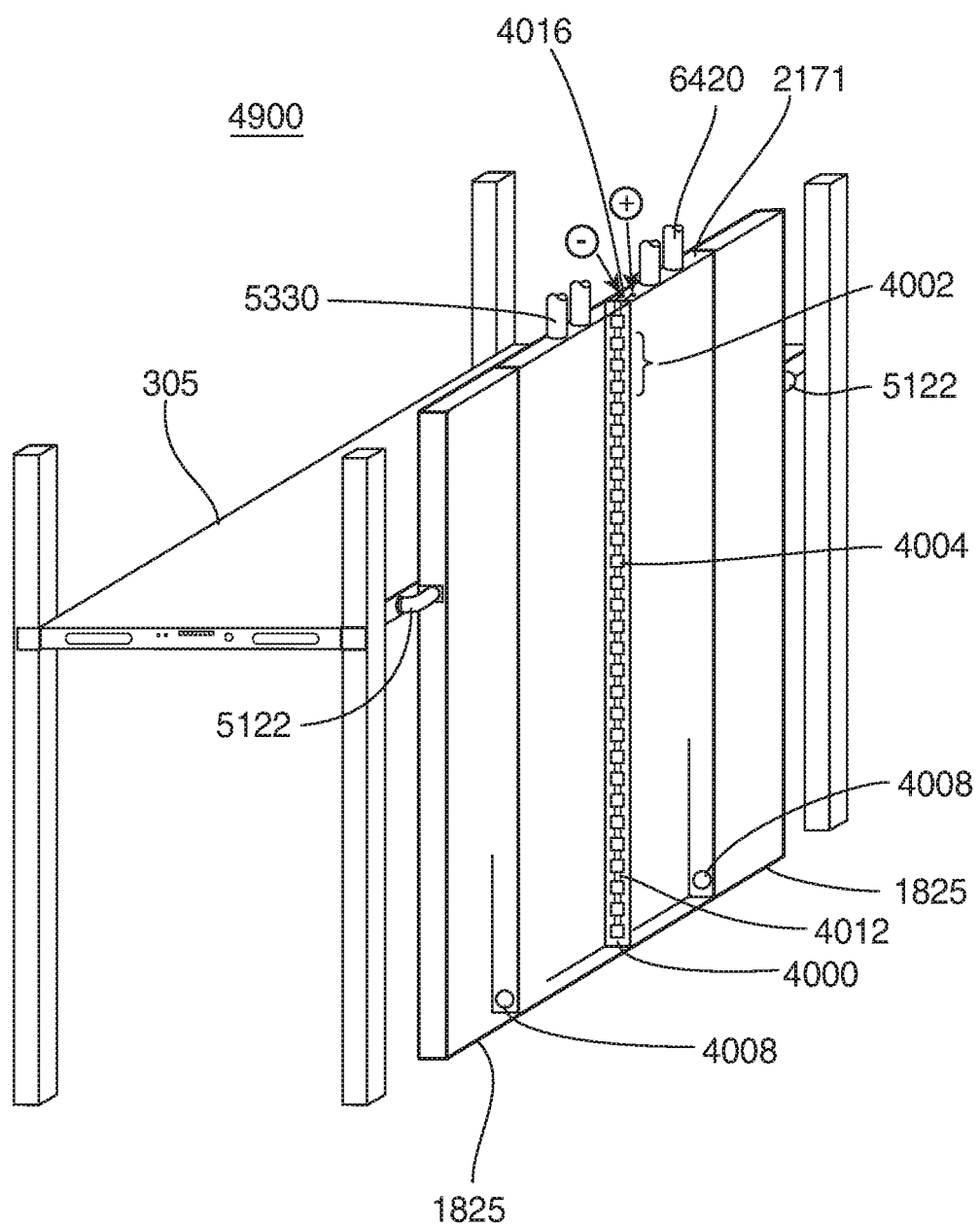
FIG. 79 is a perspective view of a server rack of the present invention.
Figure 80:
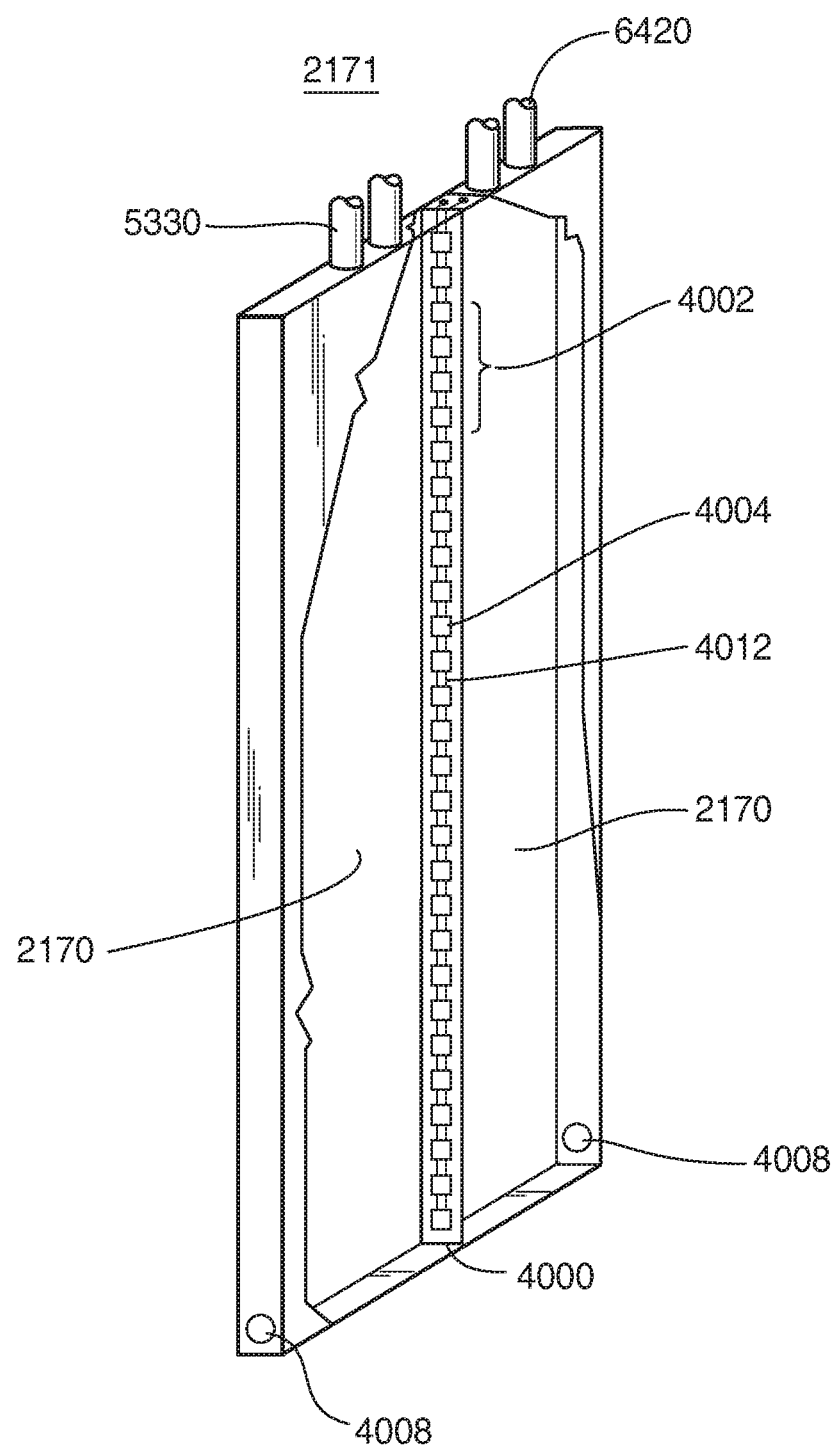
FIG. 80 is a perspective view of an insert of the present invention.
Figure 81:
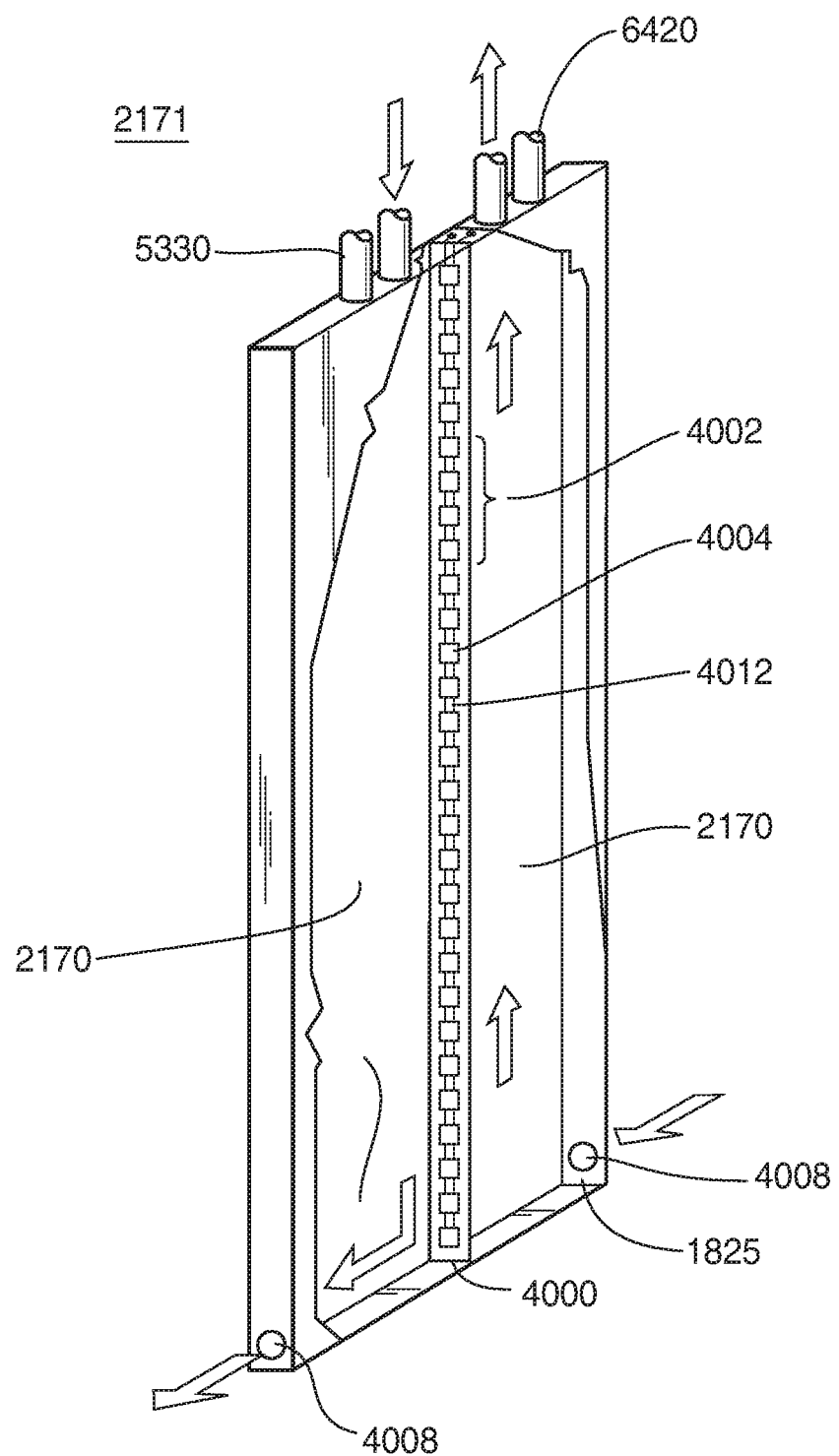
FIG. 81 is a perspective view of an insert of the present invention.
Figures 82A, 82B:
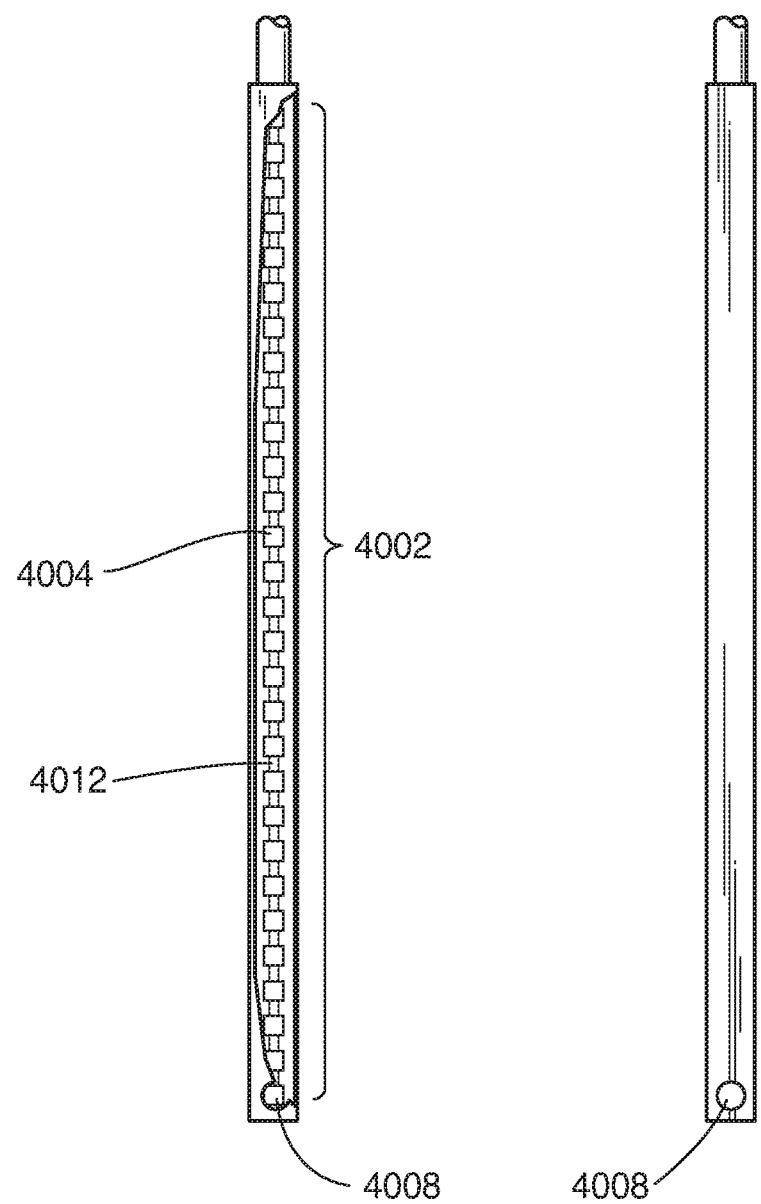
FIG. 82A is a side, exposed view of an insert of the present invention.
FIG. 82B is a side view of an insert of the present invention.
Figure 83:
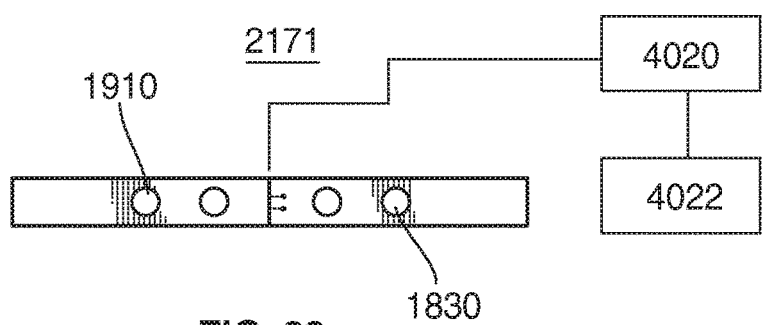
FIG. 83 is a top view of an insert of the present invention.

Turning now to FIG. 79, the present invention includes a generator embodiment of the rack stand 4900. The amount of electricity utilized by server facilities is significant. Commentators have calculated that a 50,000 sq. ft. data center utilizes about 5 Megawatts continuously, which is the energy equivalent to satisfy the needs of 5000 homes. There is a vicious cycle associated powering a data center; electricity is used to power the arithmetic logic units (ALU) of computers 305, which in turn generates a tremendous amount of heat that deteriorates the efficiency of the ALUs. In turn, greater electricity must be expended to cool the ALUs, either indirectly as was the state of the art prior to the present invention (cooling the surrounding environment), or cooling the ALUs directly through a closed-system computer case. Because the present invention utilizes several closed systems, airflows can be advantageously shunted into discrete locations to present a thermal differential that can be used to generate electricity as a hybrid server facility.

The hybrid server facility of the present invention includes the rack stand 4900 of the present invention. Rather than simply urging air into a first vertical post 1825, conducting the airflow into the computer 305, and then back into a second vertical post 1825, the present invention conducts the airflow through voids 2170 in the rack stand such that one void 2170 includes cooled air that has yet to contact an interior of the computer 305, and one void 2170 receives air exhausted from the computer 305 as warmed air. The preferred embodiment of the present invention utilizes the vertical stand members 1825 previously described herein. In versions of the rack stand characterized in, for example, FIGS. 68-78, the rack stand need not include a sizable exterior, that is to say, one that extends the lateral length of a computer blade. The preferred embodiment therefore includes a stand insert 2171. The insert fits between the rack stand vertical posts 1825 to form a generally continuous rack stand side.

As shown in FIGS. 79-83, the preferred hybrid rack stand 4900 includes the vertical stand posts 1825 with lateral passages 4008 formed in the lower portions of the posts 1825. As conduits 5330 bring cooled air from a distant airflow source in the rack stand 4900, the cooled (i.e., relative to a heated computer interior) air first enters the insert 2171 through passages 1830 formed at the apex thereof to which conduit 5330 may connect. The cooled air is urged downward through the hollow interior 2170 of the insert 2171 to a lateral passage 4008 formed in the exterior of the insert that corresponds to a lateral passage 4008 in the exterior of the vertical post 1825. The cooled air then travels upwardly through the vertical post 1825 for distribution via conduit 5122 to one or more computers 305 as characterized by the embodiments of FIGS. 68-78 or as otherwise characterized by this disclosure.

Air urged into the interior of the computer 305, and in contacting the working components of the computer 305 becomes heated. The air urging components of the present invention, e.g. pumps, fans, etc., supply pressure sufficient to urge the air from the computer interior back into the rack stand via conduit 5122 on a distant portion of the computer. This heated air, referenced herein as exhaust air because it is the air exhausted from the computer, returns to the hollowed post 1825 of the rack stand 4900. Upon entering the hollowed post, the air is directed to a lower lateral passage 4008 whereby it re-enters a second void 2170 of insert 2171. This second void 2170 of the insert includes an exhaust gas passage 4008 at the lower portion and an outlet passage 6420 at the apex thereof. Again, the airflow patterns sends the air from one extremity of a component to the other. The exhaust gas that passes through the exhaust void 2170 of the insert 2171 may then return to a heat reservoir via conduit 6420 as dictated by the server facility design.

The insert 2171 of the present invention is merely a preferred means of situating a heat sink adjacent to a cold sink. Here, the insert includes a void 2170 that is divided into at least two portions by a demarcation wall 4000. For purposes of the present invention this can be done in as many structures as is necessary, and without recourse to any particular arrangement. The void bearing the cooled air, the cool void, need merely accept cooled air and be positioned adjacent to a heated void, the exhaust void, and the voids transmit and accept airflow to/from the voids. The demarcation wall is a physical barrier between the cool void and the exhaust void that prevents cooled air from traveling to the exhaust void and vice versa. It is preferred that the demarcation wall includes insulation, or is constructed of a material with low thermal conductivity. Supported by the demarcation wall 4000 are Peltier generators 4004 forming a Peltier generator complex 4002. A Peltier generator includes any device that utilizes a thermal differential to generate electricity, including such means as known as the Seebeck effect. The Seebeck effect is the phenomenon directly related to thermoelectric generation. According to the Seebeck effect, thermoelectric generation occurs in a circuit containing at least two dissimilar materials having one junction at a first temperature and a second junction at a second different temperature. The dissimilar materials giving rise to thermoelectric generation in accordance with the Seebeck effect are generally n-type and p-type semiconductors.

Because experimental and theoretical models indicate that a fully endowed server rack stand can generate a thermal differential according to the present invention of approximately 40 degrees Celsius when refrigerated air is utilized, and approximately 25 degrees Celsius when ambient air is used as the cooled air. Positioning Peltier generators in the demarcation wall 4000 such that a first surface of the generator 4000 contacts the cooled void 2170 and a second surface of the generator 4000 contacts the exhaust void, a substantial amount of current may be generated merely by advantageously routing cooled air and exhaust air into neighboring voids. Because the present invention utilizes components with an elongated height, relatively speaking, heated air can be made to pass along a narrowed corridor bearing the Peltier generator complex 4002 bearing at least one Peltier generator 4004. Thus utilizing lengthy components bearing Peltier generators maximizes the efficiency of the present invention. The Peltier generator complex 4002 includes one or more Peltier generators, and the preferred Peltier generator complex 4002 includes a linear row of Peltier generators 4004 embedded within the demarcation wall 4000. The specific Peltier generator(s) utilized are not specific to the present invention; however, experimental investigations undertaken by the applicant indicate that a preferred Peltier generator is the TEG2-126LDT generator manufactured by TECTEG. The TEG-126LDT is a low delta temperature module. Custom designed for "Internet of things" body and micro harvesting applications. The Peltier generator complex is connected via a rack circuit 4012 that may power a load directly or indirectly.

Because the preferred configuration of the exhaust void and cool void is adjacent, and the Peltier generator complex is positioned between the exhaust void and the cool void, the preferred positioning of the exhaust outlet and exhaust inlet is to lay out a path of heated air across as much of the Peltier complex as possible. One of means of accomplishing this task is to position the exhaust inlet directly opposite the exhaust outlet on the server rack stand, for example, one on top, one on bottom—with the Peltier generator complex therebetween. Such an embodiment would be particularly appropriate as applied to the rack stand embodiment of FIG. 13. The FIG. 13 embodiment includes a rack stand that lacks a distinct vertical stand post and insert, preferred instead to have a unitary side portion. In such embodiments, the demarcation wall would simply be positioned between the unitary void created by the stand side portion, with the appropriate re-arrangement of passages, outlets, inlets, etc. However, the preferred embodiment separates the rack side into discrete portions, an insert with the cool void an exhaust void. In doing so positioning lateral passages 4008 in both the insert 2171 and posts that require the airflow path to traverse a U-shaped path that permits the exhaust inlet and exhaust outlet to be positioned on the same side of the rack stand while still forcing airflow to pass across the entirety of the Peltier generator complex.

Figure 84A:
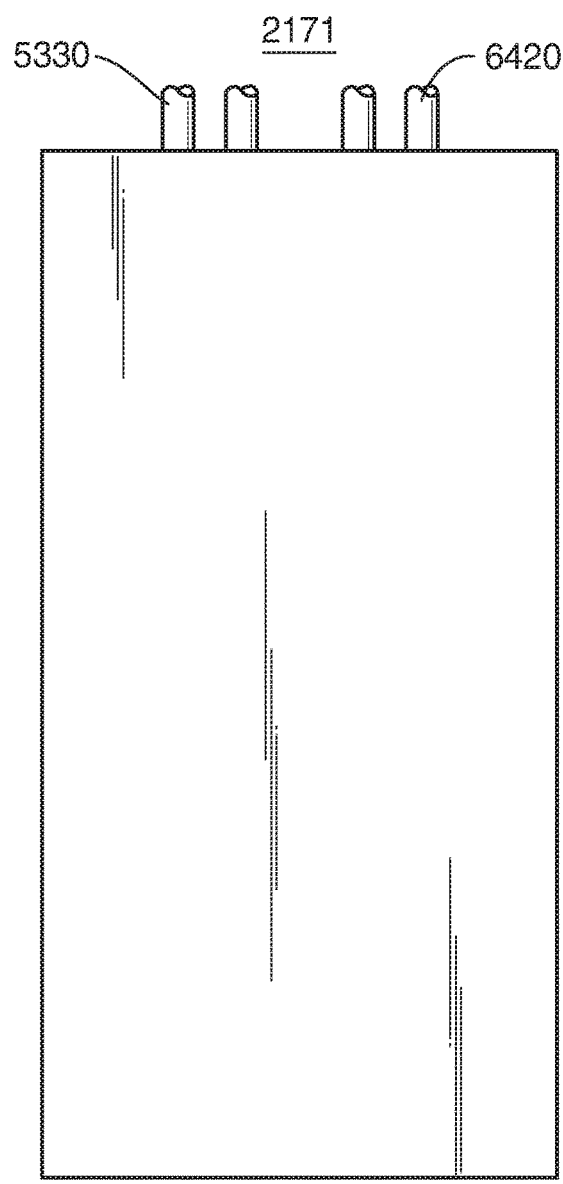
FIG. 84A is a front view of an insert of the present invention.
Figure 84B:
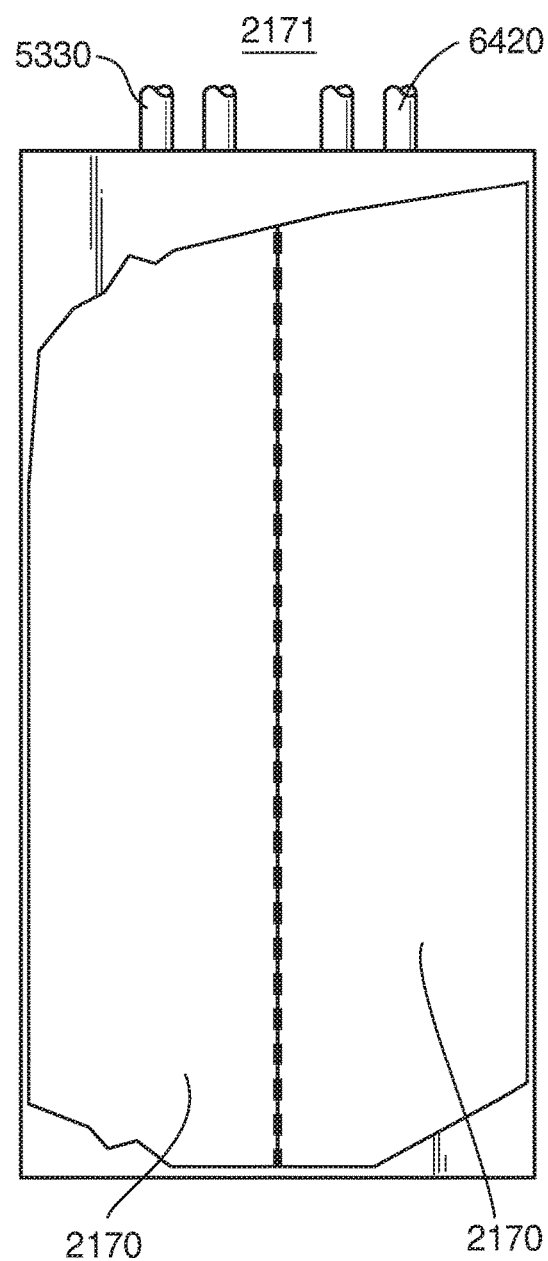
FIG. 84B is a front, exposed view of an insert of the present invention.
Figure 85:
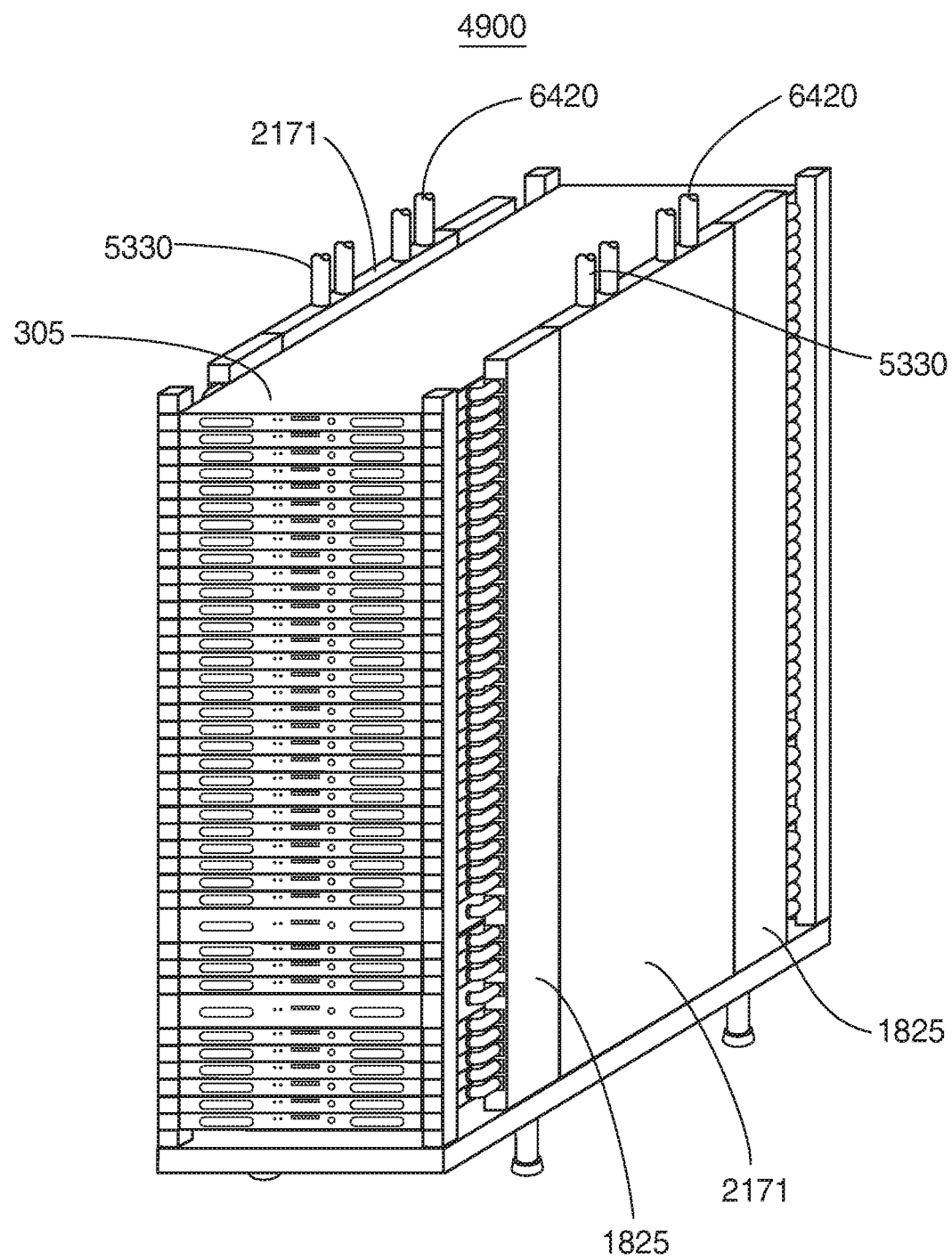
FIG. 85 is perspective view of a server rack of the present invention.

The power generated by the hybrid rack of the present invention may be used to supply current to other electrical components. The current may be utilized to power a load 4022 proximate to the rack, which may be either affixed to, within, or adjacent to the rack. By load 4022, it is meant a component that consumes electricity in order to provide a function. Preferred loads of the present invention include components, such as shown in FIG. 67, that may be directly used with the present invention including air conditioning units 6710, pumps 6720, and controllers 6720. Returning to FIGS. 79-83, and including FIGS. 84-86, the present invention may have loads that are hardwired into the rack circuit 4012. Two preferred versions of the rack stand include either rack-internal air movers to assist with the conduct of air throughout the facility, or a terminal 4016. The terminal 4016 may either permit wired connection to the circuit 4012 via protected circuit leads, or the terminal may take the form of an outlet wired into the rack stand to permit a load to connect to the rack via a standardized plug. Embodiments of the present invention may permit the rack to be wired to a general circuit of the data center facility to return power to such general components of the facility that require powering. In many instances, high efficiency buildings include solar paneling that includes battery storage to store excess and/or off-peak power. The rack may be used to charge such a battery as a preferred load.

Turning now to FIG. 86, the present invention includes method 9000 for the generation of power from the ancillary heat generated by the use of stacked computer equipment. The method 9000 includes a genesis of propelled air, which may be an air conditioner 5340 or air mover. Cold, whether relatively or artificially cooled, is shunted 9002 through conduit to the internal cold portion of the server rack. This air is urged 9004 through the rack to cold side of Peltier generator complex to form the cold side of the thermal differential. The preferred Peltier generators include fins and other surface area enhancers that enhance contact between the generator portions and the airflow internal to the rack. The racks continue to route 9006 the cooled air through their body to the computer bodies, which are preferably sealed. Inside the server computers, cold air lowers internal temperature and CPU and other processors. As the air passes 9012 over all of the electronic components, the air heats up. Heated exhaust air from the server travels 9014 into the rack exhaust manifold. Heated exhaust air travels 9016 through the exhaust air side of the server rack heating the copper blades attached to the heat side of the Peltier generators. Cold air and exhaust air are applied 9010 to the applicable sides of the Peltier generators to produce current. Current from the Peltier generator complex is applied 9008 to a number of loads or applied directly to data center power needs. Heated exhaust air from the server is supplied 9018 via conduit directly to the intake side of the data center air conditioners or otherwise exhausted to a heat sink.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

INDUSTRIAL APPLICABILITY

The present invention permits the efficient cooling of computer equipment, particularly aggregated computer equipment confined to enclosed spaces. The power use of server farms, co-location facilities, and other data centers that specialize in providing computation and storage availability are using a sizeable percentage of available electricity. Much of this power use is related, not only to operating the computer equipment, but also cooling the computer equipment. The present invention represents a substantial advance in the effectiveness of cooling this equipment in way that does not require the substantial modifications to facilities, and allows a modular and upgradeable solution.

What is claimed is:

1. A server rack system comprising:
  a server rack stand, having a computer support surface, defining: (i) a cool reservoir void having a cool inlet and a cool outlet; and (ii) an exhaust reservoir void, adjacent to said cool reservoir void, having an exhaust inlet and exhaust outlet; and (iii) a demarcation wall separating said cool reservoir void from said exhaust reservoir void;
  a Peltier generator complex, supported by said demarcation wall contacting both said cool reservoir void and said exhaust reservoir void;

a rack circuit, in electrical communication with said Peltier generator complex, adapted for the transmission of current from said Peltier generator complex to a load; and a substantially sealed computer, adapted to be releasably affixed to said server rack stand, having a case defining an airflow inlet opening adapted to accept cool air from said cool outlet and an airflow outlet opening adapted to transmit exhaust air to said exhaust inlet.

2. The server rack system of claim 1 wherein said load is positioned proximate to said server rack stand.

3. The server rack system of claim 2 wherein said load includes an airflow source adapted to urge air from said cool reservoir void.

4. The server rack system of claim 2 wherein said load includes an airflow source adapted to urge air from said exhaust reservoir void.

5. The server rack system of claim 1 wherein said load includes an airflow source adapted to urge air from said cool reservoir void to said exhaust reservoir void.

6. The server rack system of claim 1 wherein said exhaust inlet is positioned distally from said exhaust outlet such that at least 50% of said Peltier generator complex is positioned between said exhaust inlet and said exhaust outlet.

7. The server rack system of claim 1 wherein said exhaust inlet is positioned distally from said exhaust outlet such that at least 80% of said Peltier generator complex is positioned between said exhaust inlet and said exhaust outlet.

8. A server facility comprising:
a building defining an enclosed building interior and having building inlet conduit for sealed movement of gas within said building and outlet conduit for exhausting gas to a heat reservoir;
a server rack stand, having a computer support surface, defining: (i) a cool reservoir void having a cool inlet and a cool outlet; and (ii) an exhaust reservoir void, adjacent to said cool reservoir void, having an exhaust inlet and exhaust outlet; and (iii) a demarcation wall separating said cool reservoir void from said exhaust reservoir void;
a substantially sealed computer, adapted to releasably affix to said server rack stand, having a case defining an airflow inlet opening adapted to accept cool air from said cool outlet and an airflow outlet opening adapted to transmit exhaust air to said exhaust inlet;
a Peltier generator complex, supported by said demarcation wall contacting both said cool reservoir void and said exhaust reservoir void;
a rack circuit, in electrical communication with said Peltier generator complex;
a server conduit forming a sealed connection between said airflow inlet opening and said cool outlet, and said airflow outlet opening and said exhaust inlet;
an airflow source for urging air from said building inlet conduit to said heat reservoir.

9. The facility of 10 further comprising a load, in electrical communication with said rack circuit, adapted to urge airflow from said building inlet conduit to said heat reservoir.

10. The facility of 11 wherein said airflow source includes ft said load proximate to said rack stand.

11. The facility of 8 wherein said rack circuit of said rack stand includes an electrical outlet adapted to transmit current from said Peltier generator complex to a load distant from said rack stand.

12. The facility of 11 wherein said rack circuit outlet is in electrical communication with a general circuit of said building.

13. A method for electrical generation within a server farm facility, said method comprising:
urging air through A building conduit into a cooler reservoir void of a server rack stand, having a computer support surface, defining: (i) said cooler reservoir void having a cool inlet and a cool outlet; and (ii) an exhaust reservoir void, adjacent to said cool reservoir void, having an exhaust inlet and an exhaust outlet; and (iii) a demarcation wall separating said cool reservoir void from said exhaust reservoir void;
conducting air into a substantially sealed computer, releasably affixed to said server rack stand, having a case defining an airflow inlet opening adapted to accept cool air from said cool outlet and an airflow outlet opening adapted to transmit exhaust air to said exhaust inlet; and
generating electricity via a Peltier generator complex, supported by said demarcation wall contacting both said cool reservoir void and said exhaust reservoir void, into a rack circuit.

14. The method of claim 13 further comprising transmitting current to a load proximate to said rack stand from rack circuit.

15. The method of claim 14 wherein said transmitting step includes transmitting current to said load including an airflow source.

16. The method of claim 15 further comprising of transmitting current to a load distant from said rack stand from said rack circuit.

17. The method of claim 16 wherein said transmitting step includes transmitting current to a general circuit within said facility.

* * * * *